United States Patent [19]
Harafuji

[11] Patent Number: 5,635,021
[45] Date of Patent: Jun. 3, 1997

[54] DRY ETCHING METHOD

[75] Inventor: Kenji Harafuji, Osaka, Japan

[73] Assignee: Matsushita Electric Industrial Co., Ltd., Osaka, Japan

[21] Appl. No.: 560,356

[22] Filed: Nov. 17, 1995

[30] Foreign Application Priority Data

Nov. 18, 1994 [JP] Japan .................................. 6-284827

[51] Int. Cl.$^6$ ............................................ H01L 21/00
[52] U.S. Cl. .............................. 438/714; 438/9; 438/695; 438/696; 216/67
[58] Field of Search .............................. 156/643.1, 657.1, 156/659.11, 662.1, 345 M, 345 C, 345 P; 252/79.1; 216/2, 67; 204/298.31, 298.34, 298.37, 298.38; 437/228, 233

[56] References Cited

U.S. PATENT DOCUMENTS 5,352,324  10/1994  Gotoh et al. .......................... 156/643.1
5,354,418  10/1994  Kumihashi et al. ................. 156/643.1

*Primary Examiner*—William Powell
*Attorney, Agent, or Firm*—McDermott, Will & Emery

[57] ABSTRACT

There is disclosed a dry etching method capable of achieving the formation of vertical line patterns and the minimization of a difference in size between an isolated line pattern and an inner line pattern. When the line width of an inner line pattern is smaller than that of an isolated line pattern and when the width of a line pattern is greater than the width of a resist pattern, at least one parameter selected from the parameter group consisting of the pressure of a raw-material gas mixture introduced into a vacuum chamber, the exhaust amount of gas discharged from the vacuum chamber, a high-frequency electric power, the frequency of the high-frequency electric power, the rate of a lateral wall protecting gas in the raw-material gas mixture and the temperature of a sample stand, is changed such that the amounts in which the line patterns are etched, are increased and that the amount in which the inner line pattern is etched, is smaller than the amount in which the isolated line pattern is etched.

23 Claims, 38 Drawing Sheets

P=0.1Pa  $L_{sh}$=1cm $P = 0.2 Pa \quad L_{sh} = 1cm$

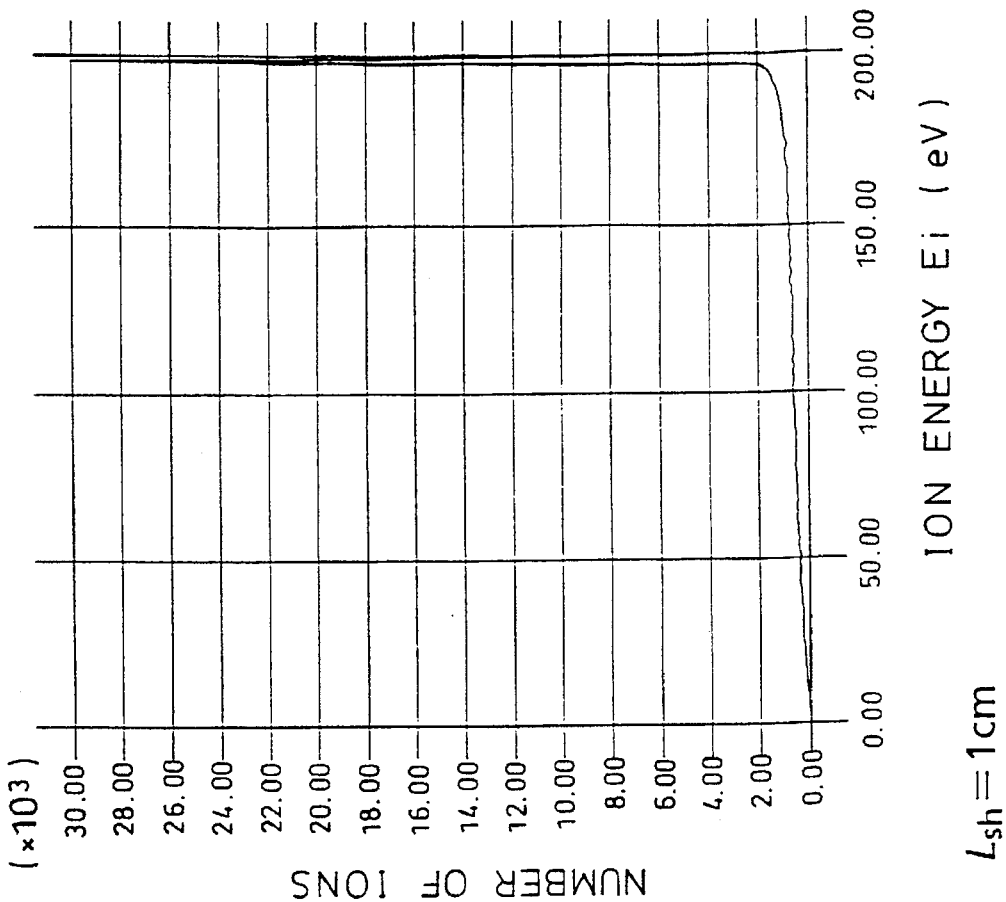
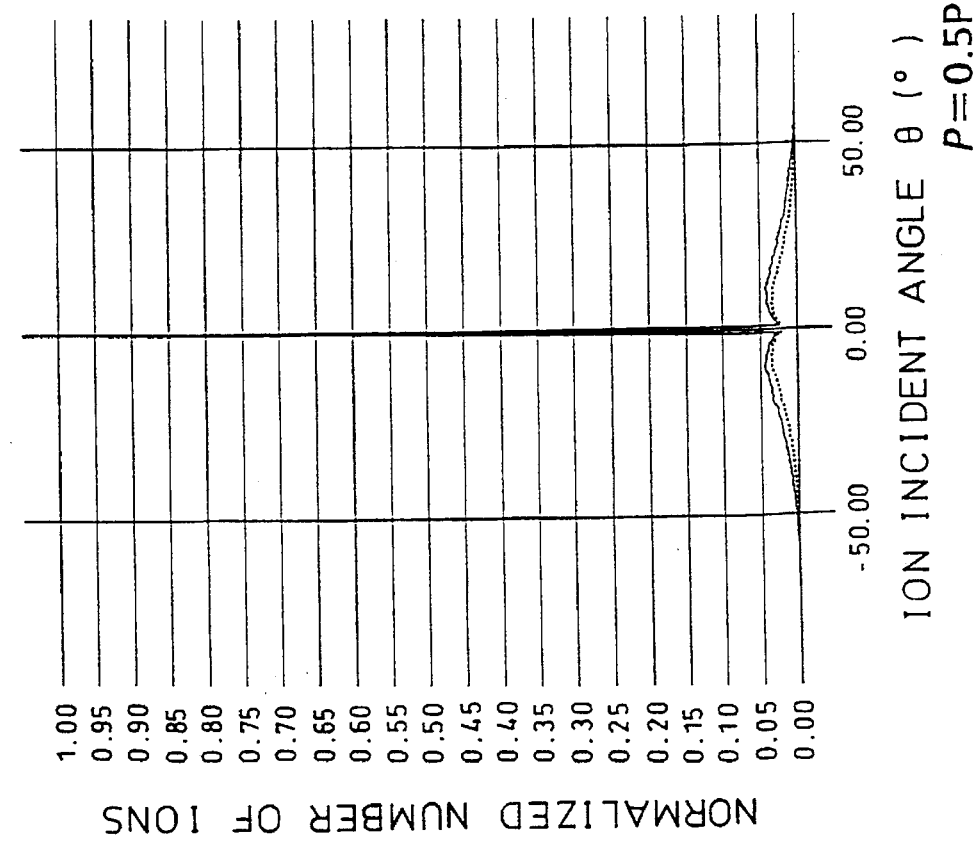
FIG.5(b)
FIG.5(a)
$P=0.5Pa$ $L_{sh}=1cm$ $P = 1.0$ Pa  $L_{sh} = 1$ cm

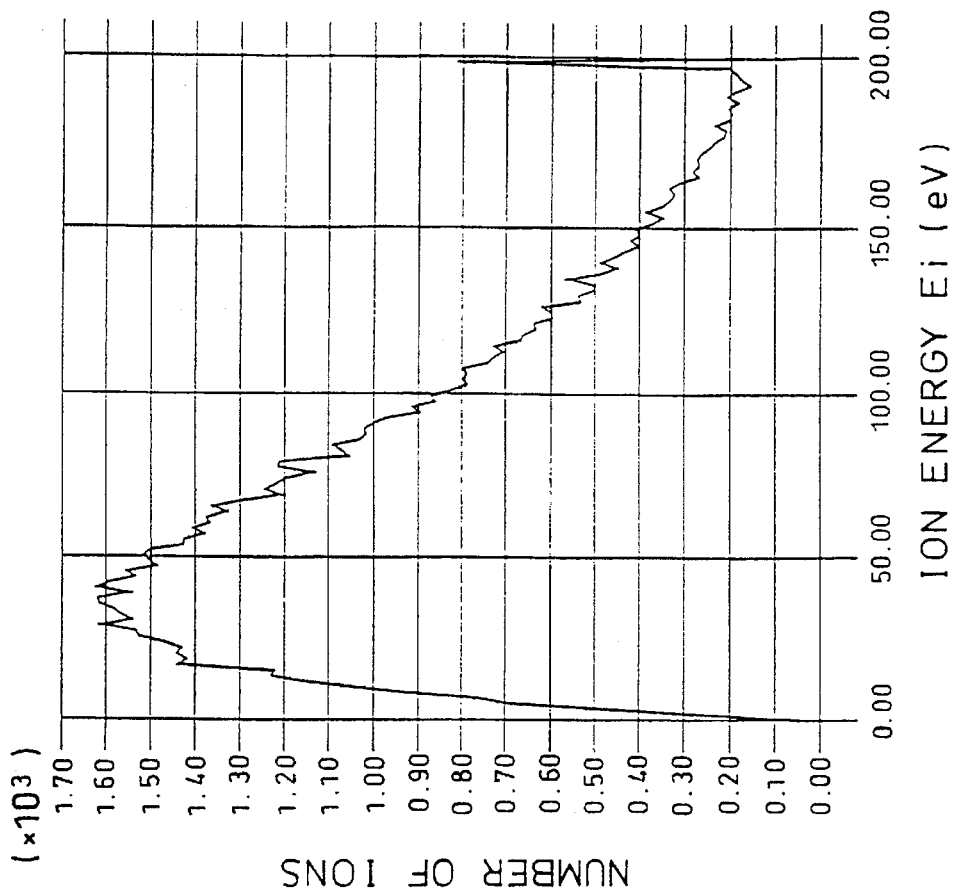
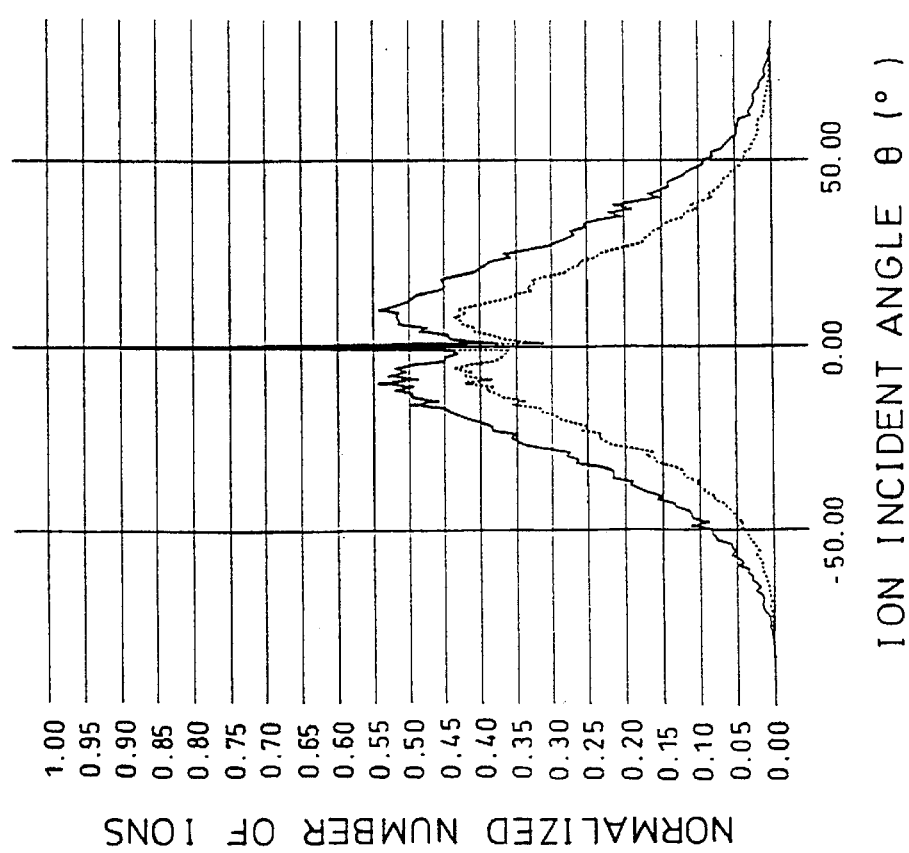
FIG.7(b)
FIG.7(a)
$P=2.0\text{Pa}$  $L_{sh}=1\text{cm}$ $P = 3.0 Pa$  $L_{sh} = 1 cm$

$P = 5.0\text{Pa}$  $L_{sh} = 1\text{cm}$

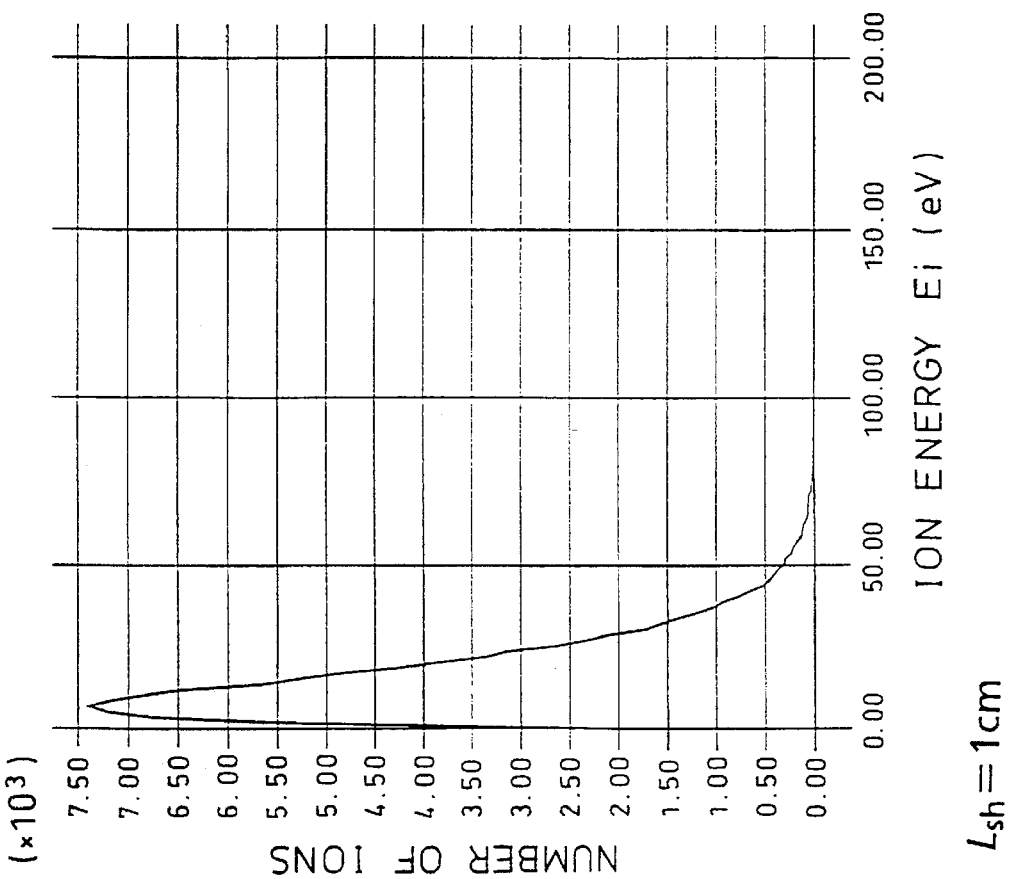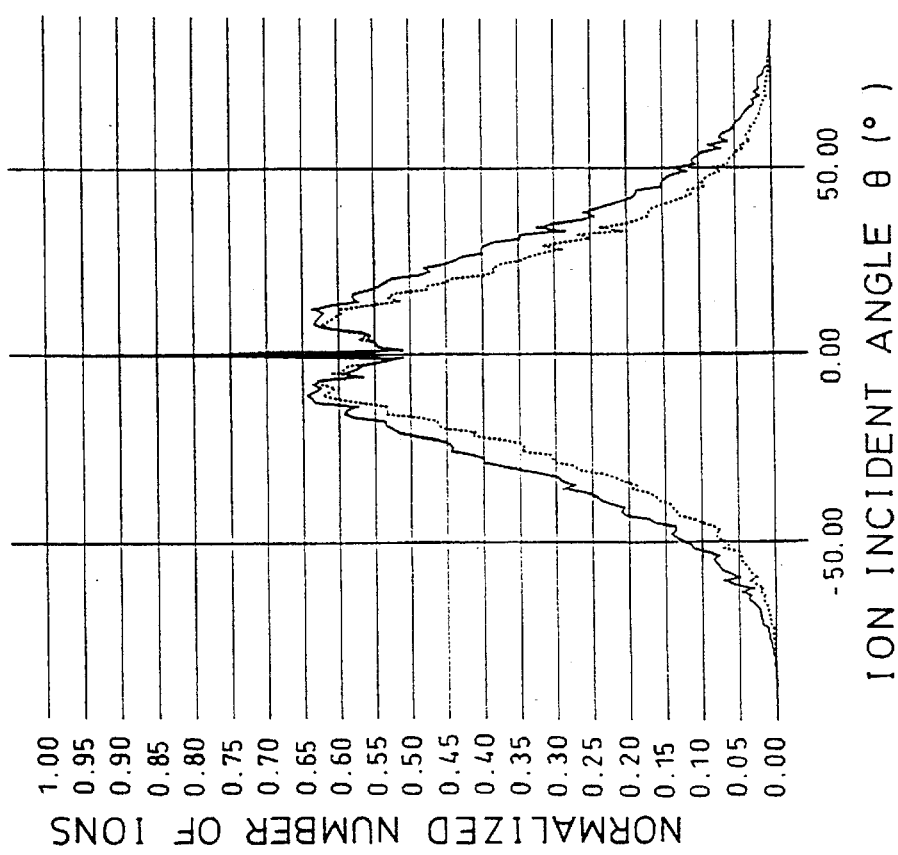

- ■ R($\Delta = 1°$) for $g^*(\theta)$
- ▲ R($\Delta = 5°$)
- ● R($\Delta = 20°$)
- □ R($\Delta = 1°$) for $g(\theta)$
- △ R($\Delta = 5°$)
- ○ R($\Delta = 20°$)

FIG. 17

IN THE CASE OF AN INTERMEDIATE GAS PRESSURE

WHEN AN ISOLATED LINE PATTERN IS GREATER IN SIZE:
THE EXHAUST AMOUNT IS INCREASED OR THE RATE OF
THE LATERAL WALL PROTECTING RADICALS IS DECREASED.
→ DECREASE IN $F_{RP}$
↑ DECREASE IN LATERAL WALL PROTECTING LAYER DEPOSIT AMOUNT
↑ EFFECT OF FINITE STANDARD DEVIATION OF ION SCATTERING ANGLES
THE AMOUNT OF REDUCTION IN SIZE IS GREATER IN AN ISOLATED
LINE PATTERN THAN IN AN INNER LINE PATTERN.

WHEN AN ISOLATED LINE PATTERN IS SMALLER IN SIZE:
THE EXHAUST AMOUNT IS DECREASED OR THE RATE OF
THE LATERAL WALL PROTECTING RADICALS IS INCREASED.
→ INCREASE IN $F_{RP}$
↑ INCREASE IN LATERAL WALL PROTECTING LAYER DEPOSIT AMOUNT
↑ THE PHENOMENON THAT AN INCREASE IN LATERAL WALL PROTECTING
LAYER DEPOSIT AMOUNT EXCEEDS AN INCREASE IN AMOUNT IN WHICH
A LATERAL WALL PROTECTING LAYER IS ETCHED BY THE EFFECT OF
FINITE STANDARD DEVIATION, IS REMARKABLE MORE IN AN ISOLATED
LINE PATTERN THAN IN AN INNER LINE PATTERN.

AN INCREASE IN AMOUNT IN WHICH A
LATERAL WALL PROTECTING LAYER IS
ETCHED BY THE EFFECT OF FINITE
STANDARD DEVIATION, IS REMARKABLE
MORE IN AN ISOLATED LINE PATTERN
THAN IN AN INNER LINE PATTERN.

→ ION COLLIMATION EFFECT

FIG. 18

IN THE CASE OF A LOW GAS PRESSURE:

THE AMOUNT OF IONS SLIGHTLY OBLIQUELY INCIDENT UPON AN ISOLATED LINE PATTERN IS SUBSTANTIALLY THE SAME AS IN AN INNER LINE PATTERN.

→ PSEUDO-PARALLEL BEAM EFFECT ←

THE LATERAL WALL PROTECTING LAYER DEPOSIT AMOUNT IS GREATER IN AN ISOLATED LINE PATTERN THAN IN AN INNER LINE PATTERN.

↓

WHEN AN ISOLATED LINE PATTERN IS GREATER IN SIZE:
THE EXHAUST AMOUNT Q IS INCREASED OR THE RATE OF THE DEPOSIT GAS IS DECREASED.
→ DECREASE IN $F_{RP}$
→ DECREASE IN LATERAL WALL PROTECTING LAYER DEPOSIT AMOUNT THE AMOUNT OF INCREASE IN SIZE IS SMALLER IN AN ISOLATED LINE PATTERN THAN IN AN INNER LINE PATTERN.

WHEN AN ISOLATED LINE PATTERN IS SMALLER IN SIZE:
THE EXHAUST AMOUNT Q IS DECREASED OR THE RATE OF THE DEPOSIT GAS IS INCREASED.
→ INCREASE IN $F_{RP}$
→ INCREASE IN LATERAL WALL PROTECTING LAYER DEPOSIT AMOUNT THE AMOUNT OF INCREASE IN SIZE IS GREATER IN AN ISOLATED LINE PATTERN THAN IN AN INNER LINE PATTERN.

FIG. 19

MEANS TO BE FIRST TAKEN

| CONDITION | MECHANISM | ISOLATED LINE PATTERN | | INNER LINE PATTERN | |
|---|---|---|---|---|---|
| | | TAPERING → VERTICAL | INVERSELY-TAPERING → VERTICAL | TAPERING → VERTICAL | INVERSELY-TAPERING → VERTICAL |
| INTERMEDIATE GAS PRESSURE | ION COLLIMATION EFFECT | (A) 1) THE EXHAUST AMOUNT IS INCREASED. → DECREASE IN $F_{RP}/F_i$ → INCREASE IN THE EFFECT OF FINITE STANDARD DEVIATION | (B) 1) THE EXHAUST AMOUNT IS DECREASED. → DECREASE IN THE EFFECT OF FINITE STANDARD DEVIATION 2) P IS LOWERED → DECREASE IN STANDARD DEVIATION | (C) 1) THE EXHAUST AMOUNT IS INCREASED. → DECREASE IN $F_{RP}/F_i$ → INCREASE IN THE EFFECT OF FINITE STANDARD DEVIATION | (D) 1) P IS LOWERED. → DECREASE IN STANDARD DEVIATION 2) THE DEPOSIT GAS IS ADDED. 3) THE EXHAUST AMOUNT IS DECREASED. |
| LOW GAS PRESSURE | PSEUDO-PARALLEL BEAM EFFECT | (E) 1) THE EXHAUST AMOUNT IS INCREASED. 2) THE RATE OF THE DEPOSIT GAS IS DECREASED. → DECREASED IN DEPOSIT RADICALS | (F) 1) THE DEPOSIT GAS IS ADDED. 2) THE EXHAUST AMOUNT IS DECREASED. 3) P IS LOWERED. → DECREASE IN STANDARD DEVIATION | (G) 1) THE EXHAUST AMOUNT IS INCREASED. 2) THE RATE OF THE DEPOSIT GAS IS DECREASED. → DECREASED IN DEPOSIT RADICALS | (H) 1) THE DEPOSIT GAS IS ADDED. 2) THE EXHAUST AMOUNT IS DECREASED. → INCREASE IN DEPOSIT RADICALS |

DRY ETCHING METHOD

BACKGROUND OF THE INVENTION

The present invention relates to a dry etching method using plasma.

There is known a dry etching machining method of dry-etching a sample having a substrate, layers formed thereon and the like, mainly or subsidiarily using the steps of installing a sample stand serving as a cathode electrode in the chamber of a plasma generating apparatus and applying a high-frequency electric power to the sample stand to form a self DC bias such that ions are accelerated and induced toward the sample stand. Such plasma generated by using high-frequency discharge is applied to a miniature dry etching machining.

Recent advances in high-density semiconductor integrated circuits are bringing about changes comparable to the Industrial Revolution. High integration has been realized by a miniaturization in size of elements, improvements in devices, an increase in size of chips and the like. Elements are miniaturized in size to the extent of light wavelength or the like, and the use of excimer laser or soft X-rays for lithography is now studied. In addition to lithography, dry etching and thin-layer forming play an important role in forming a minute pattern.

The following description will discuss dry etching applied to miniature machining. Dry etching is technique by which a sample to be etched is removed at the unnecessary portions thereof using chemical and/or physical reactions between ions or radicals generated by plasma and the solid-phase surface of the sample. According to reactive ion etching (RIE) which is most widely used as the dry etching technique, when a sample is exposed to plasma generated by high-frequency discharge of suitable gas, an etching reaction removes the sample at the unnecessary portions thereof. The sample is protected at the necessary portions thereof usually with a photoresist pattern used as a mask.

In the following description, a term of "line pattern" refers to a pattern formed in a sample to be etched, at the time when the sample is dry-etched with a resist pattern serving as a mask.

The line patterns comprise (i) a line pattern group composed of a plurality of line patterns adjacent to one another including (a) inner line patterns located inside of the line pattern group and (b) outer line patterns located at the outermost side of the line pattern group, and (ii) isolated line patterns formed as separated from the line pattern group. In the dry etching technique, it is required that, when a sample is etched, all the line patterns are formed substantially vertically in the sample strictly in conformity with a resist pattern having minute sizes, and that a difference in size between the isolated line patterns (or outer line patterns) and the inner line patterns is minimized.

To satisfy the requirements above-mentioned, there has conventionally been used a method in which the gas pressure in the chamber is lowered to increase the degree of a vacuum, thereby to minimize the scattering of ions due to their collision with neutral particles while the ions are transported toward a sample stand as accelerated in a sheath region formed in the vicinity of a sample and in which, to prevent the line pattern lateral walls from being etched by oblique incident ions which are always present in a certain rate, there is added a lateral wall protecting gas for generating radicals which play a role for protecting the lateral wall.

According to such an etching method in which the vacuum degree is lowered and a lateral wall protecting gas is added, it is difficult to provide a large amount of ions to be incident upon the sample surface substantially at right angles thereto. However, the lateral walls of line patterns are restrained, to a certain degree, from being etched by oblique incident ions. It is therefore possible that either the isolated line patterns (or outer line patterns) or the inner line patterns are individually substantially vertically formed strictly in conformity with a resist pattern. However, it is difficult that all the line patterns are simultaneously substantially vertically formed strictly in conformity with a resist pattern. Further, according to the etching method above-mentioned, it is difficult to minimize a difference in size between the isolated line patterns (or outer line patterns) and the inner line patterns.

SUMMARY OF THE INVENTION

In view of the foregoing, the present invention is proposed with the object of providing a dry etching machining method using plasma in which the combination of the gas pressure in the chamber, the gas ratio, the gas exhaust amount, the sample stand temperature and the bias power is optimized to control (i) the energy and angular distributions of ions in the vicinity of the surface of the sample stand and (ii) the rate of radicals which play a role for protecting lateral walls, such that all the line patterns of isolated line patterns, outer line patterns and inner line patterns can be substantially vertically formed strictly in conformity with a resist pattern, and that a difference in size between the isolated line patterns (or outer line patterns) and inner line patterns is minimized.

The present invention has been accomplished based on the finding that, when there is changed at least one parameter out of a parameter group comprising the pressure of raw-material gas mixture introduced into a vacuum chamber, the exhaust amount of gas discharged from the vacuum chamber, a high-frequency electric power applied for generating a self bias in the vacuum chamber, the frequency of the high-frequency electric power, the rate of a lateral wall protecting gas in the raw material gas mixture and the temperature of a sample stand, both (i) the deposit amount of lateral wall protecting radicals on a line pattern lateral wall and (ii) the amount in which a deposited lateral wall protecting layer is etched by ions, undergo a change independently in each of the isolated line patterns, the outer line patterns and the inner line patterns.

In the dry etching method, the following description will discuss:

① Relationships between (i) an external operational parameter group consisting of: gas pressure; gas ratio; gas exhaust amount; bias power; the frequency of high-frequency electric power and sample stand temperature, and (ii) a plasma internal parameter group consisting of: the ratio among the lateral wall protecting radicals deposited on the isolated line pattern lateral walls, on the inner line pattern lateral walls and on the outer line pattern lateral walls; the sticking coefficient of lateral wall protecting radicals on line pattern lateral walls; ion flux; ion angular distribution and ion energy distribution; and ② Relationships between (i) the amount of a lateral wall protecting layer deposited on each of the lateral walls of the isolated line patterns (or outer line patterns) and the inner line patterns, and (ii) the amount in which such a lateral wall protecting layer is etched.

The following description will be made on the isolated line patterns as compared with the inner line patterns, but such a description will also be applied on the outer surfaces of the outer line patterns as compared with the inner line patterns.

(A) The following description will discuss the relationships above-mentioned with attention mainly placed on the value of an external operational parameter of gas pressure.

(1) Lateral wall protecting radicals which play a role for protecting lateral walls, such as reaction products radicals present in the chamber or radicals generated by the lateral wall protecting gas, deposit on the lateral wall of each line pattern to form a lateral wall protecting layer. The amount of such a lateral wall protecting layer is greater in an isolated line pattern than in an inner line pattern, regardless of the gas pressure in the chamber. More specifically, the estimated solid angle of a flux of lateral wall protecting radicals incident upon a sample substantially isotropically from above, is about $\pi/2$ for an isolated line pattern lateral wall and is smaller than $\pi/2$ for an inner line pattern lateral wall. In particular, when the pattern aspect ratio (value obtained by dividing the line height of a line-and-space-pattern by the space width) is great, such estimated solid angle for an inner line pattern lateral wall is considerably smaller than $\pi/2$.

When the rate of the lateral wall protecting radicals is reduced, the amount of the lateral wall protecting layer deposited on an isolated line pattern lateral wall and the amount of the lateral wall protecting layer deposited on an inner line pattern lateral wall are reduced with a predetermined ratio maintained. However, the amount of reduction in lateral wall protecting layer with respect to the amount of reduction in the rate of the lateral wall protecting radicals, is greater in an isolated line pattern lateral wall than in an inner line pattern lateral wall. That is, the amount of change in the thickness of the lateral wall protecting layer on an isolated line pattern lateral wall is greater than the amount of change in the thickness of the lateral wall protecting layer on an inner line pattern lateral wall.

(2) The following description will discuss the behavior of incident ions.

Ions are incident upon the surface of a sample while being accelerated, in the sheath region, substantially at right angles to the surface of the sample stand by an electric field at a right angle thereto. However, because of the collision with neutral particles in the sheath region, ions are incident upon the sample surface with certain scattering angles.

Ions obliquely incident upon the surface of the sample scrape (or sputter out) the lateral wall protecting layers on line pattern lateral walls which stand at right angles to the sample surface. Accordingly, such oblique incident ions may change a pattern profile obtained after etching, from a tapering form to a vertical form or from a vertical form to an inversely tapering form. As the ion incident angle becomes more vertical with respect to a line pattern lateral wall or as the ion scattering angle is greater, the ability of etching a lateral wall protecting layer becomes greater. On the contrary, when ions are incident substantially vertically upon the sample surface, the incident angles of such ions are substantially parallel to the line pattern lateral walls such that the etching ability is small.

The foregoing phenomenon is remarkable particularly in an isolated line pattern lateral wall in which the estimated solid angles of oblique incident ions are great to cause the incident ions to come in direct collision with the lateral wall. On the other hand, in an inner line pattern lateral wall, the estimated solid angles of oblique incident ions are small and considerably small particularly when the line pattern aspect ratio is great. Accordingly, an incident ion having a scattering angle greater than a certain value, does not enter space portions of the line-and-space pattern, but is reflected. In other words, an incident ion component having a great scattering angle cannot come directly to a lower portion of an inner line pattern lateral wall, but only an incident ion component having a relatively small scattering angle can selectively come thereto. More specifically, out of an ion flux of which ion angular distribution is wide, only an ion component of which scattering angle is not greater than a certain value, is collimated to allow such an ion component to come to a lower portion of an inner line pattern lateral wall. Hereinafter, such an effect is called "ion collimation effect".

An ion having a great scattering angle which has somewhat been incident upon an inner line pattern lateral wall in the vicinity of an upper portion thereof, cannot enter a lower portion of the inner line pattern lateral wall unless such an ion is reflected several times between the inner line pattern lateral wall and a line pattern lateral wall opposite thereto. Meanwhile, the incident ion is reduced in energy to lower the ability of etching a lateral wall protecting layer. Further, the incident ion flux is also smaller in an inner line pattern lateral wall than in an isolated line pattern lateral wall.

(3) The foregoing phenomena will be summarized as follows:

① The amount of change in lateral wall protecting layer deposit amount with respect to a change in the rate of the lateral wall protecting radicals in the chamber, is greater in an isolated line pattern lateral wall than in an inner line pattern lateral wall;

② By the ion collimation effect, the ability of scraping (or sputtering out) a lateral wall protecting layer by oblique incident ions, is greater in an isolated line pattern lateral wall than in an inner line pattern lateral wall; and ③ In an isolated line pattern lateral wall, a change in ion incident angle appears in terms of a great change in amount in which a lateral wall protecting layer is etched.

As thus discussed, an isolated line pattern lateral wall is relatively sensitive to a change in the rate of lateral wall protecting radicals and to a change in ion incident angle, while an inner line pattern lateral wall is relatively insensitive thereto.

(4) As discussed earlier, because of the collision with neutral particles in the sheath region, ions are incident upon the sample surface with certain scattering angles. However, in a low gas pressure in which the gas pressure is sufficiently low, the collision of ions with neutral particles in the sheath region is reduced, and the rate of an ion component relatively vertically incident upon the sample surface is increased. Further, the ions are generally incident upon the sample surface with relatively small scattering angles. More specifically, in a low gas pressure, the rate of an ion component incident substantially along line pattern lateral walls is increased. This effect is here called a pseudo-parallel beam effect.

In such an incident ion angular distribution, the ions of a flux incident upon isolated line pattern lateral walls are larger in number than the ions of a flux incident upon inner line pattern lateral walls. However, the difference in number between these ions is not so great as in the case of an intermediate gas pressure. That is, a difference between the ability of etching the protecting layer deposited on an isolated line pattern lateral wall and the ability of etching the protecting layer deposited on an inner line pattern lateral wall, is not so great as in an intermediate gas pressure. Further, the ion incident angles with respect to lateral walls are relatively small, and the rate of ions incident upon line pattern lateral walls at great angles, is small. Accordingly, the ability of etching a lateral wall protecting layer is smaller than in an intermediate gas pressure, and particularly small for an isolated line pattern lateral wall.

(5) The foregoing has discussed the relationships between a lateral wall protecting layer deposit amount and the amount in which a lateral wall protecting layer is etched by oblique incident ions. However, when a lateral wall protecting layer deposit amount is small and the amount in which a lateral wall protecting layer is etched by oblique incident ions, is greater than the lateral wall protecting layer deposit amount, the profile of a line pattern formed in the sample is inversely tapered such that the line pattern is smaller in size than the resist pattern. In such a case, when the gas pressure is lowered to lower the rate of the oblique incident ions, the line pattern profile is changed from an inversely tapering form to a vertical form and a reduction in width of the line pattern is also relaxed.

(B) The following description will discuss the relationships mentioned earlier with attention mainly placed on the combination of two external operational parameters of gas pressure P and exhaust amount Q.

An increase in gas pressure P causes the following changes in plasma internal parameters. As mentioned earlier, the standard deviation σ of ion scattering angles representing the spread of incident ion angular distribution, is increased and the ion energy $E_i$ of the ions incident upon the sample surface is reduced. The increase in gas pressure P means an increase in raw-material gas mixture. Accordingly, as far as the input power has the ability of sufficiently ionizing and exciting the raw-material gas mixture, the increase in gas pressure P results in an increase in reactive radical flux $F_R$ and ion flux $F_i$. This increases the rate of the lateral wall protecting radicals such as reaction products, sputtered resists and the like in the chamber, thereby to increase the number of radicals of a lateral wall protecting radical flux $F_{RP}$.

The ion energy $E_i$ and the standard deviation σ of ion scattering angles in the normal distribution are internal parameters relating to the ability of etching lateral wall protecting layers. A reduction in ion energy $E_i$ causes the etching ability to be lowered. An increase in standard deviation σ of ion scattering angles improves the etching ability. Accordingly, it cannot simply be judged whether an increase in gas pressure P improves or lowers the etching ability. On the other hand, an increase in lateral wall protecting radical flux $F_{RP}$ apparently increases a lateral wall protecting layer deposit amount. Accordingly, it cannot also be simply judged whether an increases in gas pressure P increases or decreases the lateral wall protecting layer deposit amount.

However, when provision is made such that the exhaust amount is increased and the rate of the lateral wall protecting radicals in the chamber is reduced with the gas pressure P maintained constant, the amount in which a lateral wall protecting layer is etched, exceeds a layer deposit amount. More specifically, the thickness of a lateral wall protecting layer can be controlled by controlling the exhaust amount.

(C) The following description will discuss the relationships mentioned earlier with attention mainly placed on the combination of two external operational parameters of bias power $W_B$ and exhaust amount Q.

It is considered that an increase in bias power $W_B$ brings the following changes in plasma internal parameters. First, the energy $E_i$ of ions incident upon the sample surface is increased and the standard deviation σ of ion scattering angles is lowered. Further, an increase in bias power $W_B$ means an increase in ionization and excitation of the raw-material gas mixture in the vicinity of the sample surface. Accordingly, the ion flux $F_i$ and the reactive radical flux $F_R$ are increased. As a result, the rate of the lateral wall protecting radicals such as reaction products, sputtered resists and the like in the chamber are increased to increase the lateral wall protecting radical flux $F_{RP}$.

The ion energy $E_i$, ion flux $F_i$ and standard deviation σ of ion scattering angles are internal parameters relating to the ability of etching a lateral wall protecting layer. An increases in ion energy $E_i$ and ion flux $F_i$ improves the etching ability. On the other hand, each of a reduction in standard deviation σ of ion scattering angles and an increase in lateral wall protecting radical flux $F_{RP}$, increases a lateral wall protecting layer deposit amount. Accordingly, it cannot simply be judged whether an increase in bias power $W_B$ increases or decreases a lateral wall protecting layer deposit amount.

However, when provision is made such that, with the bias power $W_B$ maintained constant, the exhaust amount is increased to reduce the rate of the lateral wall protecting radicals, the amount in which a lateral wall protecting layer is etched, exceeds the lateral wall protecting layer deposit amount. More specifically, the thickness of a lateral wall protecting layer can be controlled by controlling the exhaust amount.

(D) The following description will discuss the relationships mentioned earlier with attention mainly placed on the combination of two external operational parameters of frequency f of high-frequency electric power and gas pressure P.

The sheath width d at the side of a cathode formed in the vicinity of the sample stand, is expressed according to the following equation:

$$d=K_1/(P^m \cdot f^n) \tag{1}$$

wherein P is the gas pressure, f is the frequency, m is a positive real number which is greater than about ⅓ and smaller than about ½, and n is a positive real number which is greater than about ½ and smaller than about 1. This has been discussed by K. Harafuji, A. Yamano and M. Kubota: Jpn. J. Appl. Phys. vol. 33 (1994) p2212 and by N. Mutsukura, K. Kobayashi and Y. Machi: J. Appl. Phys. vol. 68 (1990) p. 2657.

Further, an ion mean free path λ mainly determined by the elastic collision scattering and charge exchange scattering of ions with respect to neutral particles, is inversely proportional to the gas pressure P and can be expressed according to the following equation:

$$\lambda = K_2/P \tag{2}$$

Further, there is expressed, according to the following equation, an amount η proportional to probability at which an ion starting from the boundary between a bulk plasma region and the sheath region, is scattered due to collision with neutral particles in the sheath region while the ion is being transported toward the cathode at the sample stand:

$$\eta = d/\lambda \tag{3}$$

When the equations (1) and (2) are substituted into the equation (3), the following equations are established:

$$\begin{aligned}\eta &= d/\lambda = (K_1/(P^m \cdot f^n)) \times (P/K_2) \\ &= (K_1/K_2) \times (P^{1-m}/f^n) \\ &\sim (K_1/K_2) \times (P/f)^{1/2}\end{aligned}$$

wherein each of $K_1$, $K_2$ is a constant and ~ means that both sides are substantially equal to each other.

An increase in gas pressure P and frequency f shortens the sheath width d, i.e., a distance by which an ion starting from the boundary of the bulk plasma region and the sheath region, travels to the sample stand. From this viewpoint, there is reduced the probability at which an ion scatters due to collision with neutral particles.

An increase in gas pressure P shortens the ion mean free path λ. Thus, there is increased the probability at which an ion scatters due to collision with neutral particles.

When the gas pressure P is lowered and the frequency f is increased to lower the ratio of P/f, it is possible, according to the equation (3), to lower the probability at which an ion scatters due to collision with neutral particles. Accordingly, when the gas pressure P is lowered and the frequency f is increased, this restrains the ion energy from being damped such that the directional properties of ions are arranged. This enables the ions to be substantially vertically incident upon the sample. It is also possible to restrain the density of the ion flux reaching the sample from being damped, thus achieving both improvements in etching throughput and sufficiently anisotropic etching.

When the gas pressure P and the frequency f are lowered, the sheath width d is lengthened according to the equation (1). From this point of view, there is increased the probability at which an ion scatters due to collision with neutral particles.

When the gas pressure P is lowered, the ion mean free path λ is lengthened according to the equation (2). From this point of view, there is reduced the probability at which an ion scatters due to collision with neutral particles.

When the gas pressure P is increased and the frequency f is lowered to increase the ratio P/f, there can be increased, according to the equation (3), the probability at which an ion scatters due to collision with neutral particles. Accordingly, when the gas pressure P is increased and the frequency f is lowered, this damps the ion energy and causes ions to be incident upon the sample with the ion directional property disturbed to some extent. Further, the density of the ion flux reaching the sample is damped, thus enabling the etching ability to be relaxed.

(E) The following description will discuss the relationships mentioned earlier with attention mainly placed on an external operational parameter of sample stand temperature.

The sticking coefficient, by a line pattern lateral wall, of reaction product radicals present in the chamber and lateral wall protecting radicals generated by a lateral wall protecting gas, is generally smaller with a rise in temperature of the line pattern lateral wall (i.e., sample temperature).

In an isolated line pattern lateral wall, the estimated solid angle of a lateral wall protecting radical flux substantially isotropically incident upon the sample from above, is as large as about π/2. Accordingly, the lateral wall protecting radicals sufficiently reach an isolated line pattern lateral wall at its lower portion.

However, in an inner line pattern lateral wall, the estimated solid angle is small. Particularly, when the pattern aspect ratio is great, the estimated solid angle is considerably small. Accordingly, in order that lateral wall protecting radicals reach an inner line pattern lateral wall at its lower portion, adsorption and re-emission of lateral wall protecting radicals by and from the inner line pattern lateral wall must be repeated several times. In this case, when the temperature of the line pattern lateral wall (i.e., sample temperature) is low, the sticking coefficient becomes great. Accordingly, a major portion of the lateral wall protecting radicals sticks to a lateral wall of the resist pattern above the inner line pattern and does not sufficiently reach an inner line pattern lateral wall at its lower portion. On the other hand, when the temperature of the line pattern lateral wall is high, the sticking coefficient becomes low. This enables lateral wall protecting radicals to reach sufficiently to an inner line pattern lateral wall at its lower portion.

The external control parameters above-mentioned can be optimized using signals supplied from a detector for evaluating the rate of the lateral wall protecting radicals in the plasma, from a detector for evaluating the flux and energy distribution of ions which play a role for etching deposited lateral wall protecting layers, from a sheath width detector for evaluating the ion angular distribution, and the like.

Further, it is programmed to automatically execute a two-stage etching such that, using a signal from an etching end detector installed in the plasma generating chamber, the completion of the main etching is judged, and that etching is executed under the main etching conditions until the main etching is complete, and etching is thereafter executed under overetching conditions.

The following description will discuss the problem solving means specifically taken in the present invention.

A first dry etching method according to the present invention relates to a dry etching method including the steps of: introducing, into a vacuum chamber provided at a lower portion thereof with a sample stand, a raw-material gas mixture containing (i) an etching gas for etching a sample to be etched which is placed on the sample stand and in the surface of which a resist pattern is formed, and (ii) a lateral wall protecting gas for generating lateral wall protecting radicals for protecting the lateral walls of line patterns formed when the sample is etched, whereby ions composed of the gas mixture are generated; and applying a high-frequency electric power to the sample stand to form a self DC bias, thereby to induce the ions to the sample stand, whereby the sample is etched; and this dry etching method comprises a parameter control step arranged such that, when the line width of a first line pattern, which is one of line patterns located at the inner side of a line pattern group comprising a plurality of line patterns adjacent to one another formed in a sample, is smaller than the line width of a second line pattern, which is one of outer line patterns located at the outermost side of the line pattern group or one of line patterns located as isolated from the line pattern group, and when the line width of each of the first and second line patterns is greater than the line width of the resist pattern, at least one parameter selected from the parameter group consisting of the pressure of the raw-material gas mixture introduced into the vacuum chamber, the exhaust amount of gas discharged from the vacuum chamber, the high-frequency electric power applied for generating a self bias, the frequency of the high-frequency electric power, the rate of the lateral wall protecting gas in the raw-material gas mixture and the temperature of the sample stand, is changed such that the amounts in which the lateral walls of the first and second line patterns are etched, are increased and that the amount in which the lateral walls of the first line patterns are etched, is smaller than the amount in which the lateral walls of the second line patterns are etched.

According to the first dry etching method, the parameter control step is arranged such that the amounts in which the first and second line patterns are etched, are increased and that the amount in which the first line patterns are etched, is smaller than the amount in which the second line patterns are etched. Accordingly, the line width of each first line pattern approaches the line width of each second line pattern, and the line width of each of the first and second line patterns approaches the line width of the resist pattern. Thus, the line width of each of the first and second line patterns is optimized.

In the first dry etching method, the parameter control step preferably includes the step of increasing the exhaust amount of gas discharged from the vacuum chamber.

According to the arrangement above-mentioned, the rate of the lateral wall protecting radicals in the vacuum chamber is reduced to reduce the amount of the lateral wall protecting layer deposited on the lateral wall of each line pattern. This increases the amount of reduction in size of each of the first and second line patterns and also relatively increases the effect of etching, by oblique incident ions, the lateral wall protecting layer of each second line pattern. Thus, the amount of reduction in size of each second line pattern becomes greater than the amount of reduction in size of each first line pattern.

In the first dry etching method, the parameter control step preferably includes the step of reducing the rate of the lateral wall protecting gas in the raw-material gas mixture.

According to the arrangement above-mentioned, the rate of the lateral wall protecting radicals in the vacuum chamber is reduced to reduce the amount of the lateral wall protecting layer deposited on the lateral wall of each line pattern. This increases the amount of reduction in size of each of the first and second line patterns and also relatively increases the effect of etching, by oblique incident ions, the lateral wall protecting layer of each second line pattern. Thus, the amount of reduction in size of each second line pattern becomes greater than the amount of reduction in size of each first line pattern.

In the first dry etching method, the parameter control step preferably includes the step of increasing the pressure of the raw-material gas mixture introduced into the vacuum chamber and the step of increasing the high-frequency electric power.

According to the arrangement above-mentioned, a reduction in ion energy with an increase in gas pressure is compensated by an increase in high-frequency electric power, thereby to increase the effect of etching each lateral wall protecting layer by oblique incident ions. Thus, the amount of reduction in size of each of the first and second line patterns is increased and the spread of the incident ion angular distribution becomes great. Accordingly, the effect of etching the lateral wall protecting layer of each first line pattern becomes smaller than the effect of etching the lateral wall protecting layer of each second line pattern. Thus, the amount of reduction in size of each first line pattern becomes smaller than the amount of reduction in size of each second line pattern.

In the first dry etching method, the parameter control step preferably includes the step of increasing the pressure of the raw-material gas mixture introduced into the vacuum chamber and the step of increasing the exhaust amount of gas discharged from the vacuum chamber.

According to the arrangement above-mentioned, the rate of the lateral wall protecting radicals in the vacuum chamber is reduced to reduce the amount of the lateral wall protecting layer deposited on the lateral wall of each line pattern. This increases the amount of reduction in size of each of the first and second line patterns. This also increases the spread of the incident ion angular distribution such that the effect of etching the lateral wall protecting layer of each first line pattern, becomes smaller than the effect of etching the lateral wall protecting layer of each second line pattern. Thus, the amount of reduction in size of each first line pattern becomes smaller than the amount of reduction in size of each second line pattern.

In the first dry etching method, the parameter control step preferably includes the step of raising the temperature of said sample stand.

According to the arrangement above-mentioned, there is reduced the amount of the lateral wall protecting radicals deposited on the lateral wall of each line pattern. This increases the amount of reduction in size of each of the first and second line patterns and also increases, particularly in each second line pattern, the effect of etching the lateral wall protecting layer by oblique incident ions. Thus, the amount of reduction in size of each second line pattern becomes greater than the amount of reduction in size of each first line pattern.

A second dry etching method according to the present invention relates to a dry etching method similar to the first dry etching method, and comprises a parameter control step arranged such that, when the line width of a first line pattern, which is one of line patterns located at the inner side of a line pattern group comprising a plurality of line patterns adjacent to one another formed in a sample, is smaller than the line width of a second line pattern, which is one of outer line patterns located at the outermost side of the line pattern group or one of line patterns located as isolated from the line pattern group, and when the line width of each of the first and second line patterns is smaller than the line width of the resist pattern, at least one parameter selected from the parameter group consisting of the pressure of the raw-material gas mixture introduced into the vacuum chamber, the exhaust amount of gas discharged from the vacuum chamber, the high-frequency electric power applied for generating a self bias, the frequency of the high-frequency electric power, the rate of the lateral wall protecting gas in the raw-material gas mixture and the temperature of the sample stand, is changed such that the amounts in which the lateral walls of the first and second line patterns are etched, are decreased and that the amount in which the lateral walls of the first line patterns are etched, becomes smaller than the amount in which the lateral walls of the second line patterns are etched.

In the second dry etching method, the parameter control step is arranged such that the amounts in which the first and second line patterns are etched, are decreased and that the amount in which the first line patterns are etched, becomes smaller than the amount in which the second line patterns are etched. Accordingly, the line width of each first line pattern approaches the line width of each second line pattern, and the line width of each of the first and second line patterns approaches the line width of the resist pattern. Thus, the line width of each of the first and second line patterns is optimized.

In the second dry etching method, the parameter control step preferably includes the step of reducing the pressure of the raw-material gas mixture introduced into the vacuum chamber.

According to the arrangement above-mentioned, the rate of the oblique incident ions is reduced to lower the effect of etching lateral wall protecting layers by the oblique incident ions. Thus, the amount of reduction in size of each of the first and second line pattern is reduced.

In the second dry etching method, the parameter control step preferably includes the step of reducing the exhaust amount of gas discharged from the vacuum chamber.

According to the arrangement above-mentioned, the rate of the lateral wall protecting radicals in the vacuum chamber is increased to increase the amount of the lateral wall protecting layer deposited on the lateral wall of each line pattern. This decreases the amount of reduction in size of each of the first and second line patterns. Further, a reduction in the effect of etching lateral wall protecting layers by oblique incident ions, appears remarkably particularly in the second line patterns. Thus, the amount of reduction in size of each second line pattern is smaller than the amount of reduction in size of each first line pattern.

In the second dry etching method, the parameter control step preferably includes the step of raising the temperature of the sample stand.

According to the arrangement above-mentioned, there is reduced the rate of the lateral wall protecting radicals deposited on the lateral wall of each line pattern. This increases the amount of reduction in size of each of the first and second line patterns and also increases the effect of etching the lateral wall protecting layers by oblique incident ions. Thus, the amount of reduction in size of each second line pattern becomes greater than the amount of reduction in size of each first line pattern.

A third dry etching method according to the present invention relates to a dry etching method similar to the first dry etching method, and comprises a parameter control step arranged such that, when the line width of a first line pattern, which is one of line patterns located at the inner side of a line pattern group comprising a plurality of line patterns adjacent to one another formed in a sample, is greater than the line width of a second line pattern, which is one of outer line patterns located at the outermost side of the line pattern group or one of line patterns located as isolated from the line pattern group, and when the line width of each of the first and second line patterns is greater than the line width of the resist pattern, at least one parameter selected from the parameter group consisting of the pressure of the raw-material gas mixture introduced into the vacuum chamber, the exhaust amount of gas discharged from the vacuum chamber, the high-frequency electric power applied for generating a self bias, the frequency of the high-frequency electric power, the rate of the lateral wall protecting gas in the raw-material gas mixture and the temperature of the sample stand, is changed such that the amounts in which the lateral walls of the first and second line patterns are etched, are increased and that the amount in which the lateral walls of the first line patterns are etched, becomes greater than the amount in which the lateral walls of the second line patterns are etched.

In the third dry etching method, the parameter control step is arranged such that the amounts in which the first and second line patterns are etched, are increased and that the amount in which the first line patterns are etched, becomes greater than the amount in which the second line patterns are etched. Accordingly, the line width of each first line pattern approaches the line width of each second line pattern, and the line width of each of the first and second line patterns approaches the line width of the resist pattern. Thus, the line width of each of the first and second line patterns is optimized.

In the third dry etching method, the parameter control step preferably includes the step of increasing the high-frequency electric power applied for generating a self bias and the step of increasing the exhaust amount of gas discharged from the vacuum chamber.

According to the arrangement above-mentioned, the rate of the lateral wall protecting radicals in the vacuum chamber is decreased to decrease the amount of the lateral wall protecting layer deposited on the lateral wall of each line pattern. This increases the amount of reduction in size of each of the first and second line patterns. Further, the spread of the incident ion angular distribution is reduced such that the effect of etching the lateral wall protecting layer of each first line pattern is relatively increased. Thus, the amount of reduction in size of each first line pattern becomes greater than the amount of reduction in size of each second line pattern.

In the third dry etching method, the parameter control step preferably includes the step of reducing the pressure of the raw-material gas mixture introduced into the vacuum chamber.

According to the arrangement above-mentioned, the rate of the oblique incident ions is reduced and a reduction in the effect of etching lateral wall protecting layers by the oblique incident ions, appears remarkably particularly in the second line patterns. Thus, the amount of reduction in size of each second line pattern is relatively decreased.

In the third dry etching method, the parameter control step preferably includes the step of increasing the exhaust amount of gas discharged from the vacuum chamber.

When the pressure of the raw-material gas mixture introduced in the vacuum chamber is lowered and the exhaust amount of gas discharged from the vacuum chamber is increased, the rate of the lateral wall protecting radicals in the vacuum chamber is decreased to decrease the amount of the lateral wall protecting layer deposited on the lateral wall of each line pattern. This increases the amount of reduction in size of each of the first and second line patterns. Further, the spread of the incident ion angular distribution is reduced such that the effect of etching the lateral wall protecting layer of each first line pattern is relatively increased. Thus, the amount of reduction in size of each first line pattern becomes greater than the amount of reduction in size of each second line pattern.

In the third dry etching method, the parameter control step preferably includes the step of increasing the frequency of the high-frequency electric power.

According to the arrangement above-mentioned, the sheath width is reduced to reduce the rate of oblique incident ions. Thus, a reduction in the effect of etching lateral wall protecting layers by the oblique incident ions, remarkably appears particularly in the second line patterns. Thus, the amount of reduction in size of each second line pattern is relatively decreased.

In the third dry etching method, the parameter control step preferably includes the step of raising the temperature of the sample stand.

According to the arrangement above-mentioned, there is reduced the rate of the lateral wall protecting radicals deposited on the lateral wall of each line pattern. This increases the amount of reduction in size of each of the first and second line patterns and increases, particularly in each second line pattern, the effect of etching the lateral wall protecting layer by oblique incident ions. Thus, the amount of reduction in size of each second line pattern becomes greater than the amount of reduction in size of each first line pattern.

A fourth dry etching method according to the present invention relates to a dry etching method similar to the first dry etching method, and comprises a parameter control step arranged such that, when the line width of a first line pattern, which is one of line patterns located at the inner side of a line pattern group comprising a plurality of line patterns adjacent to one another formed in a sample, is greater than the line width of a second line pattern, which is one of outer line patterns located at the outermost side of the line pattern group or one of line patterns located as isolated from the line pattern group, and when the line width of each of the first and second line patterns is smaller than the line width of the resist pattern, at least one parameter selected from the parameter group consisting of the pressure of the raw-material gas mixture introduced into the vacuum chamber, the exhaust amount of gas discharged from the vacuum chamber, the high-frequency electric power applied for generating a self bias, the frequency of the high-frequency electric power, the rate of the lateral wall protecting gas in the raw-material gas mixture and the temperature of the sample stand, is changed such that the amounts in which the lateral walls of the first and second line patterns are etched, are decreased and that the amount in which the lateral walls of the first line patterns are etched, becomes greater than the amount in which the lateral walls of the second line patterns are etched.

In the fourth dry etching method, the parameter control step is arranged such that the amounts in which the first and second line patterns are etched, are decreased and that the amount in which the first line patterns are etched, becomes greater than the amount in which the second line patterns are etched. Accordingly, the line width of each first line pattern approaches the line width of each second line pattern, and the line width of each of the first and second line patterns approaches the line width of the resist pattern. Thus, the line width of each of the first and second line patterns is optimized.

In the fourth dry etching method, the parameter control step preferably includes the step of decreasing the exhaust amount of gas discharged from said vacuum chamber.

According to the arrangement above-mentioned, the rate of the lateral wall protecting radicals in the vacuum chamber is increased to increase the amount of the lateral wall protecting layer deposited on the lateral wall of each line pattern. This decreases the amount of reduction in size of each of the first and second line patterns. Further, a reduction in the effect of etching lateral wall protecting layers by the oblique incident ions, remarkably appears particularly in the second line patterns. Thus, the amount of reduction in size of each second line pattern becomes smaller than the amount of reduction in size of each first line pattern.

In the fourth dry etching method, the parameter control step preferably includes the step of increasing the rate of the lateral wall protecting gas in the raw-material gas mixture.

According to the arrangement above-mentioned, the amount of reduction in size of each of the first and second line patterns is decreased, and a reduction in the effect of etching lateral wall protecting layers by oblique incident ions, appears remarkably in the second line patterns. Thus, the amount of reduction in size of each second line pattern becomes smaller than the amount of reduction in size of each first line pattern.

In the fourth dry etching method, the parameter control step preferably includes the step of increasing the frequency of the high-frequency electric power.

According to the arrangement above-mentioned, the sheath width is reduced to reduce the rate of oblique incident ions. Thus, a reduction in the effect of etching lateral wall protecting layers by the oblique incident ions, remarkably appears particularly in the second line patterns. Thus, the amount of reduction in size of each second line pattern is relatively decreased.

In the fourth dry etching method, the parameter control step preferably includes the step of reducing the pressure of the raw-material gas mixture introduced into the vacuum chamber.

When the frequency of the high-frequency electric power is increased and the pressure of the raw-material gas mixture introduced in the vacuum chamber is lowered, the rate of the oblique incident ions is considerably reduced to lower the effect of etching lateral wall protecting layers by the oblique incident ions. This decreases the amount of reduction in size of each of the first and second line patterns. Further, a reduction in the effect of etching lateral wall protecting layers by the oblique incident ions, remarkably appears particularly in the second line patterns. Thus, the amount of reduction in size of each second line pattern becomes smaller than the amount of reduction in size of each first line pattern.

In the fourth dry etching method, the parameter control step preferably includes the step of lowering the temperature of the sample stand.

According to the arrangement above-mentioned, there is increased the amount of the lateral wall protecting layer deposited on each line pattern lateral wall. This decreases the amount of reduction in size of each of the first and second line patterns, and also decreases the effect of etching lateral wall protecting layers by the oblique incident ions. Thus, the amount of reduction in size of each second line pattern becomes smaller than the amount of reduction in size of each first line pattern.

In the fourth dry etching method, the parameter control step preferably includes the step of reducing the pressure of the raw-material gas mixture introduced into the vacuum chamber.

According to the arrangement above-mentioned, the rate of the oblique incident ions is reduced to lower the effect of etching lateral wall protecting layers by the oblique incident ions. This decreases the amount of reduction in size of each of the first and second line patterns. Further, a reduction in the effect of etching lateral wall protecting layers by the oblique incident ions, remarkably appears particularly in the second line patterns. Thus, the amount of reduction in size of each second line pattern becomes smaller than the amount of reduction in size of each first line pattern.

BRIEF DESCRIPTION OF THE DRAWINGS

FIGS. 5 (a) and (b) illustrate the characteristics of incident distributions of ions starting from the boundary between the bulk plasma region and the sheath region at the time when the gas pressure is 0.5 Pa, in which FIG. 5 (a) shows an ion annular distribution and FIG. 5 (b) shows an ion energy distribution;

FIGS. 7 (a) and (b) illustrate the characteristics of incident distributions of ions starting from the boundary between the bulk plasma region and the sheath region at the time when the gas pressure is 2.0 Pa, in which FIG. 7 (a) shows an ion angular distribution and FIG. 7 (b) shows an ion energy distribution;

FIGS. 9 (a) and (b) illustrate the characteristics of incident distributions of ions starting from the boundary between the bulk plasma region and the sheath region at the time when the gas pressure is 5.0 Pa, in which FIG. 9 (a) shows an ion angular distribution and FIG. 9 (b) shows an ion energy distribution;

FIGS. 10 (a) and (b) illustrate the characteristics of incident distributions of ions starting from the boundary between the bulk plasma region and the sheath region at the time when the gas pressure is 10 Pa, in which FIG. 10 (a) shows an ion angular distribution and FIG. 10 (b) shows an ion energy distribution;

FIG. 17 shows a method of reducing, in an intermediate gas pressure, a difference in size between an inner line pattern and an isolated line pattern;

FIG. 18 shows a method of reducing, in a low gas pressure, a difference in size between an inner line pattern and an isolated line pattern;

FIG. 19 shows the measures to be first taken for reducing, in intermediate gas pressure and low gas pressure, a difference in size between an inner line pattern and an isolated line pattern;

FIG. 22 (b) illustrates pattern profiles which were improved by increasing the gas exhaust amount to 2000 l/second with the gas pressure maintained at 10 Pa;

FIG. 23 (b) illustrates pattern profiles which were improved by reducing the amount of $SiCl_4$ to 10 sccm with the gas pressure and the exhaust amount maintained at 10 Pa and 1500 l/second, respectively;

FIG. 24 (b) illustrates pattern profiles which were improved by reducing the exhaust amount to 500 l/second with the gas pressure maintained at 8 Pa;

FIG. 25 (b) illustrates pattern profiles which were improved by increasing the amount of $SiCl_4$ to 25 sccm with the gas pressure and the exhaust amount maintained at 10 Pa and 1000 l/second, respectively;

FIG. 26 (b) illustrates pattern profiles which were improved by increasing the exhaust amount to 2000 l/second with the gas pressure maintained at 4 Pa;

FIG. 27 (b) illustrates pattern profiles which were improved by reducing the amount of $SiCl_4$ to 10 sccm with the gas pressure and the exhaust amount maintained at 4 Pa and 1000 l/second, respectively;

FIG. 28 (b) illustrates pattern profiles which were improved by reducing the exhaust amount to 500 l/second with the gas pressure maintained at 4 Pa;

FIG. 29 (b) illustrates pattern profiles which were improved by increasing the amount of $SiCl_4$ to 25 sccm with the gas pressure and the exhaust amount maintained at 4 Pa and 1000 l/second, respectively;

FIG. 30 (b) illustrates pattern profiles which were improved by increasing the gas pressure and the bias power to 15 Pa and 400 watts, respectively, with the exhaust amount maintained at 1000 l/second;

FIG. 31 (b) illustrates pattern profiles which were improved by increasing the gas pressure and the exhaust amount increased to 15 Pa and 2000 l/second, respectively, with the bias power maintained at 300 watts;

FIG. 32 (b) illustrates pattern profiles which were improved by increasing the high frequency to 50 MHz with the gas pressure and the exhaust amount maintained at 4 P and 1000 l/second, respectively;

FIG. 33 (b) illustrates pattern profiles which were improved by increasing the high frequency to 100 MHz with the gas pressure and the exhaust amount maintained at 4 P and 800 l/second, respectively;

FIG. 34 (b) illustrates pattern profiles which were improved by raising the sample stand temperature to 80° C. with the gas pressure and the exhaust amount maintained at 4 P and 1000 l/second, respectively;

FIG. 35 (b) illustrates pattern profiles which were improved by lowering the sample stand temperature to 0° C. with the gas pressure and the exhaust amount maintained at 10 Pa and 1000 l/second, respectively;

FIG. 36 (a) shows how the silicon was etched under main etching conditions, FIG. 36 (b) shows how the silicon was etched under overetching conditions, and FIG. 36 (c) shows how the silicon was etched under improved overetching conditions;

FIG. 38 (b) illustrates pattern profiles which were improved by reducing the bias power to 150 watts and increasing the exhaust amount to 2000 l/second with the gas pressure maintained at 3 Pa.

DETAILED DESCRIPTION OF PREFERRED EMBODIMENTS

The following description will discuss a reactive ion dry etching apparatus of the parallel plate type as an example of a dry etching apparatus to be used in the present invention.

Figure 1:
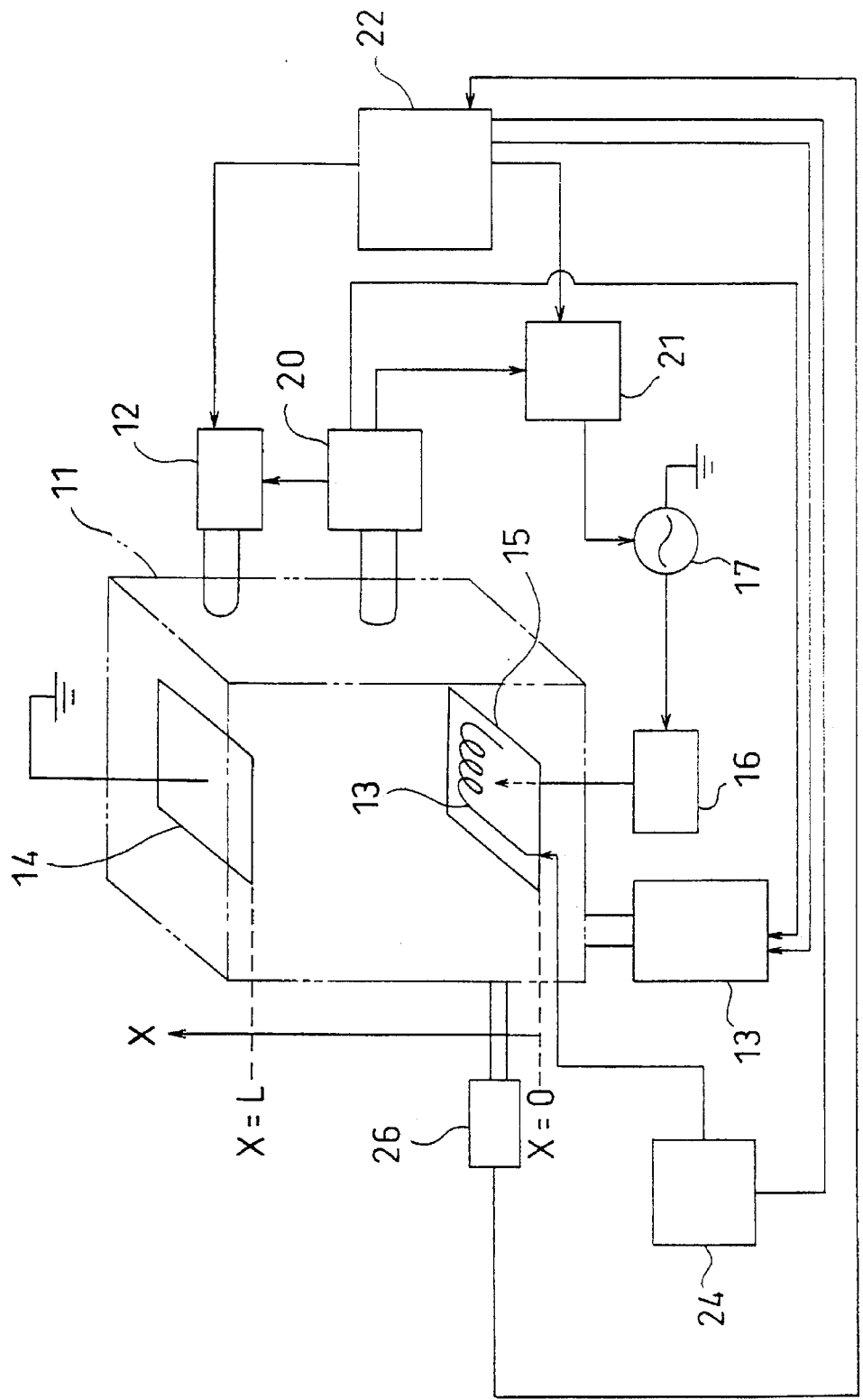
FIG. 1 is a schematic view of a dry etching apparatus to be used in a dry etching method according to each of embodiments of the present invention.

FIG. 1 shows a schematic arrangement of a reactive ion dry etching apparatus of the parallel plate type. As shown in FIG. 1, a reactive gas is introduced into a metallic chamber 11 through a gas controller 12, and the inside pressure of the chamber 11 is suitably controlled by an exhaust system 13.

The chamber 11 is provided at an upper portion thereof with an anode 14 and at a lower portion thereof with a sample stand 15 serving as a cathode. Through an impedance matching circuit 16, the sample stand 15 is connected to a high-frequency electric power source 17 for supplying a high-frequency electric power, thereby to generate a high-frequency discharge between the sample stand 15 and the anode electrode 14. The high frequency supplied from the high-frequency electric power source 17 can be changed in frequency by a frequency control circuit 21.

A plasma parameter detector 26 is arranged to detect the ion energy distribution and the width of the sheath region in the vicinity of the sample stand 15. An etching end detector 20 using a spectral method is arranged to detect the completion of etching. The signal from the etching end detector 20 controls the gas controller 12 and the exhaust system 13 such that the gas pressure and the gas exhaust amount in and from the chamber 11 are suitably controlled. Further, the signal from the etching end detector 20 controls the frequency of the high-frequency electric power source 17 through the frequency control circuit 21.

A heater 23 is controlled through a temperature control circuit 24 to adjust the temperature of the sample stand 15.

An external parameter control device 22 is arranged to control the gas controller 12, the exhaust system 13, the frequency control circuit 21 and the temperature control circuit 24 based on the signals from the plasma parameter detector 26 and the etching end detector 20, on the combination of these signals with external parameters such as frequency, gas pressure, high-frequency electric power, sample stand temperature and the like, or on the combination of these signals with a predetermined programmed processing flow.

Out of a plasma generating area surrounded by the anode electrode 14 and the sample stand 15, a region except for the sheath region in the vicinity of the anode electrode 14 and the sample stand 15, is generally called a bulk plasma region.

Figure 2:
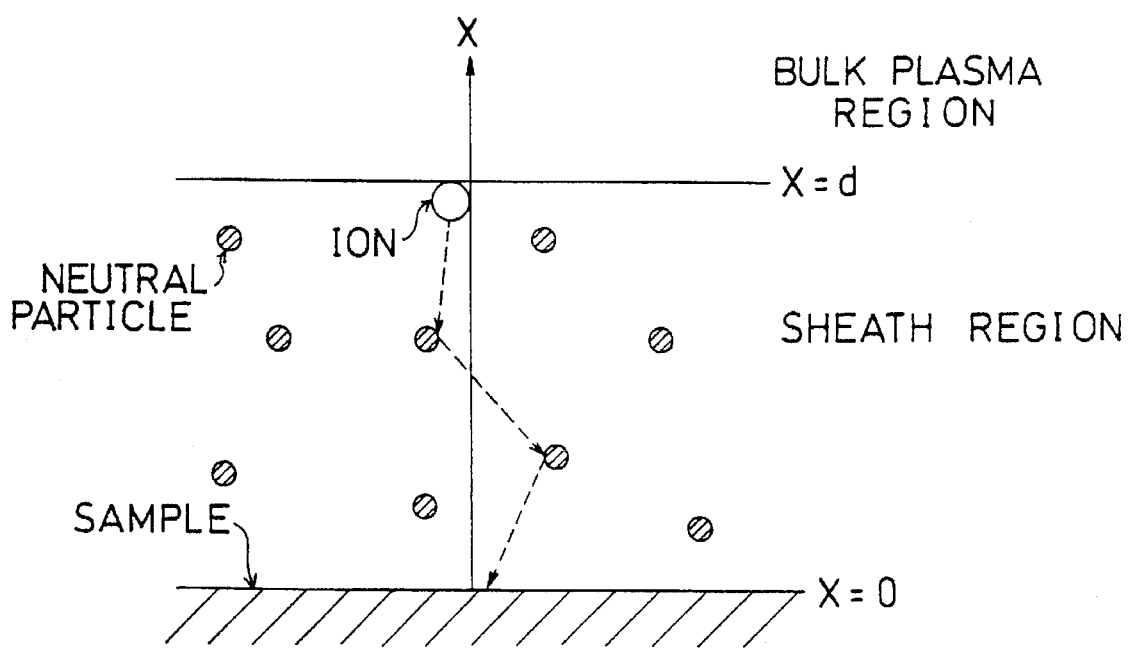
FIG. 2 is a schematic view illustrating how an ion starting from the boundary between the bulk plasma region and the sheath region, is transported toward the sample stand while the ion is coming in collision with neutral particles in the sheath region.

FIG. 2 shows an ion which has started from the boundary between the bulk plasma region and the sheath region in the reactive ion etching apparatus of the parallel plate type in FIG. 1, is accelerated, as transported, toward the sample stand 15 within the sheath width d, during which the ion is scattered due to collision with neutral particles such that the directional property of the ion gets out of order and that the ion energy is damped.

For the same frequency, collision and scattering of ions with neutral particles takes place less often in a low gas pressure, than in a high gas pressure. Accordingly, a high-density ion flux is incident, with a high energy, upon the sample stand 15 at right angles thereto. On the other hand, collision and scattering of ions with neutral particles takes place more often in a high gas pressure than in a low gas pressure. Accordingly, the ion flux is reduced in density and the ion energy is decreased to expand the incident angular distribution of ions incident upon the sample stand 15.

For the same gas pressure, collision and scattering of ions with neutral particles takes place less often in a relatively high frequency in which the sheath width d becomes short, than in a relatively low frequency in which the sheath width d becomes long. Accordingly, a high-density ion flux is incident, with a high energy, upon the sample stand 15 at right angles thereto. On the other hand, collision and scattering of ions with neutral particles takes place more often in a relatively low frequency in which the sheath width d becomes long, than in a relatively high frequency in which the sheath width d becomes short. Accordingly, the ion flux is reduced in density and the ion energy is decreased to expand the incident angular distribution of ions incident upon the sample stand 15.

Figure 3B:
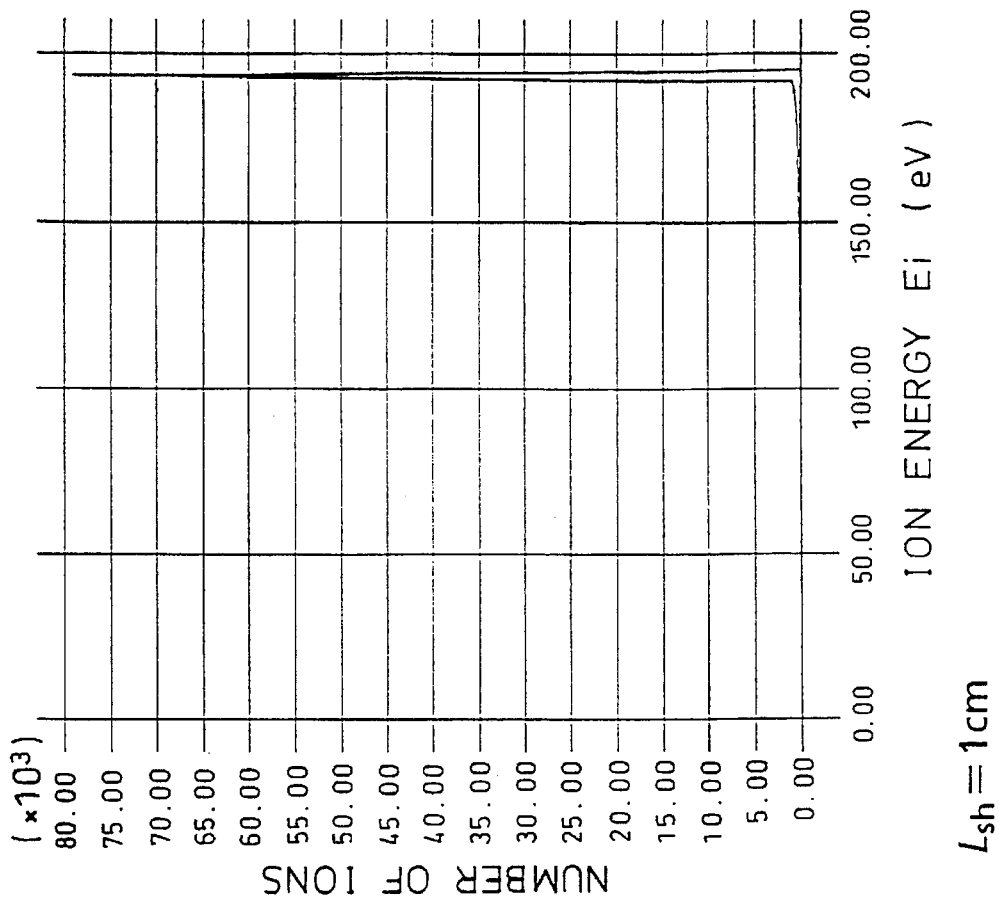
FIGS. 3 (a) and (b) illustrate the characteristics of incident distributions of ions starting from the boundary between the bulk plasma region and the sheath region at the time when the gas pressure is 0.1 Pa, in which FIG. 3 (a) shows an ion angular distribution and FIG. 3 (b) shows an ion energy distribution.
Figure 3A:
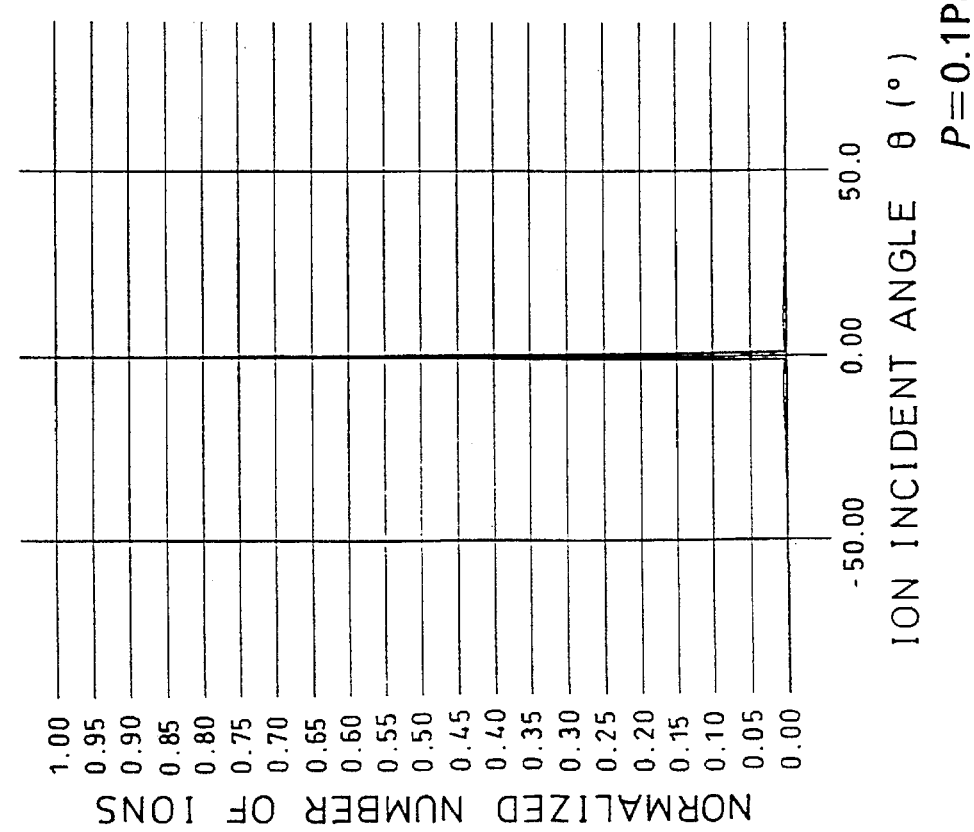
Figure 4B:
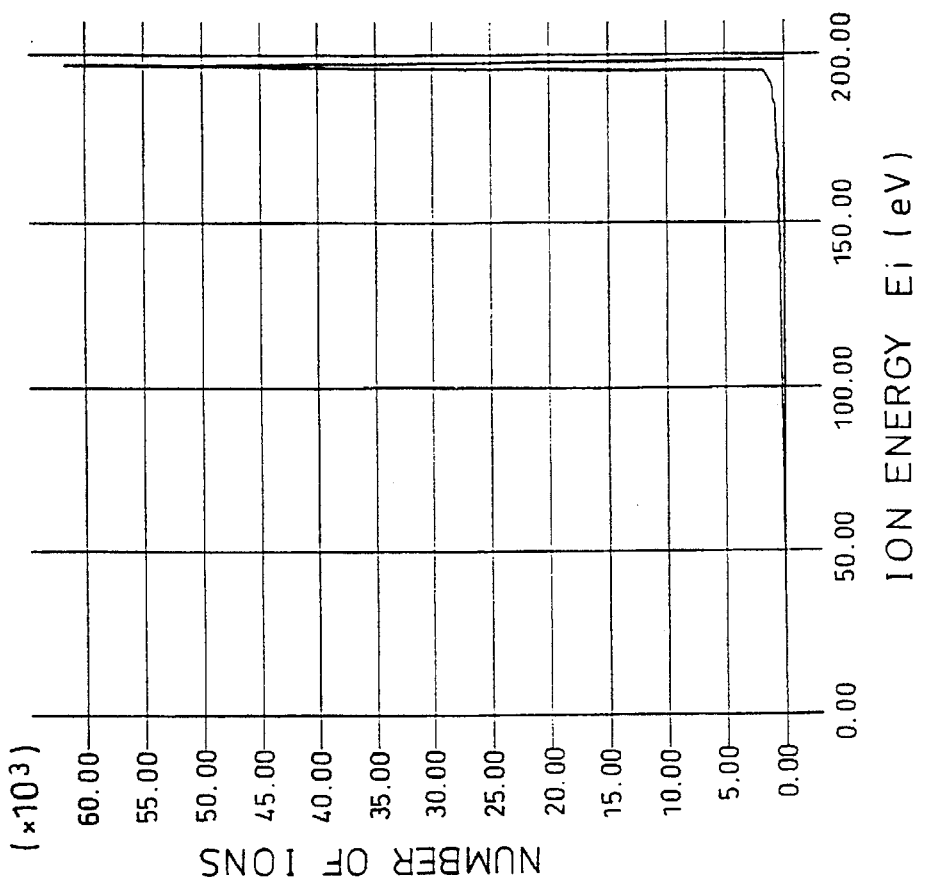
FIGS. 4 (a) and (b) illustrate the characteristics of incident distributions of ions starting from the boundary between the bulk plasma region and the sheath region at the time when the gas pressure is 0.2 Pa, in which FIG. 4 (a) shows an ion angular distribution and FIG. 4 (b) shows an ion energy distribution.
Figure 4A:
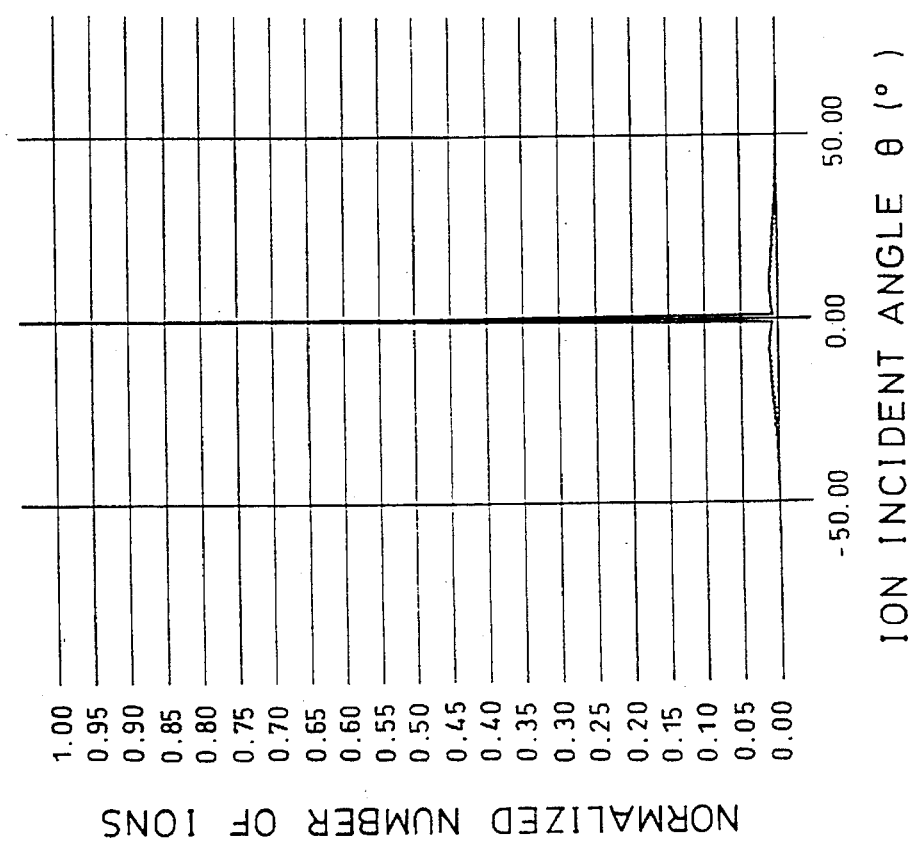
Figure 6A:
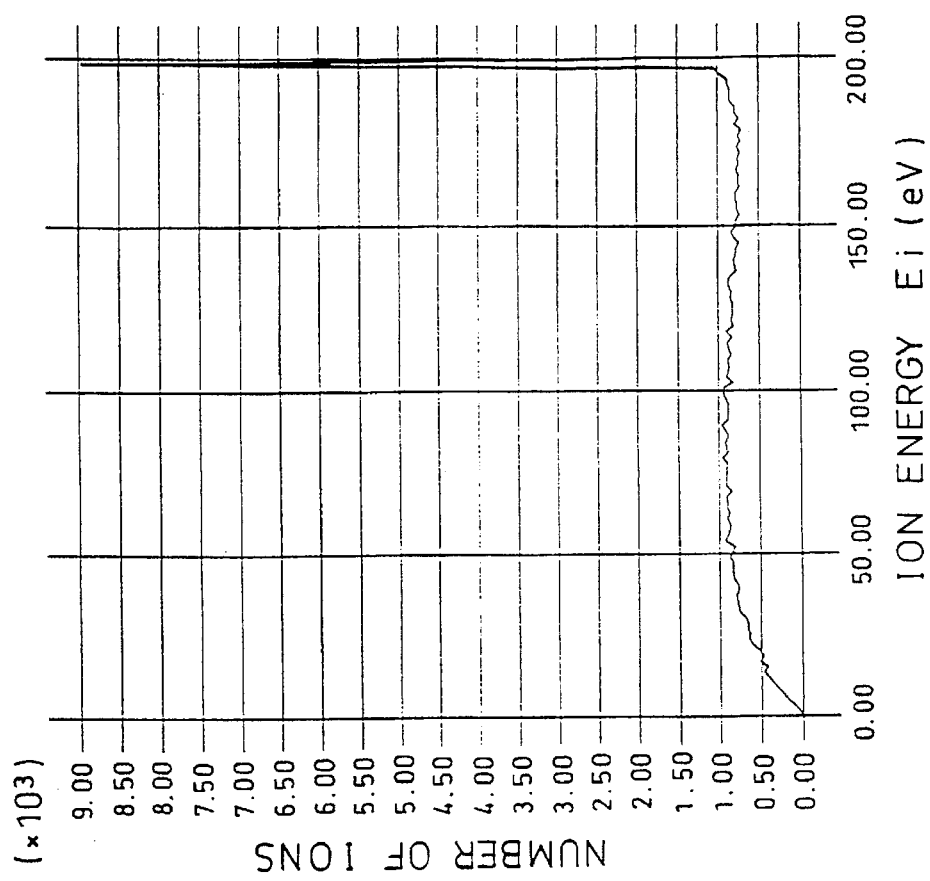
FIGS. 6 (a) and (b) illustrate the characteristics of incident distributions of ions starting from the boundary between the bulk plasma region and the sheath region at the time when the gas pressure is 1.0 Pa, in which FIG. 6 (a) shows an ion angular distribution and FIG. 6 (b) shows an ion energy distribution.
Figure 6B:
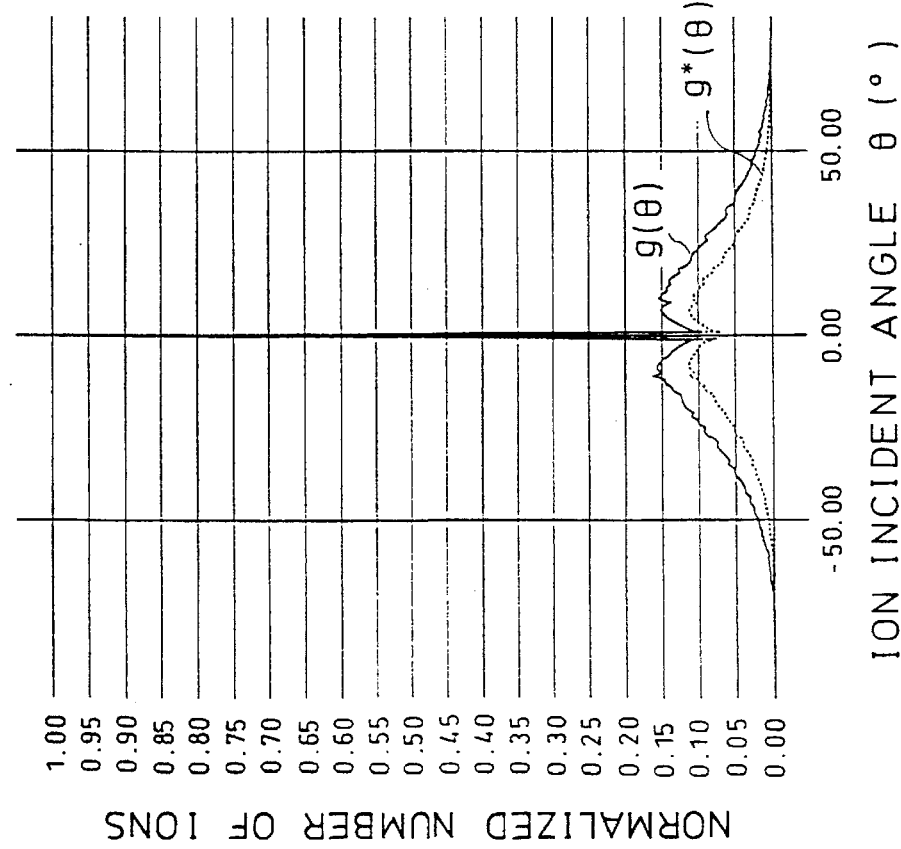
Figure 8B:
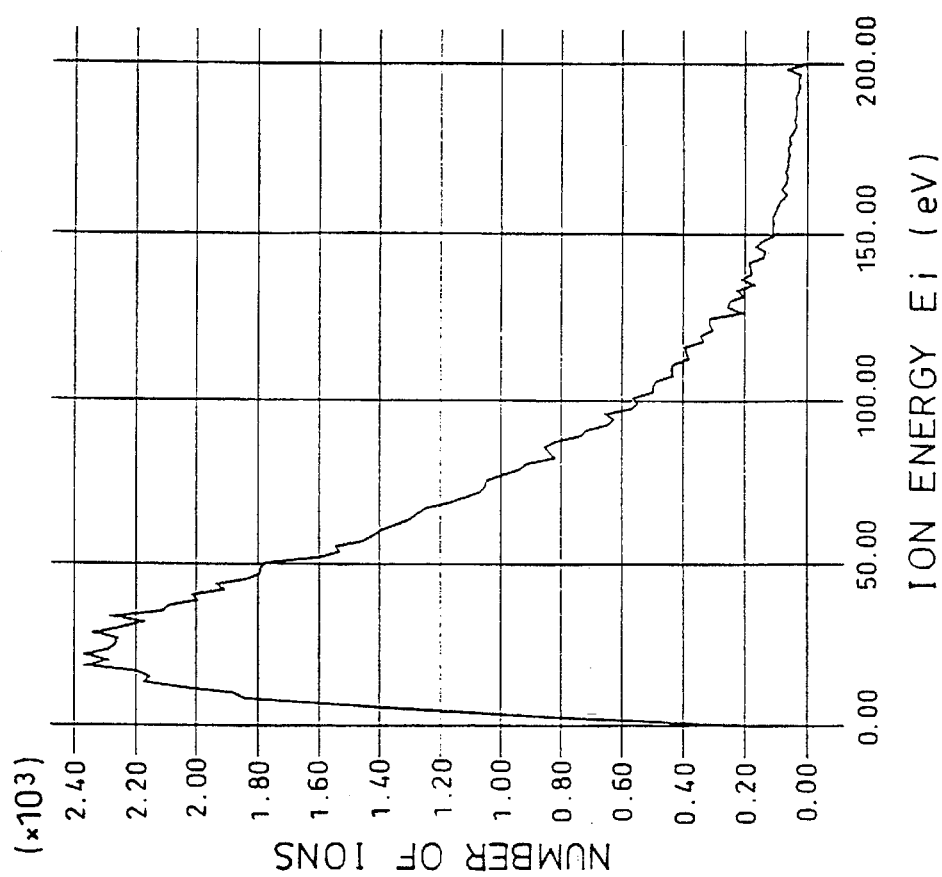
FIGS. 8 (a) and (b) illustrate the characteristics of incident distributions of ions starting from the boundary between the bulk plasma region and the sheath region at the time when the gas pressure is 3.0 Pa, in which FIG. 8 (a) shows an ion angular distribution and FIG. 8 (b) shows an ion energy distribution.
Figure 8A:
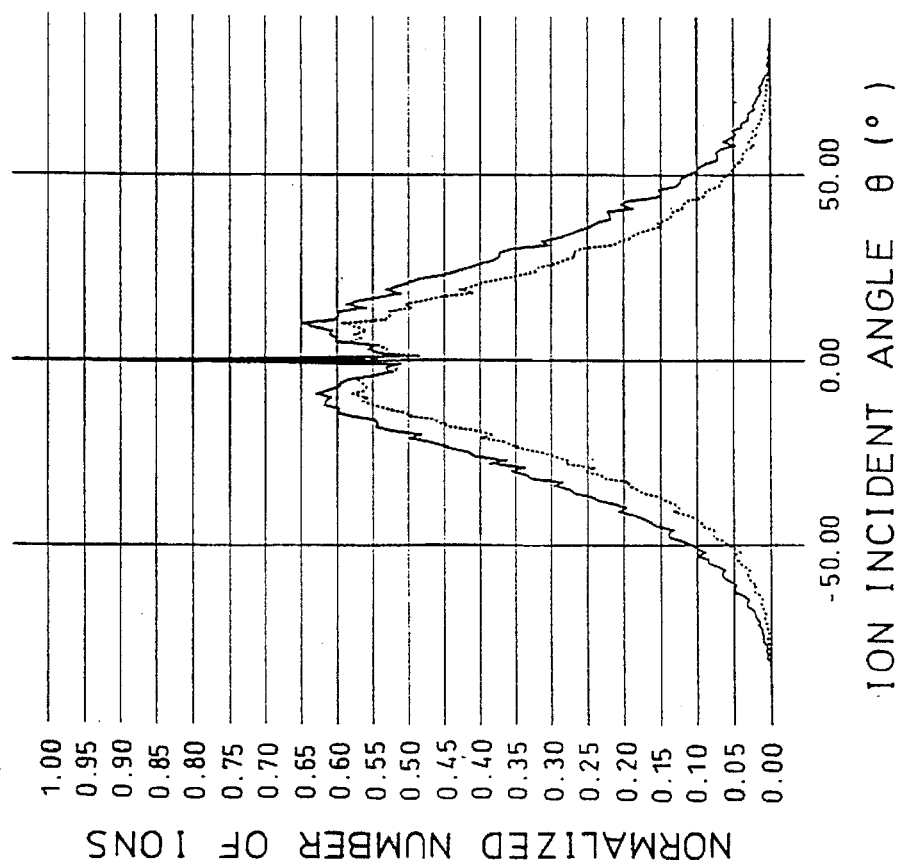
Figures 9A, 9B:
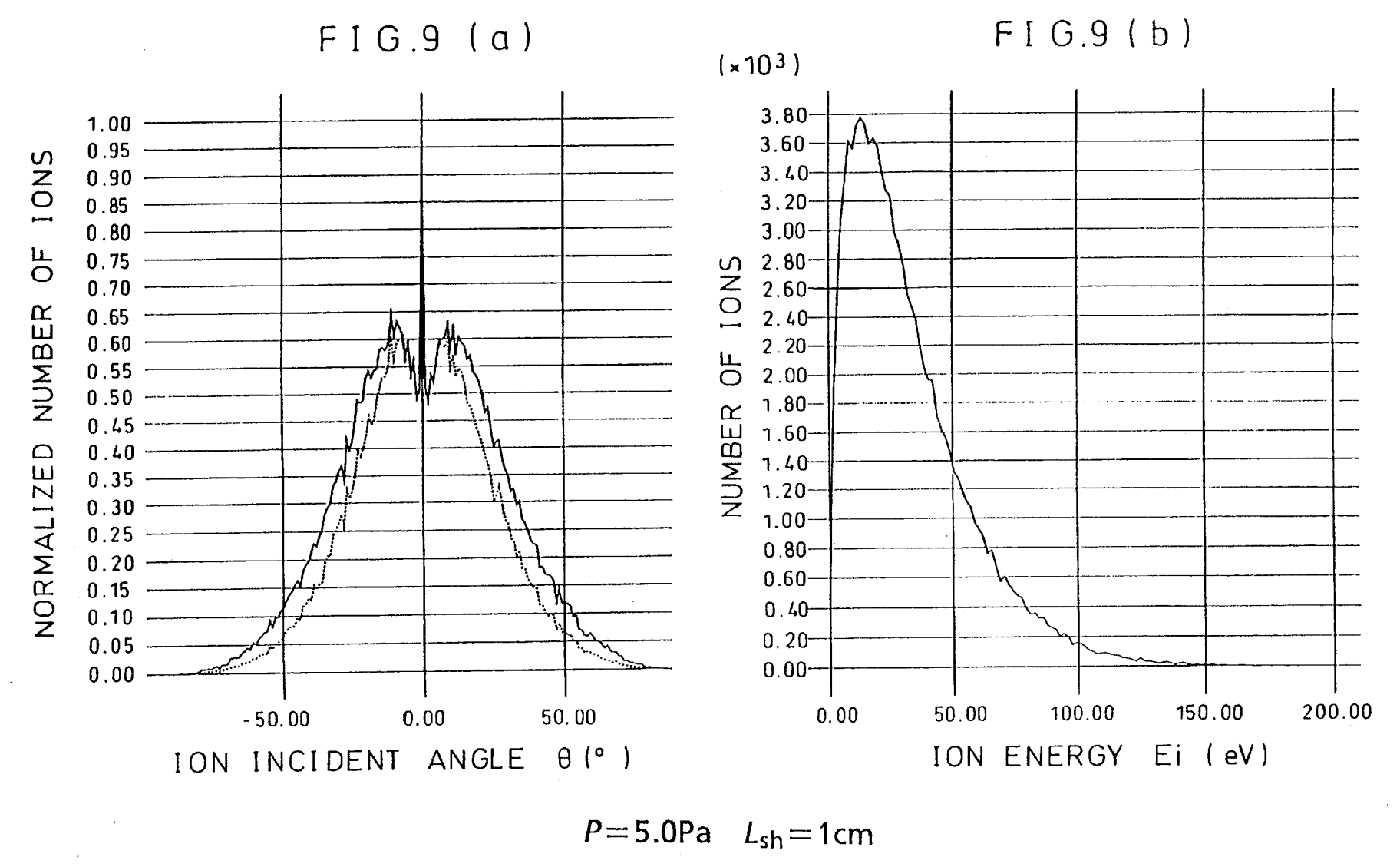

Each of FIGS. 3 to 10 shows ion angle/energy distributions f ($\theta$, $E_i$), with angle $\theta$ and energy $E_i$ serving as functions, of chlorine ions $Cl^+$ which had started from the boundary between the bulk plasma region and the sheath region in the reactive ion etching apparatus of the parallel plate type in FIG. 1 and which reached the wafer surface on the sample stand 15 while such ions were accelerated by the electric field in the sheath region and came in collision with neutral particles. Each of FIGS. 3 (a) to 10 (a) shows, in a solid line, an ion angular distribution g ($\theta$) obtained by integrating the ion angle/energy distribution f ($\theta$, $E_i$) with respect to energy $E_i$. Each of FIGS. 3 (b) to 10 (b) shows, also in a solid line, an ion energy distribution h ($E_i$) obtained by integrating the ion angle/energy distribution f ($\theta$, $E_i$) with respect to angle $\theta$. In FIGS. 3 (a) to 10 (a) and 3 (b) to 10 (b), the sheath width $L_{sh}$ is 1 cm, the sheath voltage is 200 V, and the gas pressure P is in the range of 0.1 to 10 Pa.

As apparent from FIGS. 3 (a) to 10 (a) and 3(b) to 10(b), when the gas pressure is 0.1 Pa or 0.2 Pa, the angular distribution is substantially centralized upon the vicinity of 0° which means that the ions are vertically incident. That is, the ion component which scattered at other angle than 0°, is very small in rate. Further, the energy distribution is substantially centralized upon the vicinity of 200 V which is the sheath voltage. This means that the ion component of which energy was damped by scattering, is very small in rate.

When the gas pressure is increased from 0.5 Pa to 2 Pa, a scattering component is suddenly increased in rate. A component at the peak in the vicinity of 200 V corresponding to the sheath voltage, is gradually decreased in rate, and a low-energy component of which energy was damped by scattering, is relatively increased in rate.

When the gas pressure is increased from 5 Pa to 10 Pa, the rate of a scattering component is certainly increased in the ion angular distribution, but such a scattering component is not so different in rate from that at the time when the gas pressure is 2 Pa. On the other hand, in the ion energy distribution, the peak in the vicinity of 200 V disappears and the center of the energy distribution is moved toward the lower energy side.

In each of FIGS. 3 to 10, the angular distribution curve g*($\theta$) shown in a dashed line represents a value obtained by (i) multiplying, by the ion angle/energy distribution f, the weight of the yield y of a reaction with a $Cl^+$ beam dependent on the energy (the number of Si atoms to be sputtered/the number of incident ions) and (ii) integrating the resulting product with respect to energy $E_i$. That is, an ion having an energy of 50 eV and an ion having an energy of 100 eV exert respectively different influences upon etching even though these ions are incident upon the wafer at the same angle $\theta$. Thus, it is intended to draw an effective angular distribution curve with each of such influences taken into consideration. Here, the bean incident energy $E_i$ is in eV.

As apparent from FIGS. 3 to 10, an ion component having a great scattering angle is generally damped in energy $E_i$ such that the reaction yield weight y ($E_i$) is also small. As a result, each ion angular distribution shown in a dashed line with the weight of the reaction yield y taken into consideration, is smaller in the spread of angular distribution than each ion angular distribution g obtained by simple integration in the energy direction.

Figure 11:
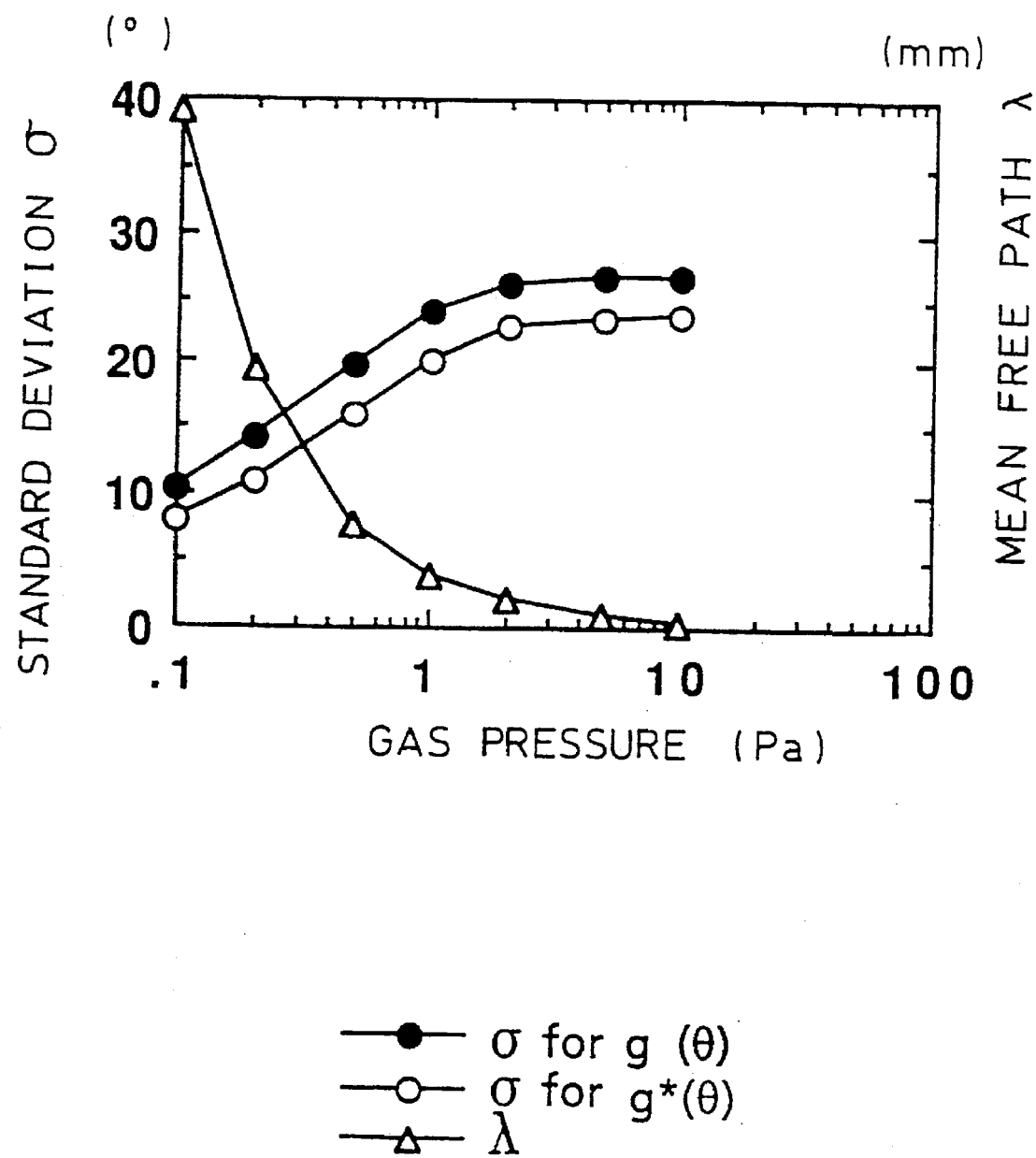
FIG. 11 illustrate the relationships between the gas pressure and the standard deviation $\sigma$ representing the spread of scattering angles in the incident angular distribution of ions starting from the boundary between the bulk plasma region and the sheath region, and the relationships between the gas pressure and the ion mean free path $\lambda$.

FIG. 11 shows the relationships between the gas pressure (shown on the axis of abscissa) and the standard deviation $\sigma$ which represents the spread of scattering angle in the ion angular distribution in each of FIGS. 3 to 10, when it is supposed that the ion angular distribution is a normal distribution. The standard deviation $\sigma$ of the ion angular distribution is increased with an increase in gas pressure. More specifically, the ion angular distribution gradually shows a spread with an increase in gas pressure. When the gas pressure becomes not greater than 2 Pa, the standard deviation $\sigma$ is substantially logarithmically suddenly decreased with a decrease in gas pressure. On the other hand, when the gas pressure is not less than 2 Pa, the standard deviation $\sigma$ is substantially saturated and shows a gentle increase even though the gas pressure is increased. Such changes correspond to changes in ion mean free path $\lambda$ also shown in FIG. 11. It is understood from FIG. 11 that the standard deviation $\sigma$ is about 10° when the gas pressure is 0.1 Pa, about 24° when the gas pressure is 1 Pa, and about 27° when the gas pressure is 10 Pa.

It is understood that, when other plasma internal parameters than the gas pressure are constant, the spread of the ion angular distribution can be controlled to a certain degree by changing the gas pressure of about 1 Pa.

Thus, the standard deviation σ of ion scattering angles has been evaluated, but the ion angular distribution is different from a so-called normal distribution curve as understood from FIGS. 3 to 10. In this sense, to understand the characteristics of the ion angular distribution more intuitively, a certain finite scattering angle width Δ(°) is now considered, and there is now evaluated a degree of anisotropy R (Δ) which represents the rate in number of ions of which scattering angles are smaller than the scattering angle width Δ, with respect to all the ions.

Figure 12:
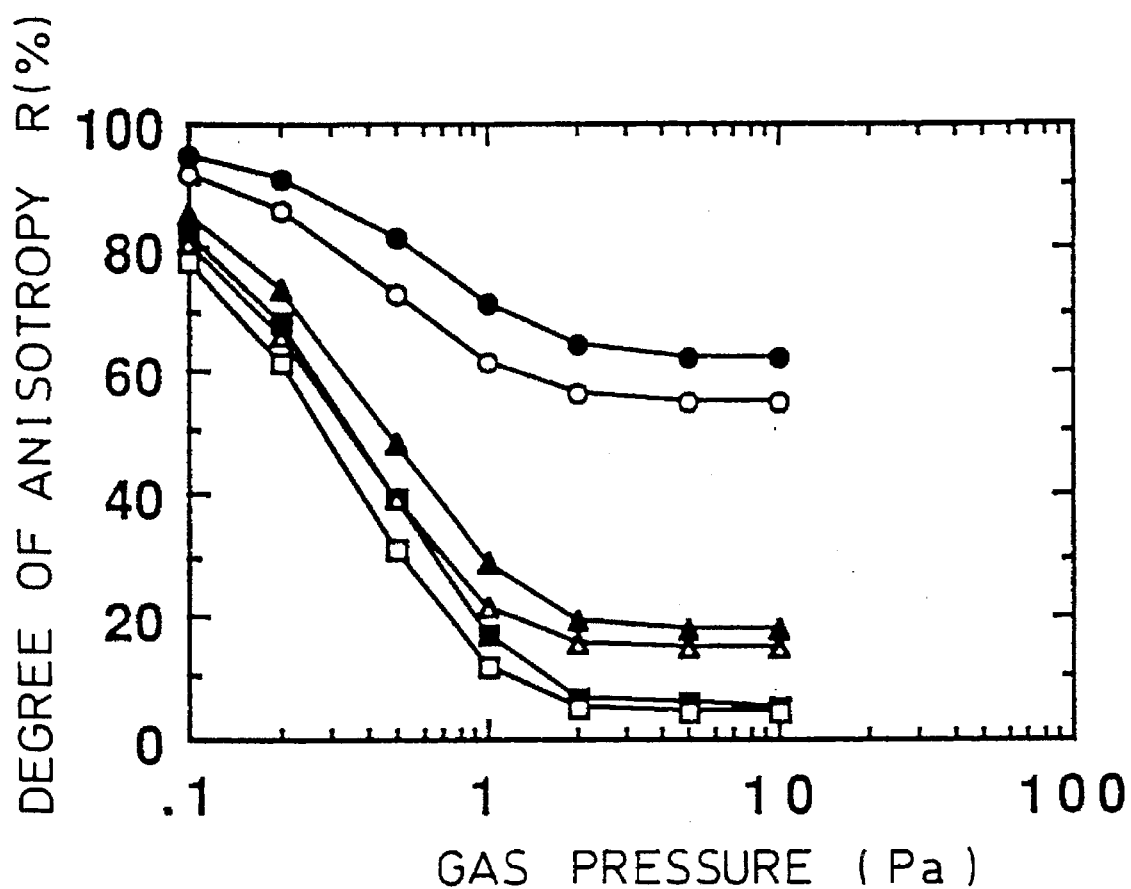
FIG. 12 illustrate the relationships between the gas pressure and the degree of anisotropy, in all the incident ions, of ions incident at a finite scattering angle $\pm\Delta°$ in the angular distribution of ions starting from the boundary between the bulk plasma region and the sheath region.

FIG. 12 shows the relationships between the gas pressure (shown on the axis of abscissa) and the degree of anisotropy R (Δ) in the ion angular distribution shown in each of FIGS. 3 to 10. With a decrease in gas pressure, ions scatter less often to increase the degree of anisotropy R (Δ). Likewise in the standard deviation σ, an increase in degree of anisotropy R (Δ) with a decrease in gas pressure, is remarkable particularly when the gas pressure is not greater than 2 Pa. On the other hand, when the gas pressure is not less than 2 Pa, the degree of anisotropy R (Δ) is substantially saturated and a decrease in degree of anisotropy R (Δ) with an increase in gas pressure is gentle. In FIG. 12, the black symbols represent the values with the weight of reaction yield y taken into consideration, while the white symbols represent the values without the weight of reaction yield y taken into consideration. The following description will discuss the cases in each of which the weight of the reaction yield y is taken into consideration.

Consideration is made on the case of the gas pressure of 1 Pa. For example, the rate of the ions each having a scattering angle width Δ in the range of ±1°, i.e., the degree of anisotropy R (Δ=1°) of the ions which reach the wafer substantially without coming in collision with neutral particles, is about 17%, and the degree of anisotropy R (Δ=5°) of the ions each having a scattering angle width Δ in the range of ±5°, is about 30%. When the gas pressure is 0.1 Pa, the degree of anisotropy R (1°) of the ions each having a scattering angle width Δ in the range of ±1°, becomes about 82%, and the degree of anisotropy R (5°) of the ions each having a scattering angle width Δ in the range of ±5°, is suddenly increased to about 86%.

When the gas pressure P is not greater than 0.2 Pa, the ion angular distribution is substantially centralized upon 0°. The rate of an ion component which scatters at other angle than 0°, is very small. When the gas pressure is increased from 0.5 Pa to 2 Pa, the scattering component is remarkably increased in rate. When the gas pressure P is increased from 5 Pa to 10 Pa, the scattering component is certainly increased in rate, but such a scattering component is not so different in rate from that at the time when the gas pressure is 2 Pa.

When the gas pressure P is not greater than 0.2 Pa, the ion energy distribution is mostly centralized upon about 200 V which corresponds to the sheath voltage, and a low-energy component of which energy was damped by scattering, is very small in rate. When the gas pressure is increased from 0.5 Pa to 2 Pa, there is gradually decreased the rate of a component at the peak in the vicinity of 200 V corresponding to the sheath voltage, and there is relatively increased the rate of a low-energy component of which energy was damped by scattering. When the gas pressure is increased from 5 Pa to 10 Pa, the energy peak in the vicinity of 200 V disappears and the center of the energy distribution is rapidly moved toward the lower energy side.

An ion component having a great scattering angle is generally damped in energy $E_i$ such that the reaction yield y is also small. As a result, the ion angular distribution with the weight of the reaction yield y taken into consideration, is smaller in the spread of angular distribution than the ion angular distribution obtained by simple integration in the energy direction. When considering the influences upon etching, more importance is given to the ion angular distribution with the weight of the reaction yield y taken into consideration.

The standard deviation σ of angular distribution is increased with an increase in gas pressure. More specifically, the angular distribution gradually shows a spread with an increase in gas pressure. When the gas pressure becomes not greater than 2 Pa, the standard deviation σ is substantially logarithmically increased with an increase in gas pressure. On the other hand, when the gas pressure is not less than 2 Pa, the standard deviation σ is substantially saturated and shows a gentle increase. Such changes correspond to changes in ion means free path λ. It is understood that the standard deviation σ is about 10° when the gas pressure is 0.1 Pa, about 24° when the gas pressure is 1 Pa, and about 27° when the gas pressure is 10 Pa.

The foregoing can be summarized as follows. When the sheath width is set to 1 cm, the frequency in collision of ions with neutral particles is suddenly decreased at the point when the gas pressure is not greater than 2 Pa. Accordingly, the ion energy distribution h is centralized upon a value corresponding to the sheath voltage, and the ion angular distribution g is substantially centralized upon 0° such that a component scattering at other angle than 0° is very small. On the other hand, when the gas pressure is not less than 2 Pa, a low-energy component is relatively increased in rate and a vertical incident component is relatively decreased in rate.

Attention should be placed on the fact that, when other plasma internal parameters than the gas pressure are made constant, the spread of the ion angular distribution can be controlled to a certain degree by changing the gas pressure around 1 Pa. This would suggest a possibility of etching being flexibly controlled in such a gas pressure zone.

The results shown in FIGS. 3 to 12 would quantitatively be different when there are changed the boundary conditions such as the voltage applied to the electrodes, the walls or the like, the types of gases to be used, or the like. However, the trends shown in the foregoing can substantially be reproduced qualitatively.

The following description will discuss the relationships mentioned earlier with attention mainly placed on the combination of two external operational parameters of frequency f of high-frequency electric power and gas pressure P.

The sheath width d at the side of the cathode formed in the vicinity of the sample stand 15, is expressed according to the following equation:

$$d=K_1/(P^m \cdot f^n)$$

wherein $K_1$ is a constant, m is a positive real number which is greater than about ⅓ and smaller than about ½, and n is a positive real number which is greater than about ½ and smaller than about 1. This has been discussed by K. Harafuji, A. Yamano and M. Kubota: Jpn. J. Appl. Phys. vol. 33 (1994) p2212 and by N. Mutsukura, K, Kobayashi and Y. Machi: J. Appl. Phys. vol. 68 (1990) p. 2657.

Further, an ion mean free path λ mainly determined by the elastic collision scattering and charge exchange scattering of ions with respect to neutral particles, is inversely proportional to the gas pressure P and can therefore be expressed according to the following equation:

$\lambda = K_2/P$ ($K_2$ is a constant)

Further, there is expressed, according to the following equation, an amount η proportional to probability at which an ion starting from the boundary between the bulk plasma region and the sheath region, is scattered due to collision with neutral particles in the sheath region while the ion is being transported toward the sample stand 15 serving as the cathode electrode:

$\eta = d/\lambda$

When the equations of d and λ are substituted into the equation of η, the following equations are established:

$$\begin{aligned}\eta &= d/\lambda = (K_1/(P^m \cdot f^n)) \times (P/K_2) \\ &= (K_1/K_2) \times (P^{1-m}/f^n) \\ &\sim (K_1/K_2) \times (P/f)^{1/2}\end{aligned}$$

An increase in gas pressure P and frequency f shortens the sheath width d, i.e., a distance by which an ion starting from the boundary between the bulk plasma region and the sheath region, travels to the sample stand 15. From this viewpoint, there is reduced the probability at which an ion scatters due to collision with neutral particles.

An increase in gas pressure P shortens the ion mean free path λ. Thus, there is increased the probability of an ion scattering due to collision with neutral particles. Accordingly, when the gas pressure P is lowered and the frequency f is increased to lower the ratio of P/f, it is possible to lower the probability at which an ion scatters due to collision with neutral particles in the sheath region. This restrains the ion energy from being damped and arranges the directional properties of ions such that the ions are substantially vertically incident upon the sample stand 15. Thus, it is possible to restrain the density of the ion flux reaching the sample stand 15 from being damped, thus achieving both improvements in etching throughput and sufficiently anisotropic etching.

When the gas pressure P and the frequency f are lowered, the sheath width d is lengthened. Accordingly, there is increased the probability at which an ion scatters due to collision with neutral particles. Further, when the gas pressure P is lowered, the ion mean free path λ is lengthened. Accordingly, there is reduced the probability at which an ion scatters due to collision with neutral particles. Thus, when the gas pressure P is increased and the frequency f is lowered to increase the ratio P/f, there can be increased the probability at which an ion scatters due to collision with neutral particles. This damps the ion energy and causes ions to be incident upon the sample with the ion directional property disturbed to some extent. Thus, the density of the ion flux reaching the sample stand 15 can be damped, thus enabling the etching ability to be relaxed.

Regardless of the gas pressure in the chamber, the amount of a lateral wall protecting layer deposited on a pattern lateral wall by reaction product radicals in the chamber, is greater in an isolated line pattern (or outer line pattern located at the outermost side of the line pattern group) than in an inner line pattern. Further, the amount of change in a lateral wall protecting layer deposit amount with respect to a change in the rate of the reaction product radicals in the chamber, is greater in a isolated line pattern lateral wall than in an inner line pattern lateral wall.

In an intermediate gas pressure, because of the ion collimation effect, the ability of scraping lateral wall protecting layers by oblique incident ions, is greater in an isolated line pattern lateral wall than in an inner line pattern lateral wall. In an isolated line pattern, a change in ion incident angle appears in terms of a greater change in amount in which a lateral wall protecting layer is etched. That is, an isolated line pattern is relatively sensitive to a change in the rate of reaction product radicals and to a change in ion incident angle, and an inner line pattern is relatively insensitive thereto.

In a low gas pressure, ions are incident upon the wafer surface with relatively small scattering angles. Because of this pseudo-parallel beam effect, the ion flux incident upon isolated line pattern lateral walls is larger in ion number than the ion flux incident upon inner line pattern lateral walls. However, the difference in ion number between these fluxes is not so great as in the case of an intermediate gas pressure. In particular, a difference between the ability of etching the lateral wall protecting layer on an isolated line pattern lateral wall and the ability of etching the lateral wall protecting layer on an inner line pattern lateral wall, is not so great as in an intermediate gas pressure. Further, in a low gas pressure, the ion incident angle with respect to a lateral wall is relatively small, and the rate of ions incident upon a line pattern lateral wall with a great angle, is also small. Accordingly, the ability of etching the lateral wall protecting layer of an isolated line pattern lateral wall, is smaller in a low gas pressure than in an intermediate gas pressure.

It is understood from the foregoing that, in order to form vertical pattern profiles and to minimize a difference in size between each inner line pattern and each isolated line pattern, it is an effective measure to control the gas exhaust amount to control the rate of the reaction product radicals in the chamber, thereby to control a lateral wall protecting layer deposit amount, regardless of an intermediate or a low gas pressure provided in the chamber, even though the control mechanism in a intermediate gas pressure is different from that in a low gas pressure.

The following description will discuss the relationships mentioned earlier with attention mainly placed on an external operational parameter of the temperature of the sample stand 15.

The sticking coefficient, by a line pattern lateral wall, of radicals playing a role for protecting lateral walls such as reaction product radicals present in the chamber 11 and radicals generated by a lateral wall protecting gas, is generally smaller with a rise in temperature of the line pattern lateral wall (i.e., sample temperature). In an isolated line pattern lateral wall, the estimated solid angle of a lateral wall protecting radical flux substantially isotropically incident upon the sample from above, is as large as about π/2. Accordingly, lateral wall protecting radicals sufficiently reach an isolated line pattern lateral wall at its lower portion. However, in an inner line pattern lateral wall, the estimated solid angle is considerably small. Particularly, when the pattern aspect ratio (value obtained by dividing the line height of a line-and-space-pattern by the space width) is great, the estimated solid angle becomes further small. Accordingly, in order that lateral wall protecting radicals reach an inner line pattern lateral wall at its lower portion, adsorption and re-emission of lateral wall protecting radicals by and from the inner line pattern lateral wall must be repeated several times. In this case, when the temperature of the line pattern lateral wall (i.e., sample temperature) is low, the sticking coefficient becomes great. Accordingly, a major portion of the radicals which play a role for protecting lateral walls, sticks to a lateral wall of the resist pattern above the inner line pattern, and does not sufficiently reach the inner line pattern lateral wall at its lower portion. On the other hand, when the temperature of a line pattern lateral wall (i.e., the sample temperature) is high, the sticking coefficient becomes low. This enables the lateral wall protecting radicals to sufficiently reach an inner line pattern lateral wall at its lower portion.

Figure 13:
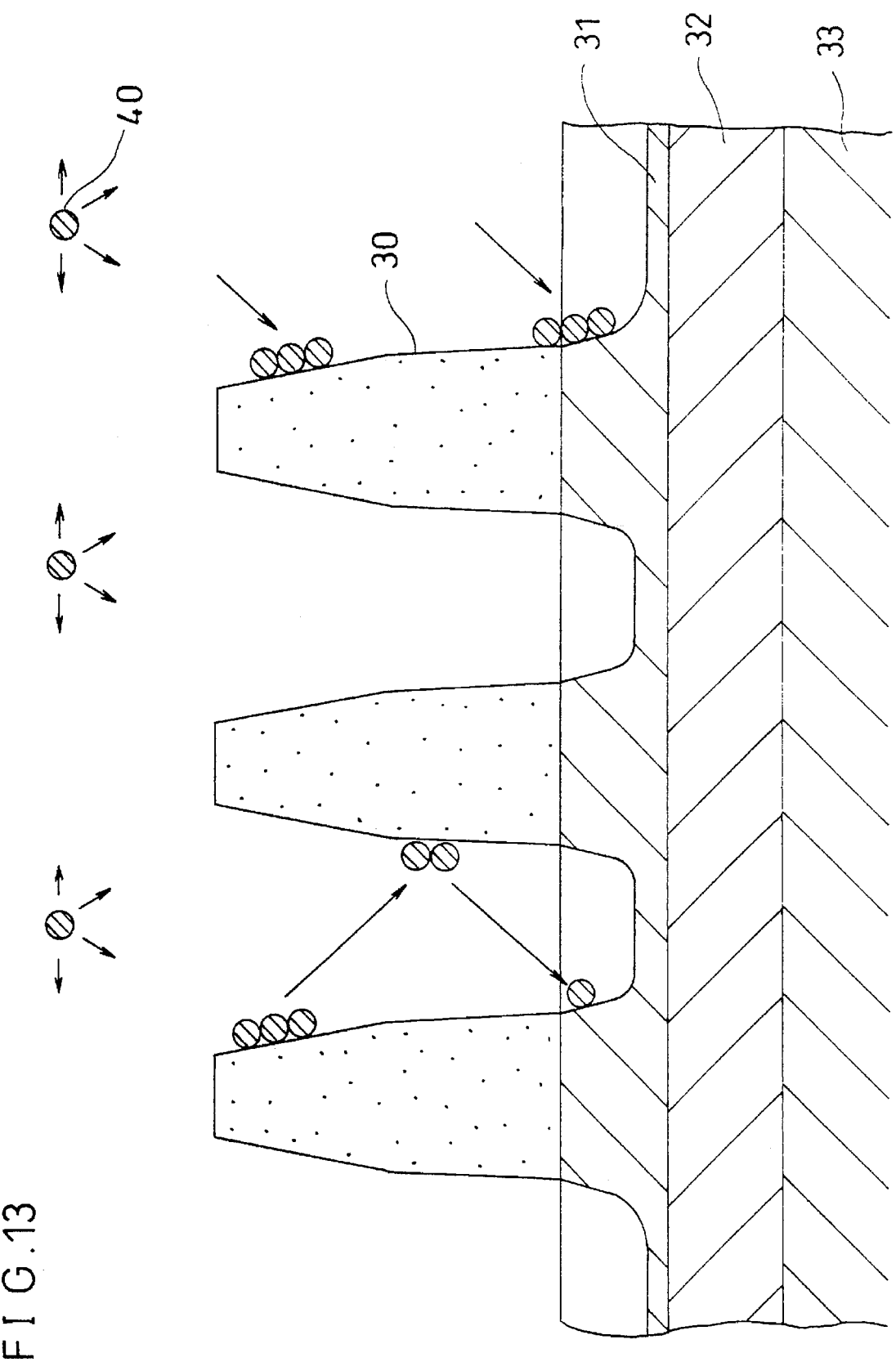
FIG. 13 shows the behavior of lateral wall protecting radicals substantially isotropically incident from above line patterns.

FIG. 13 illustrates the movements of lateral wall protecting radicals 40 substantially isotropically incident upon the sample from above, by comparing an inner line pattern with an outer line pattern located at the outermost side of line pattern group equivalent to an isolated line pattern. In FIG. 13, there are shown a photoresist pattern 30, a polycrystalline silicon layer doped with phosphor 31, a thermally oxidized layer 32 and a silicon substrate 33.

In the main etching, ions or radicals are reacted with a sample to be etched to generate a reaction product and the rate of the reaction product is increased. In the overetching, the rate of the reaction product is reduced. That is, the rate of the lateral wall protecting radicals in the chamber is changed such that a method of controlling the sizes and the profiles at the time of the overetching, is different from that at the time of the main etching.

In this embodiment, the external control parameters above-mentioned can be optimized using signals supplied from a detector for evaluating the rate of the radicals playing a role for protecting lateral walls in the plasma, from a detector for evaluating the flux and energy distribution of ions which play a role for etching a deposited lateral wall protecting layer, from a sheath width detector for evaluating the ion angular distribution, and the like.

Further, it is programmed to automatically execute a two-stage etching such that, using the signal from an etching end detector 20 installed in the plasma generating chamber 11, the completion of the main etching is judged and that etching is first executed under the main etching conditions until the main etching is complete, and etching is thereafter executed under overetching conditions.

The following description will discuss a method by which both isolated line patterns and inner line patterns are vertically formed to reduce a dimensional difference between the resist pattern and each of the inner and isolated line patterns, such that a different in size between each isolated line pattern and each inner line patterns is reduced.

Figure 14:
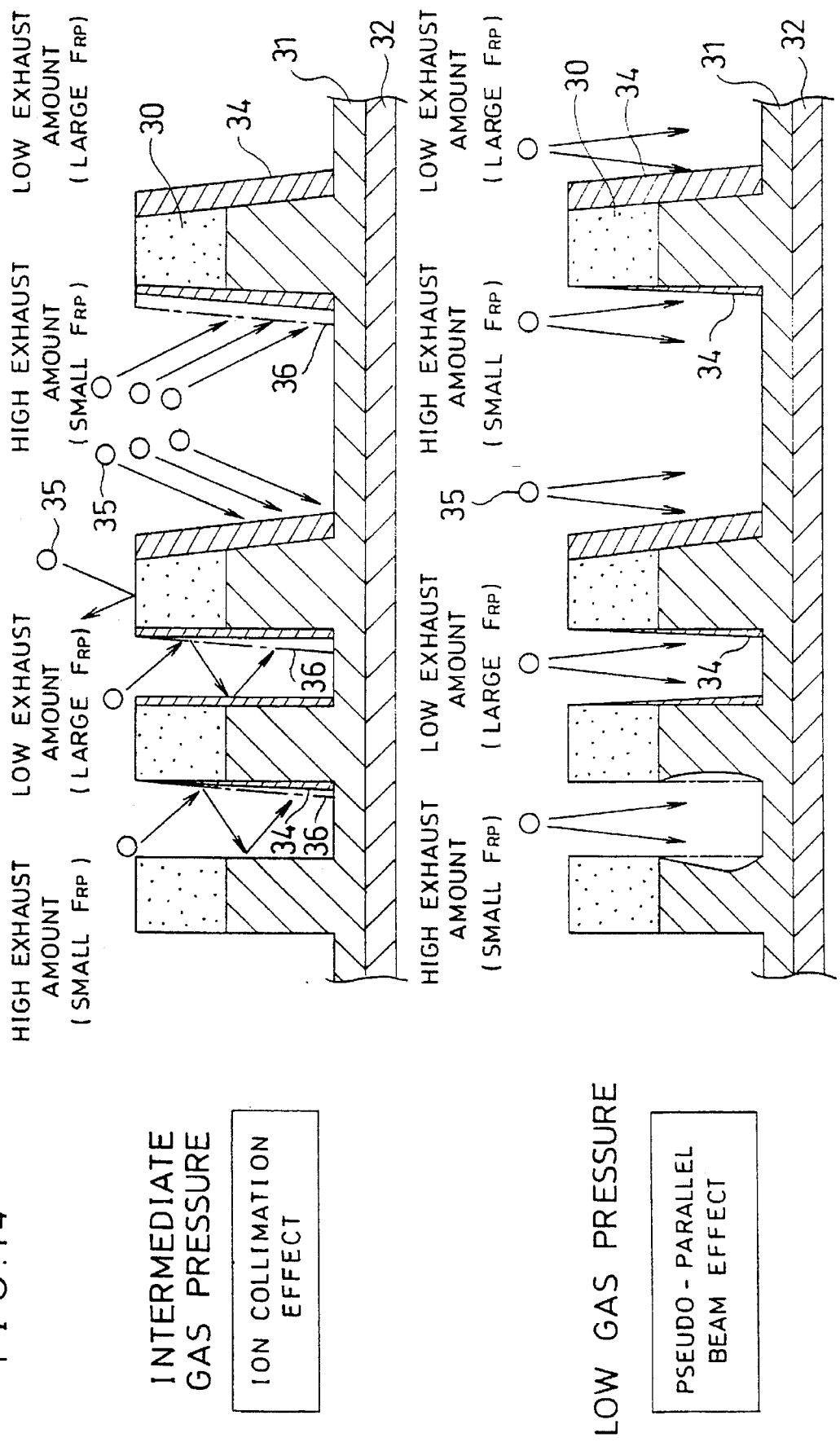
FIG. 14 shows a mechanism illustrating how inner line patterns and an isolated line pattern of the line-and-space pattern are different in profile and in change in size from each other.

FIG. 14 illustrates, in a reactive ion etching apparatus of the parallel plate type shown in FIG. 1, the mechanisms which produce (i) differences in profile and dimensional change of inner line patterns between an intermediate gas pressure and a low gas pressure, and (ii) differences in profile and dimensional change of isolated line patterns between an intermediate gas pressure and a low gas pressure.

In FIG. 14, there are shown ions 35 and lateral wall protecting layers 34 formed by a reaction product and a like. Further, the amounts of reduction in lateral wall protecting layers 34 which have been etched by the ions 35, are generally designated by 36.

The conclusion will be first stated. To form vertical line pattern profiles and to minimize a difference in size between each inner line pattern and each isolated line pattern in the line-and-space pattern, it is an effective means to control the gas exhaust amount to control the rate of the reaction product radicals in the chamber. In the following description, the terms of an intermediate gas pressure and a low gas pressure do not refer to specific pressure values, but are used to express different ion angular distributions.

Lateral wall protecting radicals such as reaction product radicals in the chamber are deposited on line pattern lateral walls to form lateral wall protecting layers. The amount of such a lateral wall protecting layer is greater in an isolated line pattern than in an inner line pattern, regardless of the gas pressure in the chamber. As mentioned earlier, the estimated solid angle of a flux of lateral wall protecting radicals incident substantially isotropically from above the wafer, is about $\pi/2$ for an isolated line pattern lateral wall and is considerably smaller than $\pi/2$ for an inner line pattern lateral wall.

When the rate of the reaction product radicals in the chamber is reduced, the amount of the lateral wall protecting layer deposited on an isolated line pattern lateral wall and the amount of the lateral wall protecting layer deposited on an inner line pattern lateral wall, are reduced with a predetermined ratio maintained. However, the rate of reduction in lateral wall protecting layer with respect to the rate of reduction in lateral wall protecting radicals, is greater in an isolated line pattern lateral wall than in an inner line pattern lateral wall. That is, the amount of change in the lateral wall protecting layer of an isolated line pattern lateral wall is greater than the amount of change in the lateral wall protecting layer of an inner line pattern lateral wall.

The following description will discuss the behavior of incident ions in an intermediate gas pressure. In an intermediate gas pressure, there are incident, upon the surface of a wafer, ions of which scattering angles are relatively great because the ions come in collision with neutral particles in the sheath region. Such oblique incident ions are effective in scraping (or sputtering out) the lateral wall protecting layer of a line pattern lateral wall of which deposit amount is great, such that the line pattern profile is changed from a tapering form to a vertical form. As the ion incident angle is more vertical with respect to a line pattern lateral wall, the ability of etching a lateral wall protecting layer becomes greater. On the contrary, as to an ion incident upon the wafer surface at a right angle thereto, the incident angle is substantially parallel to a line pattern lateral wall. Accordingly, the ability of etching a lateral wall protecting layer by such an ion, is small. On the other hand, when an oblique incident ion scraps a line pattern lateral wall protecting layer of which deposit amount is small, the protecting effect of such a lateral wall protecting layer is eliminated. Thus, the line pattern profile is changed from a vertical form to an inversely tapering form.

The foregoing phenomenon is remarkable particularly in an isolated line pattern lateral wall in which the estimated solid angle of an oblique incident ion is great to cause the incident ion to come in direct collision with the lateral wall. On the other hand, in an inner line pattern lateral wall, the estimated solid angle of an oblique incident ion is small. Accordingly, an incident ion having a scattering angle greater than a certain value, does not enter an inner space of the line-and-space pattern, but is reflected. In other words, an ion component having a great scattering angle cannot comes directly to a lower portion of an inner line pattern lateral wall, but only an ion component having a relatively small scattering angle which is more vertical with respect to the wafer surface, can selectively come to a lower portion of an inner line pattern. More specifically, out of an ion flux having a wide angular distribution, only an ion component of which scattering angle is not greater than a certain value, is collimated to allow such an ion component to come to a lower portion of the lateral wall of an inner line pattern of the line-and-space pattern. Such an effect is called "ion collimation effect" as mentioned earlier.

An ion having a great scattering angle which has been somewhat incident in the vicinity of an upper portion of an inner line pattern lateral wall, cannot enter a lower portion of the inner line pattern lateral wall unless such an ion is reflected several times between the inner line pattern lateral wall and a line pattern lateral wall opposite thereto. Meanwhile, the incident ion is reduced in energy to lower the ability of etching a lateral wall protecting layer. It is a matter of course that the ion number of the incident ion flux is smaller in an inner line pattern lateral wall than in an isolated line pattern lateral wall.

The foregoing phenomena will be summarized as follows.

The amount of change in lateral wall protecting layer deposit amount with respect to a change in the rate of the lateral wall protecting radicals in the chamber, is greater in an isolated line pattern lateral wall than in an inner line pattern lateral wall. Because of the ion collimation effect, the ability of scraping lateral wall protecting layers by oblique incident ions, is greater in an isolated line pattern lateral wall than in an inner line pattern lateral wall. In an isolated line pattern lateral wall, a change in ion incident angle appears in terms of a greater change in amount in which a lateral wall protecting layer is etched. As thus discussed, an isolated line pattern lateral wall is relatively sensitive to a change in the rate of the reaction product radicals and to a change in ion incident angle, and an inner line pattern lateral wall is relatively insensitive thereto.

The following description will discuss the behavior of incident ions in a low gas pressure. In a low gas pressure, ions come less often in collision with neutral particles in the sheath region, and there are many ions relatively vertically incident upon the wafer surface. Thus, the ions are generally incident upon the wafer surface with relatively small scattering angles. More specifically, in a low gas pressure, there are many ions incident substantially along line pattern lateral walls.

In such an incident ion angular distribution, the ion flux incident upon isolated line pattern lateral walls is larger in ion number than the ion flux incident upon inner line pattern lateral walls. However, a difference in ion number between these ion fluxes is not so great as in an intermediate gas pressure. That is, a difference between the ability of etching isolated line pattern lateral wall protecting layers and the ability of etching inner line pattern lateral wall protecting layers, is not so great as in an intermediate gas pressure. Further, the ion incident angles with respect to the lateral walls are relatively small, and the rate of the ions incident upon the line pattern lateral walls with great angles, is also small. Accordingly, the ability of etching deposited protecting layers is smaller than in an intermediate gas pressure, and particularly small for isolated line pattern lateral walls. On the other hand, the lateral wall protecting layer deposit amount is greater in an isolated line pattern lateral wall than in an inner line pattern lateral wall because of the pseudo-parallel beam effect mentioned earlier.

It is understood from the foregoing that, to form vertical line pattern profiles and to minimize a difference in size between each inner line pattern and each isolated line pattern, it is an effective means to increase the gas exhaust amount, to reduce the rate of the reaction product radicals in the chamber and to reduce the lateral wall protecting layer deposit amount. This is because the rate of an oblique incident ion component is small such that the ability of etching lateral wall protecting layers by such ions, is small.

Figure 15:
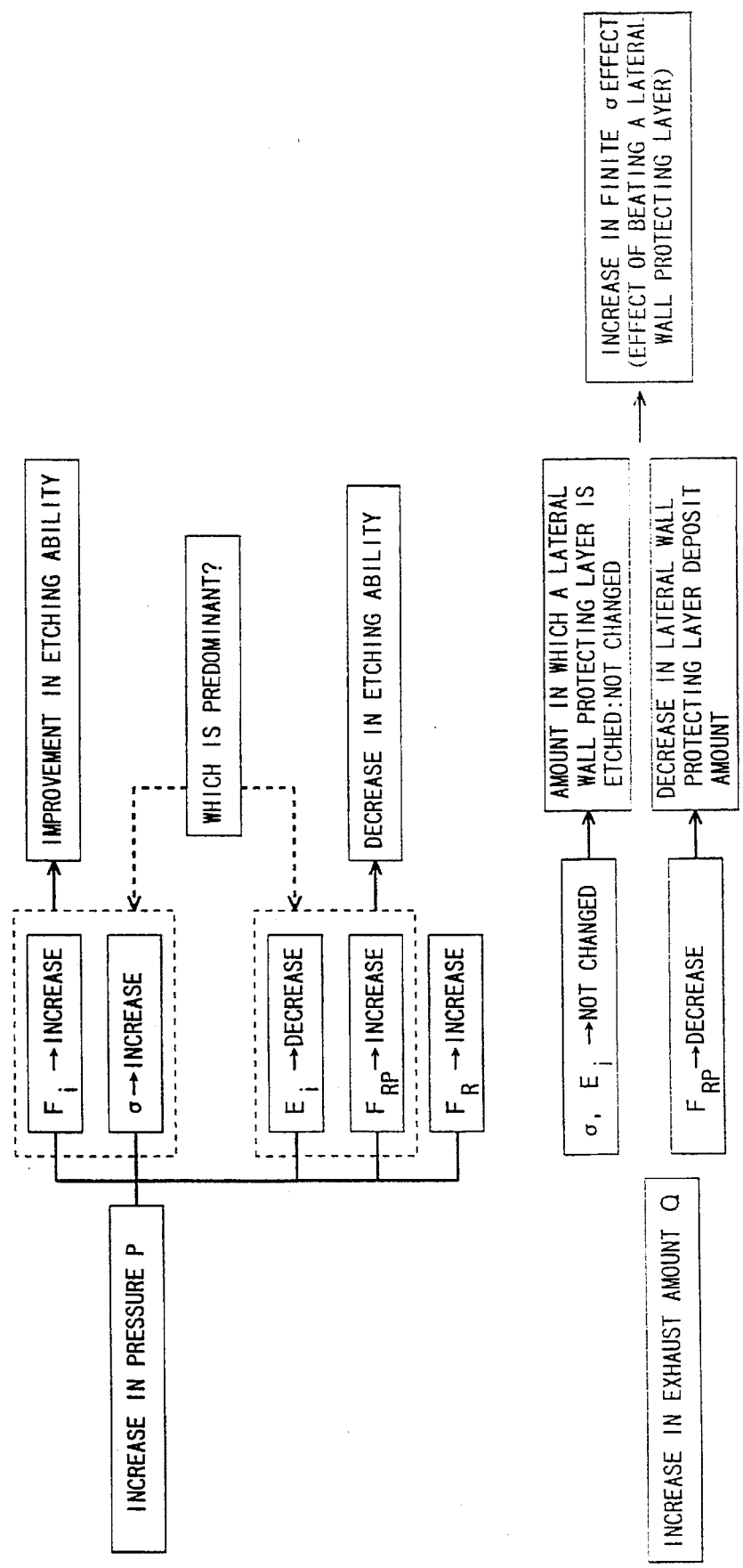
FIG. 15 shows how the internal parameters in the vacuum chamber undergo a change when the external operational parameters comprising the gas pressure and the exhaust amount are changed.

FIG. 15 shows how the internal parameters undergo a change when the external operational parameters of gas pressure P and exhaust amount Q are changed.

An increase in gas pressure P causes the following changes in the internal parameters. First, the energy $E_i$ of the ions incident upon the wafer surface is reduced and the standard deviation $\sigma$ of ion scattering angles representing the spread of the incident ion angular distribution g, is increased. The increase in gas pressure P means an increase in raw material gas. Accordingly, as far as the input power has the ability of sufficiently ionizing and exciting the raw material gas, the increase in gas pressure P results in an increase in reactive radical flux $F_R$ and ion flux $F_i$. This increases the rate of the lateral wall protecting radicals such as reaction products, sputtered resists and the like in the chamber, thereby to increase a lateral wall protecting radical flux $F_{RP}$.

The ion energy $E_i$ and the standard deviation $\sigma$ of ion scattering angles are internal parameters relating to the ability of etching a lateral wall protecting layer. A reduction in ion energy $E_i$ lowers the etching ability. An increase in standard deviation $\sigma$ of ion scattering angles improves the etching ability. Accordingly, it cannot simply be judged whether an increase in gas pressure P improves or lowers the etching ability. On the other hand, an increase in lateral wall protecting radical flux $F_{RP}$ apparently increases the lateral wall protecting layer deposit amount. Accordingly, it cannot also be simply judged whether an increases in gas pressure P increases or decreases the lateral wall protecting layer deposit amount. However, when provision is made such that the exhaust amount is increased and the rate of the lateral wall protecting radicals in the chamber is reduced with the gas pressure P maintained constant, the amount in which a lateral wall protecting layer is etched, exceeds the layer deposit amount. More specifically, the thickness of a lateral wall protecting layer can be controlled by controlling the exhaust amount.

It is now supposed that both the isolated line patterns and the inner line patterns are made in a tapering form under certain process conditions. When the rate of the lateral wall protecting radicals in the chamber is high, the tapering degree of an isolated line pattern is greater than that of an inner line pattern. The following description will discuss how to make both profiles vertical and to minimize a difference in size between these profiles.

The exhaust amount Q is increased to provide conditions under which the amount in which a lateral wall protecting layer is etched, exceeds the amount of increase in layer deposit. It is now supposed that the lateral wall protecting layer deposit amount is relatively great. In an isolated line pattern, the profile in a sharp tapering form at the time when the exhaust amount is small, is relatively considerably changed to a vertical form. In an inner line pattern, the profile in a tapering form at the time when the exhaust amount is small, is relatively gently changed from a weak tapering form to a vertical form.

Under the conditions under which the amount in which a lateral wall protecting layer is etched, exceeds the amount of increase in layer deposit, it is now supposed that the lateral wall protecting layer deposit amount is relatively small. In an isolated line pattern, the profile in a tapering form at the time when the exhaust amount is small, is changed to an inversely tapering form. In an inner line pattern, the profile in a tapering form at the time when the exhaust amount is small, is relatively gently changed from a weak tapering form to a vertical form.

As mentioned earlier, a lateral wall protecting layer deposit amount is reduced with a reduction in the rate of the lateral wall protecting radicals in the chamber with an increase in exhaust amount. The amount of such reduction in lateral wall protecting layer deposit amount, is greater in an isolated line pattern lateral wall than in an inner line pattern lateral wall. Accordingly, the lateral wall protecting layer etching effect with an increase in finite standard deviation $\sigma$, is greatly produced. This effect can minimize a difference in size which was present between the isolated line pattern and the inner line pattern when the exhaust amount was small.

Thus, the effects produced at the time when the exhaust amount Q is increased with the gas pressure in the chamber maintained constant, can be summarized as follows.

Even though the exhaust amount Q is increased, the ion energy $E_i$ and the standard deviation $\sigma$ of ion scattering angles, are not changed. Accordingly, the lateral wall protecting layer etching ability undergoes no change. On the other hand, since the rate of the lateral wall protecting radicals in the chamber is lowered, the layer deposit amount is reduced. Accordingly, the lateral wall protecting layer etching effect with an increase in finite standard deviation $\sigma$ of ion scattering angles, is greatly produced.

Figure 16:
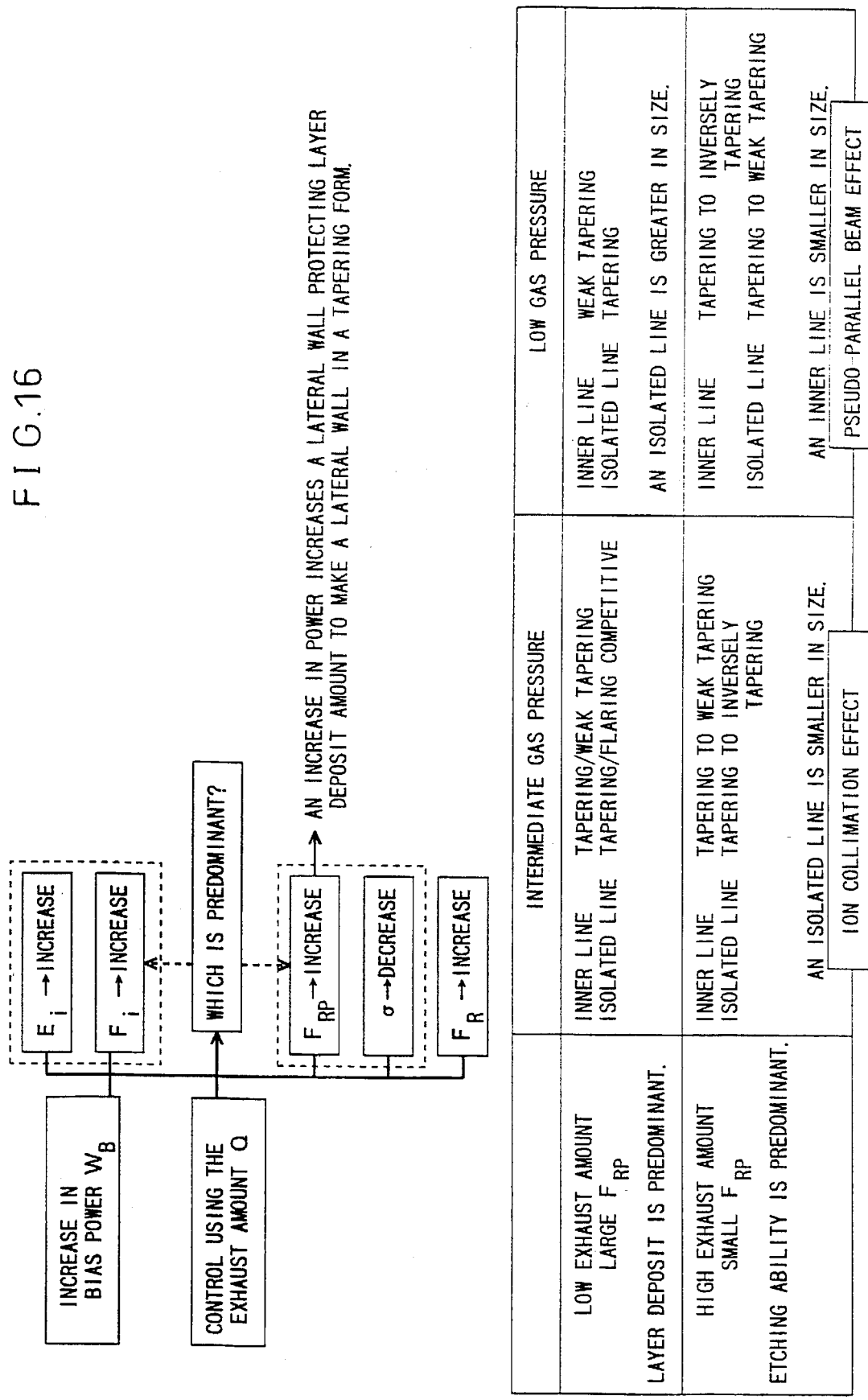
FIG. 16 shows how the internal parameters in the vacuum chamber undergo a change when the external operational parameter comprising bias power (that is, high-frequency electric power applied for generating a self bias) is changed.

FIG. 16 shows how the internal parameters are changed when the external operational parameter of bias power $W_B$ is changed.

It is considered that an increase in bias power $W_B$ brings the following changes in internal parameters. First, the energy $E_i$ of the ions incident upon the wafer surface would be increased. Further, an increase in bias power $W_B$ means an increase in ionization and excitation of the raw material gas in the vicinity of the wafer surface. Thus, an increase in bias power $W_B$ would increase the ion flux $F_i$ and the reactive radical flux $F_R$. Accordingly, the rate of the lateral wall protecting radicals such as reaction products, sputtered resists and the like in the chamber, is increased to increase the lateral wall protecting radical flux $F_{RP}$.

The ion energy $E_i$, the ion flux $F_i$ and the standard deviation $\sigma$ of ion scattering angles are internal parameters relating to the ability of etching a deposited lateral wall protecting layer. An increase in ion energy $E_i$ and ion flux $F_i$ improves the etching ability. On the other hand, a reduction in standard deviation $\sigma$ of ion scattering angles and an increase in lateral wall protecting radical flux $F_{RP}$ increase a lateral wall protecting layer deposit amount. Accordingly, it cannot simply be judged whether an increase in bias power $W_B$ increases or decreases the lateral wall protecting layer deposit amount. However, when provision is made such that the exhaust amount is increased to reduce the rate of the lateral wall protecting radicals with the bias power $W_B$ maintained constant, the amount in which a lateral wall protecting layer is etched, exceeds the amount of increase in lateral wall protecting layer deposit amount. More specifically, the thickness of a lateral wall protecting layer can be controlled by controlling the exhaust amount.

It is now supposed that the rate of the lateral wall protecting radicals in the chamber is high and both isolated line patterns and inner line patterns are made in a tapering form under certain process conditions. Generally, the tapering degree of an isolated line pattern is greater than that of an inner line pattern. The following description will discuss how to make both profiles vertical and to minimize a difference in size between these profiles.

As shown in FIG. 16, there is now considered a 2×2 matrix including parameters of low exhaust amount, high exhaust amount, intermediate gas pressure and low gas pressure, and there is also considered how an isolated line pattern and an inner line pattern are changed in profile when the bias power $W_B$ is increased in each of the combinations of the parameters above-mentioned.

In the case of an intermediate gas pressure and a low exhaust amount, it is not clear whether the profile of an isolated line pattern is made in a tapering form or an inversely tapering form. This is because it is unknown which conditions are predominant, either the conditions under which an isolated line pattern is made in a tapering form, or the conditions under which an isolated line pattern is made in an inversely tapering form. More specifically, when the bias power $W_B$ is increased, there are increased the ion energy $E_i$ and the ion flux $F_i$ which will result in an increase in lateral wall protecting layer etching ability. However, it is also considered that an increase in lateral wall protecting layer deposit amount is great. The profile of an inner line pattern is merely changed from a tapering form to a weak tapering form, because the lateral wall protecting layer etching ability is smaller in an inner line pattern than in an isolated line pattern.

In the case of an intermediate gas pressure and a high exhaust amount, a so-called ion collimation effect is produced. In an isolated line pattern, the lateral wall protecting layer is etched more than in an inner line pattern. Accordingly, the isolated line pattern is changed in profile from a tapering form to an inversely tapering form. On the other hand, in an inner line pattern, the lateral wall protecting layer etching amount is not so great. Thus, the inner line pattern is merely changed in profile from a tapering form to a weak tapering form. More specifically, when the bias power $W_B$ is increased, an amount of reduction in size is greater in an isolated line pattern than in an inner line pattern. Thus, the isolated line pattern is reduced in size.

In the case of a low gas pressure and a low exhaust amount, a so-called pseudo-parallel beam effect is produced. This reduces the lateral wall protecting layer etching ability and also reduces a difference between the isolated line pattern etching ability and the inner line pattern etching ability. However, the lateral wall protecting layer deposit amount itself is greater in an isolated line pattern than in an inner line pattern. Accordingly, when it is now supposed that an isolated line pattern is in a tapering form, an inner line pattern is made in a weak tapering form. More specifically, when the bias power $W_B$ is increased, the rate of the lateral wall protecting radicals in the chamber is increased such that the isolated line pattern becomes greater in size than the inner line pattern.

In the case of a low gas pressure and a high exhaust amount, a pseudo-parallel beam effect is produced. The lateral wall protecting layer etching ability becomes greater than in the case of a low exhaust amount. Further, a difference between the isolated line pattern etching ability and the inner line pattern etching ability, is small. The lateral wall protecting layer deposit amount itself is small because of the high exhaust amount, and is greater in an isolated line pattern than in an inner line pattern. Accordingly, when it is supposed that an isolated line pattern is changed in profile from a tapering form to a weak tapering form because of an increase in bias power $W_B$, the inner line pattern is changed in profile from a weak tapering form to an inversely tapering form. When the bias power $W_B$ is increased, the inner line pattern profile is reduced in size more than the isolated line pattern.

FIG. 17 collectively shows a method of reducing, in an intermediate gas pressure, a difference in size between an isolated line pattern and an inner line pattern, i.e., a method of reducing the dependency of size on the line pattern opening rate.

In such a case, there is positively used the ion collimation effect that the lateral wall protecting layer etching ability produced by a finite effect of the standard deviation $\sigma$ of ion scattering angles, is greater in an isolated line pattern than in an inner line pattern. When the isolated line pattern profile is in a strong tapering form and is greater in size than the inner line pattern, the exhaust amount is reduced or the rate of the lateral wall protecting radical generating gas is reduced. This reduces the lateral wall protecting radicals in the chamber to reduce the lateral wall protecting layer deposit amount. This relatively increases the lateral wall protecting layer etching effect produced by an effect of the finite standard deviation σ of ion scattering angles. Thus, an amount of reduction in size is greater in an isolated line pattern than in an inner line pattern, thus achieving the predetermined object.

When an isolated line pattern is reduced in size more than an inner line pattern, the exhaust amount is reduced or the rate of the lateral wall protecting radical generating gas is increased. This increases the lateral wall protecting radicals in the chamber to increase the lateral wall protecting layer deposit amount. The phenomenon that the amount of increase in lateral wall protecting layer exceeds, with an increase in the rate of lateral wall protecting radicals, the lateral wall protecting layer etching amount produced by an effect of the finite standard deviation σ of ion scattering angles, appears more remarkably in an isolated line pattern than in an inner line pattern. Thus, the amount of increase in size is greater in an isolated line pattern than in an inner line pattern, thus achieving the predetermined object.

To further increase the effect of the finite standard deviation σ of ion scattering angles, the bias power $W_B$ may slightly be increased while slightly increasing the gas pressure. That is for compensating a reduction in ion energy $E_i$ because the ion energy $E_i$ is decreased when the gas pressure is increased.

FIG. 18 collectively shows a method of reducing the dependency of size on the line pattern opening rate in a low gas pressure. In this case, there is positively used the pseudo-parallel beam effect that the ability of etching lateral wall protecting layers by a slightly obliquely incident ion flux in an isolated line pattern, is not so different from that in an inner line pattern, and that the lateral wall protecting layer deposit amount is greater in an isolated line pattern than in an inner line pattern.

First, when an isolated line pattern profile is greater in tapering degree and size than an inner line pattern profile, the exhaust amount is increased or the rate of the lateral wall protecting radical generating gas is decreased. This reduces the rate of the lateral wall protecting radicals in the chamber to reduce the lateral wall protecting layer deposit amount. Thus, the predetermined object can be achieved with the use of the fact that the rate of reduction in lateral wall protecting layer is greater in an isolated line pattern than in an inner line pattern. On the other hand, when an isolated line pattern is smaller in size than an inner line pattern, the exhaust amount is reduced or the rate of the lateral wall protecting radical generating gas is increased.

A table in FIG. 19 summarizes the measures to be first taken in a method of reducing the dependency of size on the line pattern opening rate in a 2×2 matrix of an intermediate gas pressure and a low gas pressure for each of an isolated line pattern and an inner line pattern. The table in FIG. 19 shows such measures in eight different cases (A) to (H) where each of an isolated line pattern profile and an inner line pattern profile is made in each of a tapering form and an inversely tapering form under certain process conditions.

Figure 20:
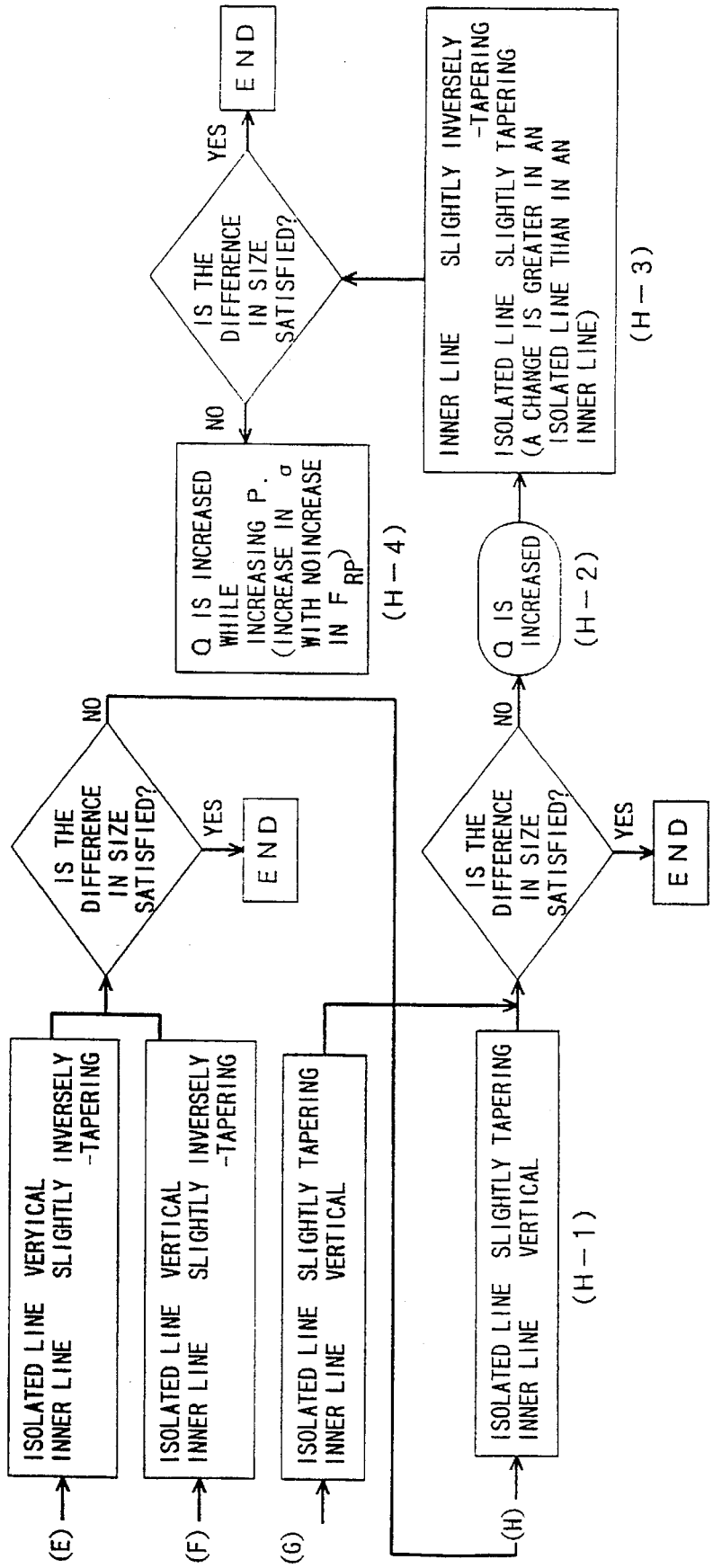
FIG. 20 shows the measures to be then taken for reducing, in the cases of (E) to (H) in FIG. 19, a difference in size between an inner line pattern and an isolated line pattern.

FIG. 20 shows, in the form of a case study, the measures to be later taken in the cases (E) to (H) in FIG. 19 such that a difference in size between an isolated line pattern and an inner line pattern, satisfies the desired condition.

For example, the following description will discuss the case (H) in a low gas pressure where an inner line pattern is made in an inversely tapering form under certain process conditions. In this case, it is supposed that an isolated line pattern profile is vertical. After the processing shown in the case (H) has been executed, an inner line pattern profile might be vertical and an isolated line pattern profile might slightly be tapered (state shown in (H-1)). If this state satisfies the dimensional difference requirements, a judgement of OK is made to complete the processing. If the tapering degree or size of the isolated line pattern, is too high or great, the exhaust amount Q may slightly be increased (means shown in (H-2)). Then, the inner line pattern profile might slightly be inversely tapered and the tapering degree of the isolated line pattern might be reduced such that the dimensional difference requirements might be satisfied (state shown in (H-3)). On the other hand, if the dimensional difference requirements are still not satisfied, the exhaust amount is increased while slightly increasing the gas pressure P, thereby to increase the lateral wall protecting layer etching effect. This reduces the degree of tapering profile, especially for the isolated line pattern (means shown in (H-4)). While repeating such processings, there are determined process conditions which satisfy the dimensional difference requirements.

The following description will discuss how gates are formed in a polycrystalline silicon doped with phosphor by changing, according to the method above-mentioned, the etching process conditions in the main etching operational mode with the use of a reactive ion etching apparatus of the parallel flat plate type.

Figure 21:
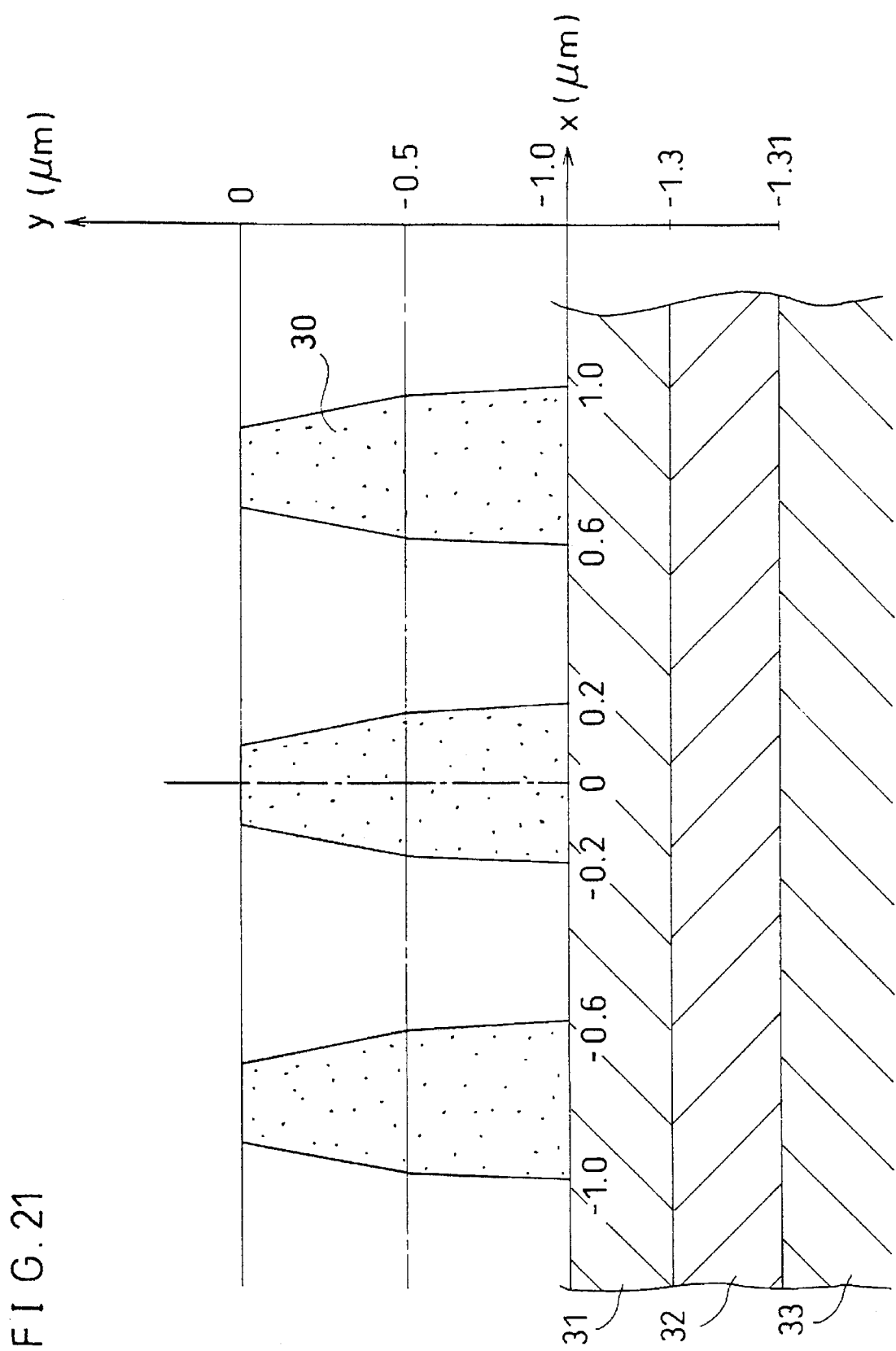
FIG. 21 is a section view of a sample to be etched before subjected to dry etching.

FIG. 21 shows a sample before subjected to etching. In FIG. 21, there are shown a photoresist pattern 30, a polycrystalline silicon layer doped with phosphor 31, a thermally oxidized layer 32 and a silicon substrate 33. As shown in FIG. 21, this is a 0.4 μm line-and-space pattern and having a structure of a 1.0 μm-thick resist mask+a 0.3 μm-thick polysilicon layer+an underlying oxide layer. The resist mask profile is slightly tapered. In this example, etching of the resist itself is not considered. For convenience sake, the top surface of the resist is set to y=0.

Unless otherwise specified, etching was conducted under the following conditions. As the gas to be introduced into the chamber of a plasma generating apparatus, 40 sccm of $Cl_2$ was introduced and the gas pressure P, the frequency f of a high-frequency electric power (or bias power) and the gas exhaust amount in an etching processing apparatus were set to 10 Pa, 13.56 MHz and 1000 l/second, respectively. In the following examples, the bias power or high-frequency electric power was suitably changed. The use of gas containing, as the base, gas of the halogen series such as HBr, $SF_6$ and the like, may also produce similar effects.

Each of FIGS. 22 to 35 shows a specific example. In each of FIGS. 22 to 35, there are shown a photoresist pattern 30, a polycrystalline silicon layer doped with phosphor 31, a deposit layer 34 of a reaction product of a sputtered photoresist or silicon with gas of the halogen series.

Each of FIGS. 22 to 35 shows the surface structure of the polycrystalline silicon layer 31 obtained by conducting 15 etching intervals each for 2 seconds, total 30-second etching, with the conditions changed in a variety of manners. In each of FIGS. 22 to 35, a surface string represents a surface configuration at a certain time. There are prepared fifteen layers of surface string, each layer represents a change in surface configuration with the passage of time. In each of FIGS. 22 to 35, the axis of ordinate shows the height in μm and the surface of the photoresist pattern is set to 0. In each of FIGS. 22 to 35, (a) shows line pattern profiles before improvement, and (b) shows line pattern profiles after improvement.

As has been mentioned above, in the following, the term "an isolated line pattern" represents the outer line pattern located at the outermost side of line pattern group.

Figure 22A:
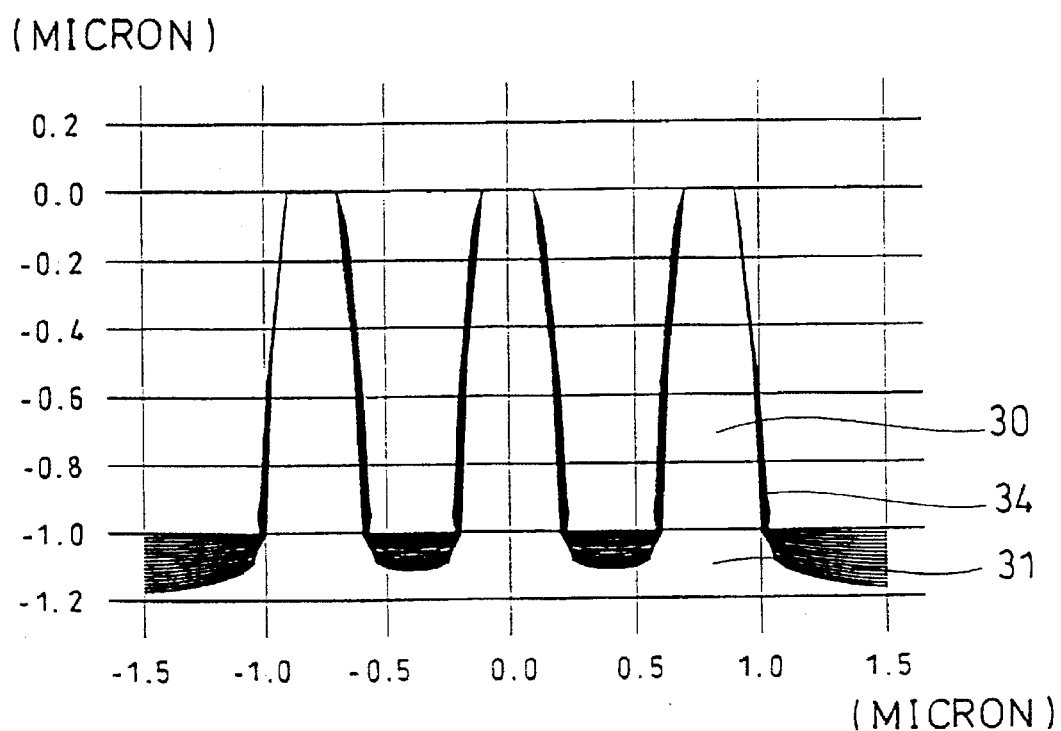
FIG. 22 (a) illustrates pattern profiles formed in a sample after etched under conditions of 40 sccm of $Cl_2$, an intermediate gas pressure of 10 Pa, and the gas exhaust amount set to 1000 l/second, each pattern profile being made in a tapering form and having a width wider than that of the photoresist pattern.
Figure 22B:
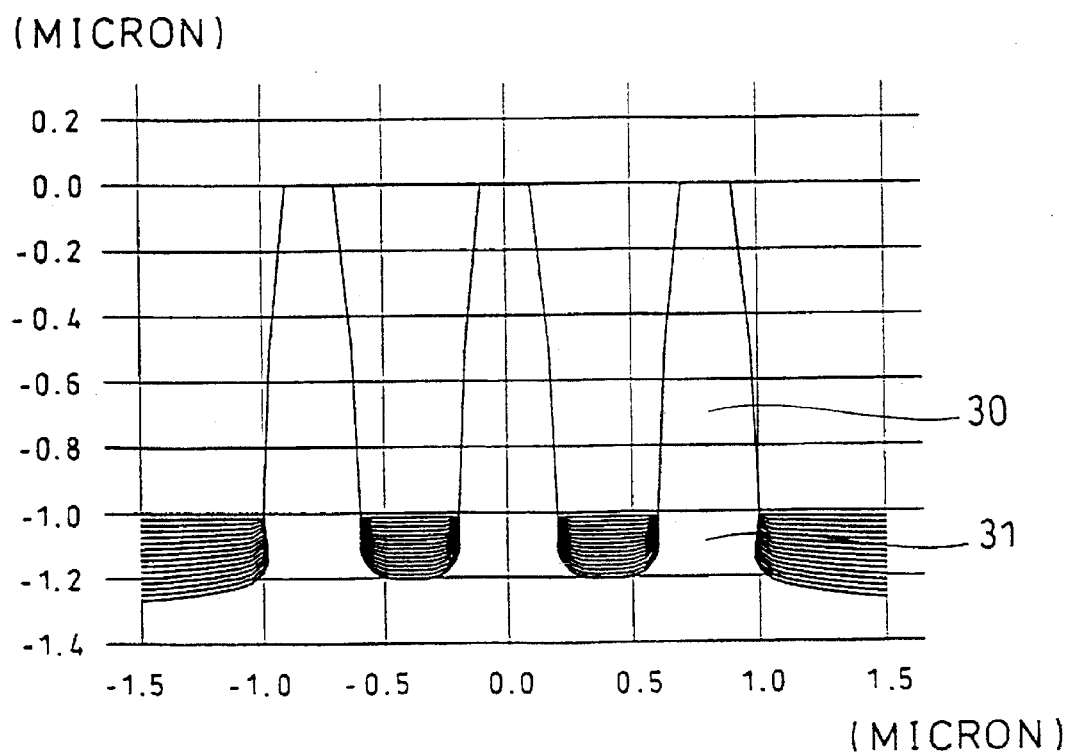

FIG. 22 (a) illustrates the results of etching conducted under conditions of 40 sccm of $Cl_2$ introduced into an intermediate gas pressure of 10 Pa with the gas exhaust amount set to 1000 l/second. As shown in FIG. 22 (a), the lateral wall protecting layer deposit amount on the polycrystalline silicon is greater in an isolated line pattern than in an inner line pattern such that the isolated line pattern profile is more tapered and greater in size than the inner line pattern profile. FIG. 22 (b) illustrates the results of etching conducted by increasing the gas exhaust amount to 2000 l/second with the gas pressure maintained at 10 Pa. That is, the rate of the lateral wall protecting radicals in the chamber is decreased to decrease a lateral wall protecting layer deposit amount on the polycrystalline silicon, and there is relatively increased the effect of etching lateral wall protecting layers by oblique incident ions. Thus, as shown in FIG. 22 (b), the amount of reduction in size is greater in an isolated line pattern than in an inner line pattern, the profiles of the isolated line pattern and the inner line pattern become more vertical and the difference in size between the isolated line pattern and the inner line pattern is reduced.

Figure 23A:
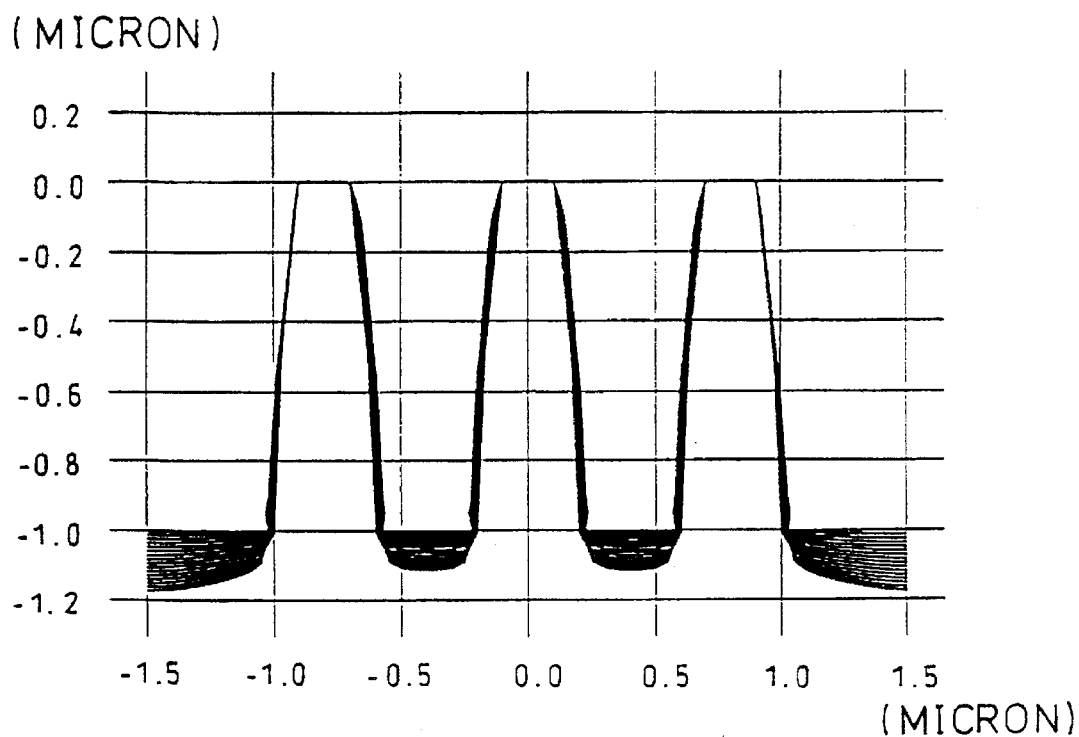
FIG. 23 (a) illustrates pattern profiles formed in a sample after etched under conditions of 40 sccm of $Cl_2$ and 20 sccm of $SiCl_4$ (serving as lateral wall protecting radicals), an intermediate gas pressure of 10 Pa and the exhaust amount set to 1500 l/second, each pattern profile being made in a tapering form and having a width wider than that of the photoresist pattern.
Figure 23B:
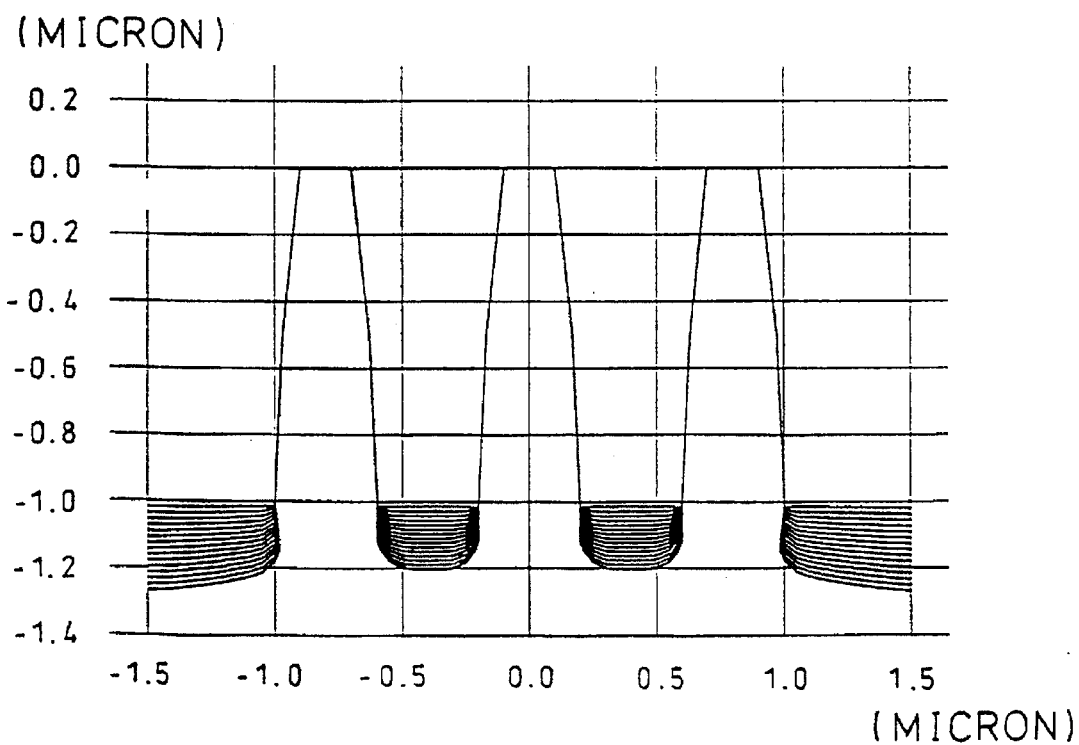

FIG. 23 (a) illustrates the results of etching conducted under conditions of 40 sccm of $Cl_2$ and 20 sccm of $SiCl_4$ (serving as lateral wall protecting radicals) introduced into an intermediate gas pressure of 10 Pa with the exhaust amount set to 1500 l/second. As shown in FIG. 23 (a), the lateral wall protecting layer deposit amount on the polycrystalline silicon is greater in an isolated line pattern than in an inner line pattern such that the isolated line pattern profile is more tapered and greater in size than the inner line pattern profile. FIG. 23 (b) illustrates the results of etching conducted by reducing the amount of $SiCl_4$ to 10 sccm with the gas pressure and the exhaust amount maintained at 10 Pa and 1500 l/second, respectively. That is, the rate of the lateral wall protecting radicals in the chamber is decreased to decrease a lateral wall protecting layer deposit amount on the polycrystalline silicon, and there is relatively increased the effect of etching lateral wall protecting layers by oblique incident ions. Thus, as shown in FIG. 23 (b), the amount of reduction in size is greater in an isolated line pattern than in an inner line pattern, the profiles of the isolated line pattern and the inner line pattern become more vertical and the difference in size between the isolated line pattern and the inner line pattern is reduced.

Figure 24:
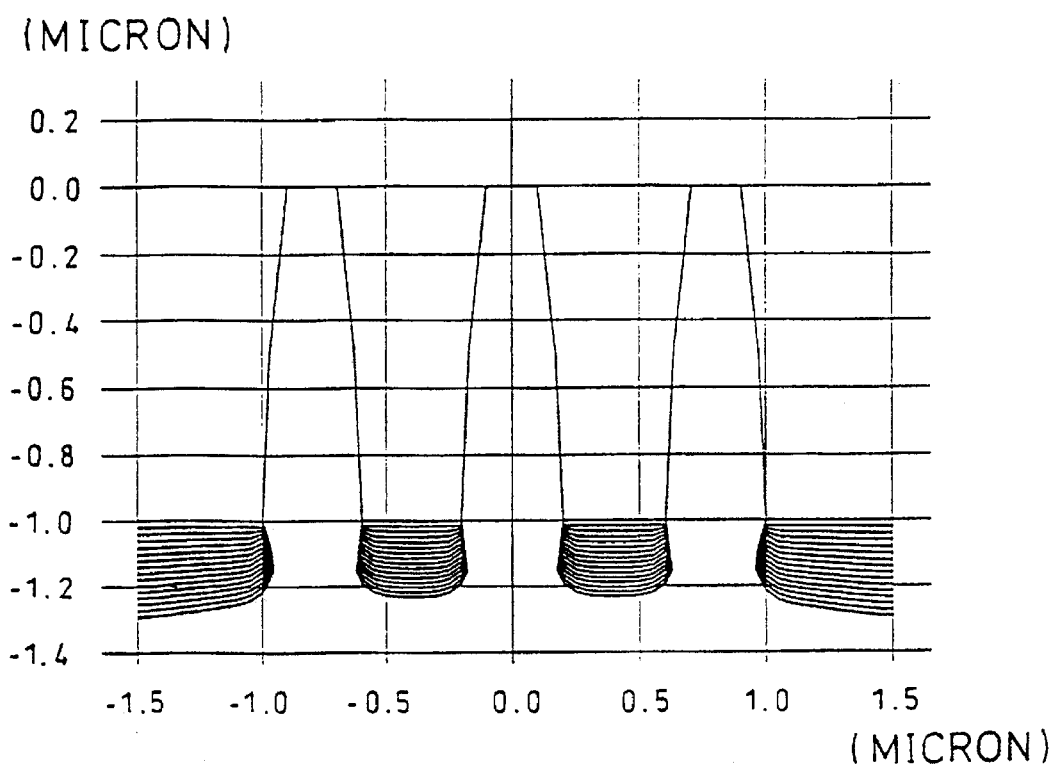
FIG. 24 (a) illustrates pattern profiles formed in a sample after etched under conditions of 40 sccm of $Cl_2$, an intermediate gas pressure of 8 Pa and the exhaust amount set to 1000 l/second, each pattern profile being made in an inversely tapering form and having a width narrower than that of the photoresist pattern.
Figure 24:
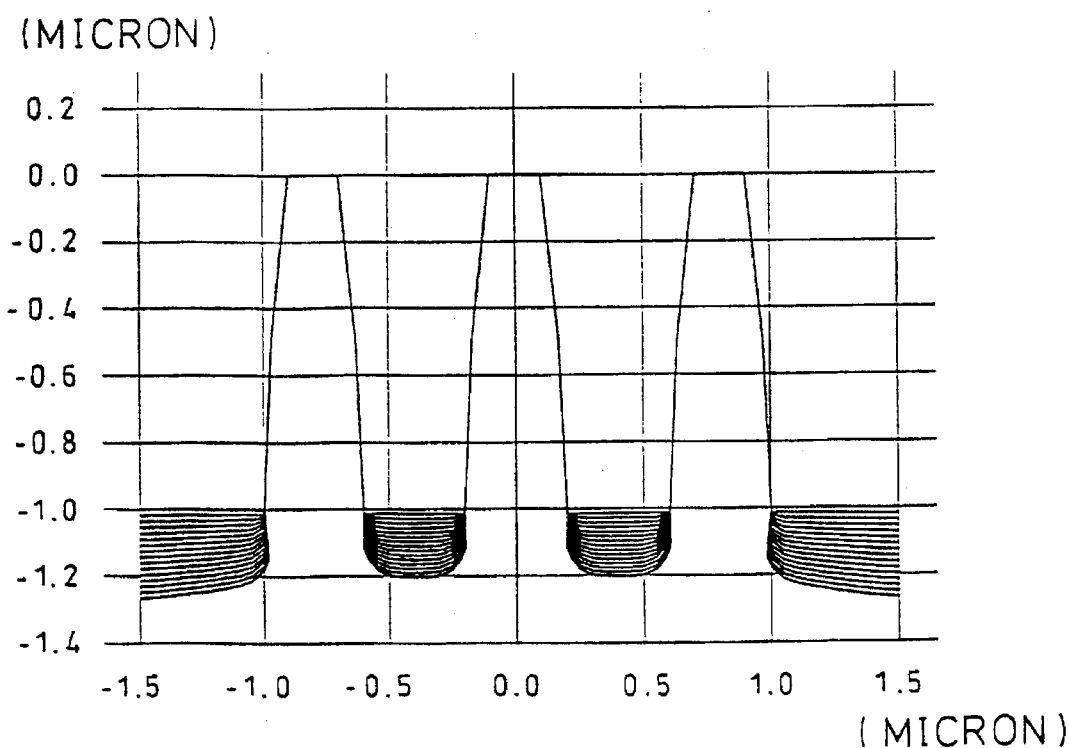

FIG. 24 (a) illustrates the results of etching conducted under conditions of 40 sccm of $Cl_2$ introduced into an intermediate gas pressure of 8 Pa with the exhaust amount set to 1000 l/second. As shown in FIG. 24 (a), an isolated line pattern profile is more inversely tapered and smaller in size than an inner line pattern. FIG. 24 (b) illustrates the results of etching conducted by reducing the exhaust amount to 500 l/second with the gas pressure maintained at 8 Pa. That is, the rate of the lateral wall protecting radicals in the chamber is increased to increase a lateral wall protecting layer deposit amount on the polycrystalline silicon, and there is relatively decreased the effect of etching lateral wall protecting layers by oblique incident ions. Thus, as shown in FIG. 24 (b), the amount of increase in size is greater in an isolated line pattern than in an inner line pattern, the profiles of the isolated line pattern and the inner line pattern become more vertical and the difference in size between the isolated line pattern and the inner line pattern is reduced.

Figure 25:
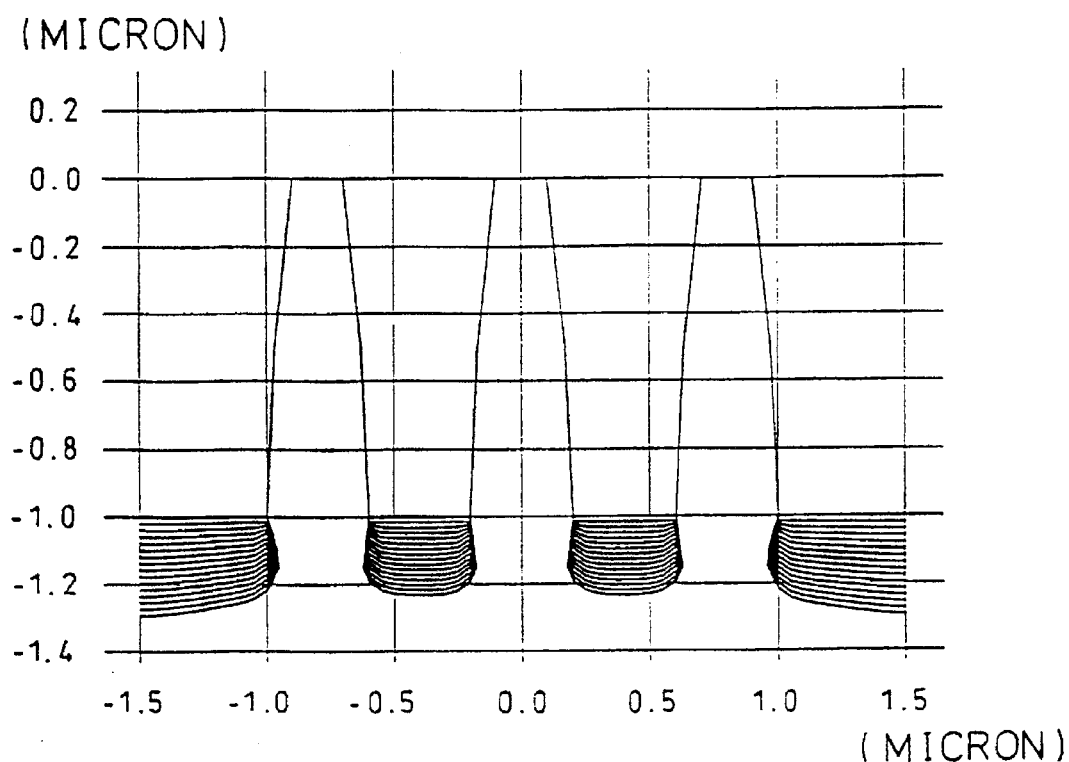
FIG. 25 (a) illustrates pattern profiles formed in a sample after etched under conditions of 40 sccm of $Cl_2$ and 15 sccm of $SiCl_4$, an intermediate gas pressure of 10 Pa and the exhaust amount set to 1000 l/second, each pattern profile being made in an inversely tapering and having a width narrower than that of the photoresist pattern.
Figure 25:
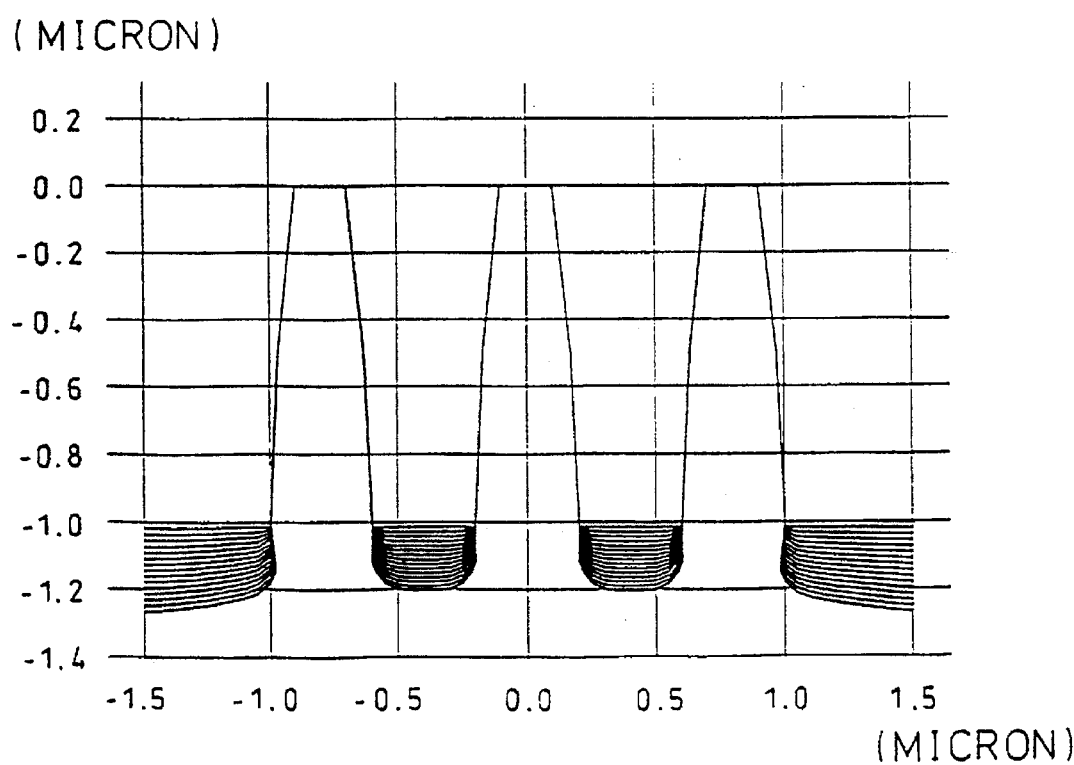

FIG. 25 (a) illustrates the results of etching conducted under conditions of 40 sccm of $Cl_2$ and 15 sccm of $SiCl_4$ introduced into an intermediate gas pressure of 10 Pa with the exhaust amount set to 1000 l/second. As shown in FIG. 25 (a), an isolated line pattern profile is more inversely tapered and smaller in size than an inner line pattern. FIG. 25 (b) illustrates the results of etching conducted by increasing the amount of $SiCl_4$ to 25 sccm with the gas pressure and the exhaust amount maintained at 10 Pa and 1000 l/second, respectively. That is, the rate of the lateral wall protecting radicals in the chamber is increased to increase a lateral wall protecting layer deposit amount on the polycrystalline silicon, and there is relatively decreased the effect of etching lateral wall protecting layers by oblique incident ions. Thus, as shown in FIG. 25 (b), the amount of increase in size is greater in an isolated line pattern than in an inner line pattern, the profiles of the isolated line pattern and the inner line pattern become more vertical and the difference in size between the isolated line pattern and the inner line pattern is reduced.

Figure 26:
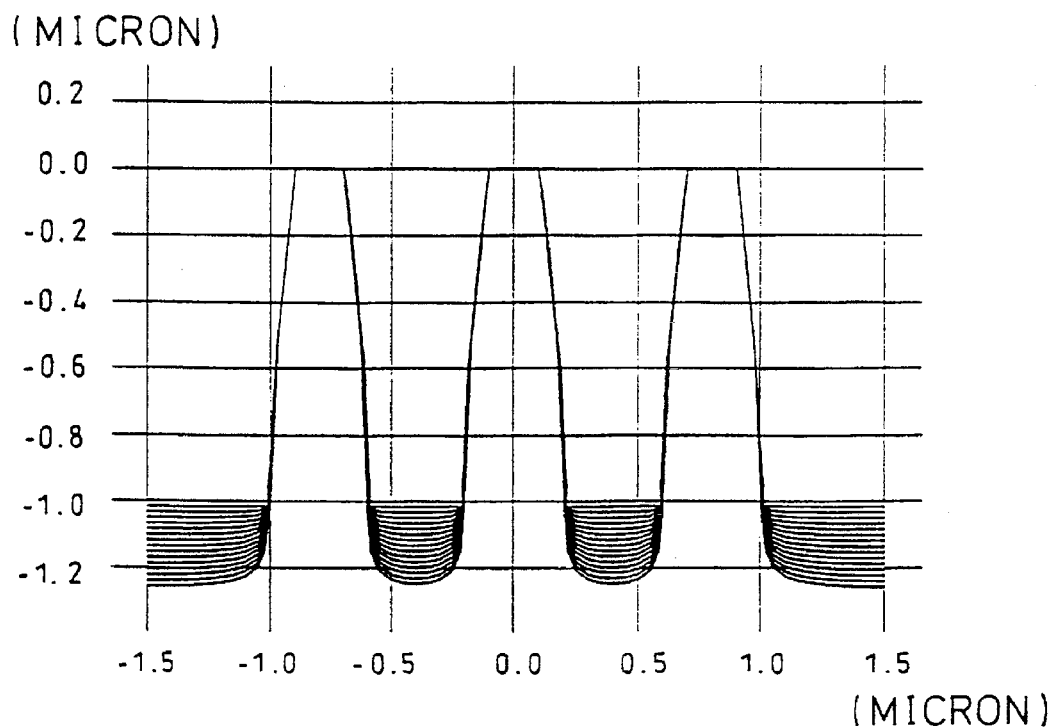
FIG. 26 (a) illustrates pattern profiles formed in a sample after etched under conditions of 40 sccm of $Cl_2$, low gas pressure of 4 Pa and the exhaust amount set to 1000 l/second, each pattern profile being made in a tapering form and having a width wider than that of the photoresist pattern.
Figure 26:
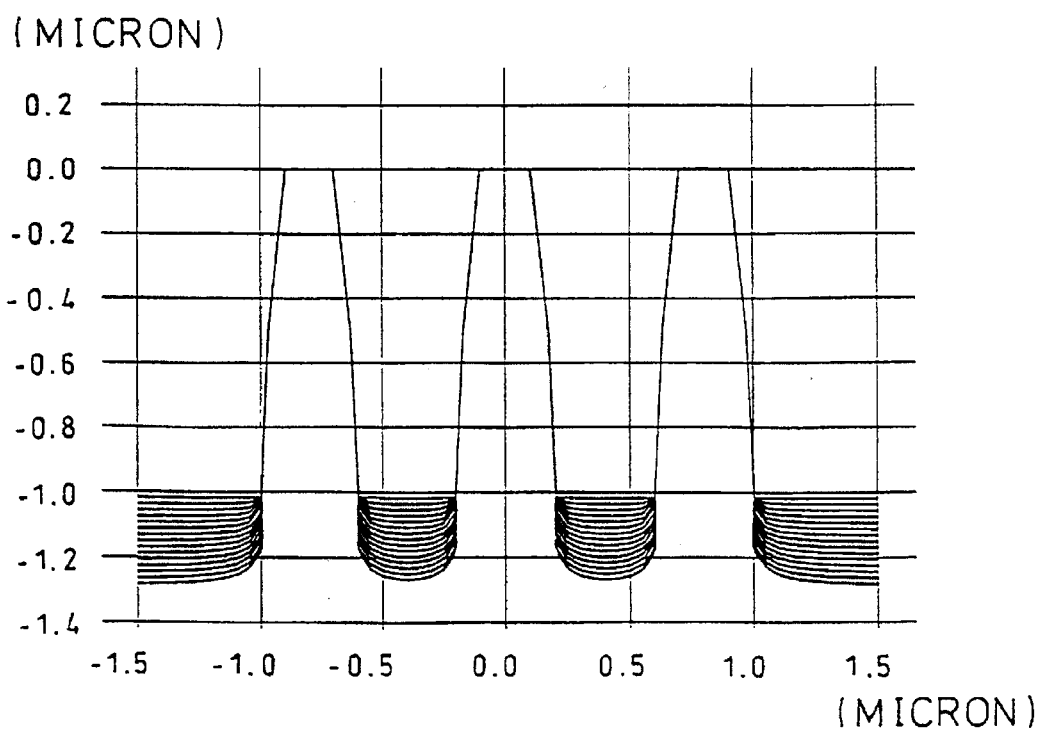

FIG. 26 (a) illustrates the results of etching conducted under conditions of 40 sccm of $Cl_2$ introduced into a low gas pressure of 4 Pa with the exhaust amount set to 1000 l/second. As shown in FIG. 26 (a), the lateral wall protecting layer deposit amount on the polycrystalline silicon is greater in an isolated line pattern than in an inner line pattern such that the isolated line pattern profile is more tapered and greater in size than the inner line pattern profile. FIG. 26 (b) illustrates the results of etching conducted by increasing the exhaust amount to 2000 l/second with the gas pressure maintained at 4 Pa. That is, the rate of the lateral wall protecting radicals in the chamber is decreased to decrease a lateral wall protecting layer deposit amount on the polycrystalline silicon, and there is relatively increased the effect of etching lateral wall protecting layers by oblique incident ions. Thus, as shown in FIG. 26 (b), the amount of reduction in size is greater in an isolated line pattern than in an inner line pattern, the profiles of the isolated line pattern and the inner line pattern become more vertical and the difference in size between the isolated line pattern and the inner line pattern is reduced.

Figure 27:
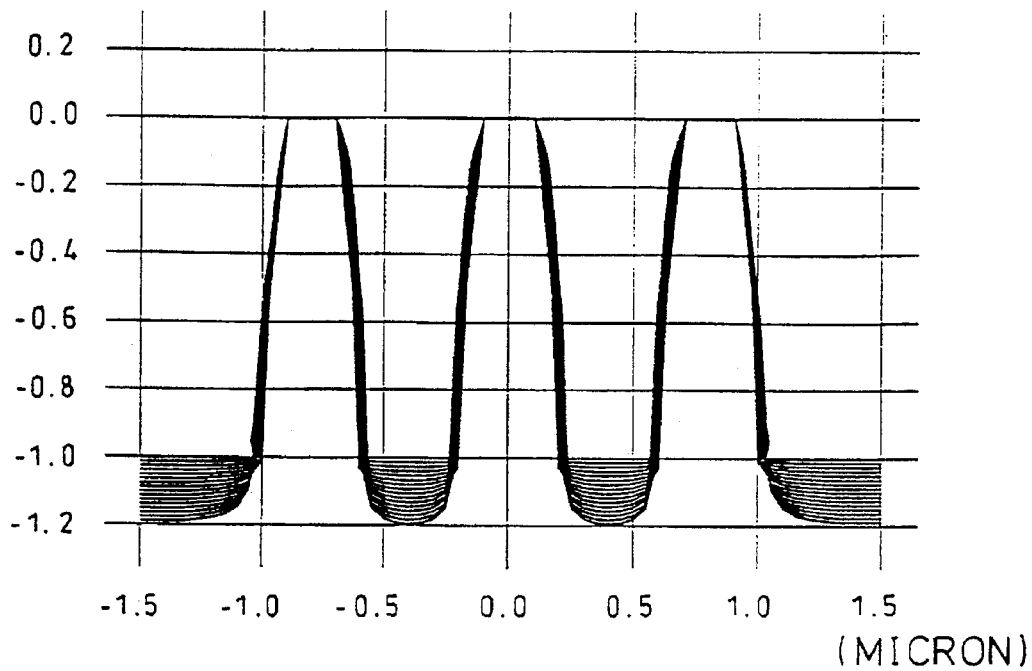
FIG. 27 (a) illustrates pattern profiles formed in a sample after etched under conditions of 40 sccm of $Cl_2$ and 20 sccm of $SiCl_4$, low gas pressure of 4 Pa and the exhaust amount set to 1000 l/second, each pattern profile being made in a tapering form and having a width wider than that of the photoresist pattern.
Figure 27:
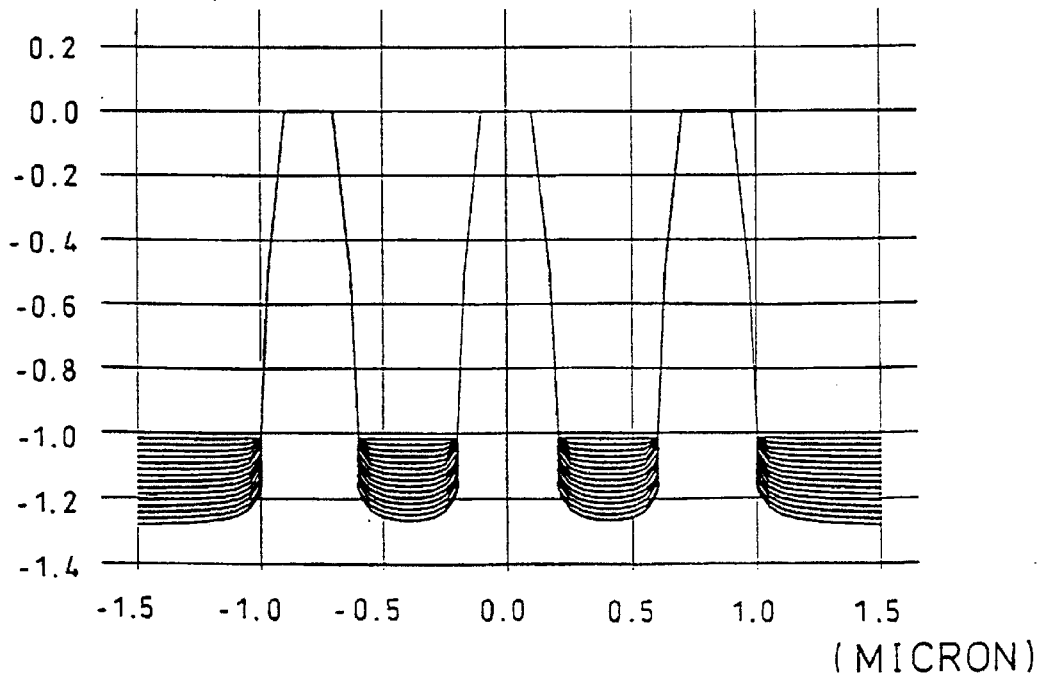

FIG. 27 (a) illustrates the results of etching conducted under conditions of 40 sccm of $Cl_2$ and 20 sccm of $SiCl_4$ introduced into a low gas pressure of 4 Pa with the exhaust amount set to 1000 l/second. The lateral wall protecting layer deposit amount on the polycrystalline silicon is greater in an isolated line pattern than in an inner line pattern such that the isolated line pattern profile is more tapered and greater in size than the inner line pattern profile. FIG. 27 (b) illustrates the results of etching conducted by reducing the amount of $SiCl_4$ to 10 sccm with the gas pressure and the exhaust amount maintained at 4 Pa and 1000 l/second, respectively. That is, the rate of the lateral wall protecting radicals in the chamber is decreased to decrease a lateral wall protecting layer deposit amount on the polycrystalline silicon, and there is relatively increased the effect of etching lateral wall protecting layers by oblique incident ions. Thus, as shown in FIG. 27 (b), the amount of reduction in size is greater in an isolated line pattern than in an inner line pattern, the profiles of the isolated line pattern and the inner line pattern become more vertical and the difference in size between the isolated line pattern and the inner line pattern is reduced.

Figure 28:
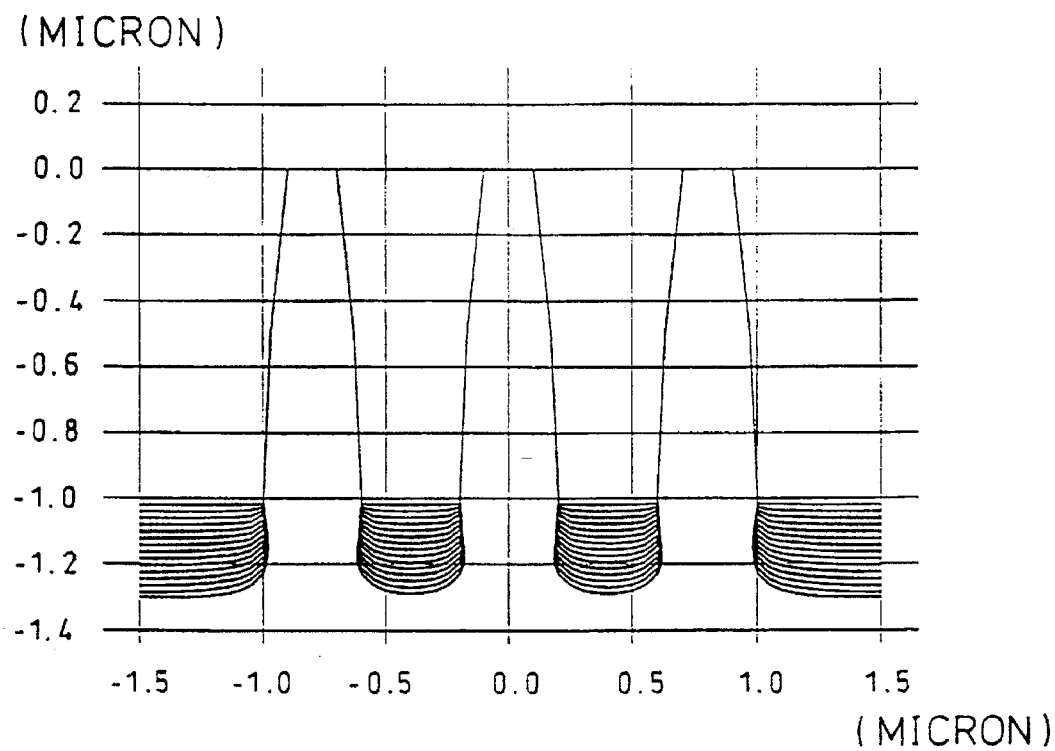
FIG. 28 (a) illustrates pattern profiles formed in a sample after etched under conditions of 40 sccm of $Cl_2$, low gas pressure of 4 Pa and the exhaust amount set to 1000 l/second, each pattern profile being made in an inversely tapering form and having a width narrower than that of the photoresist pattern.
Figure 28:
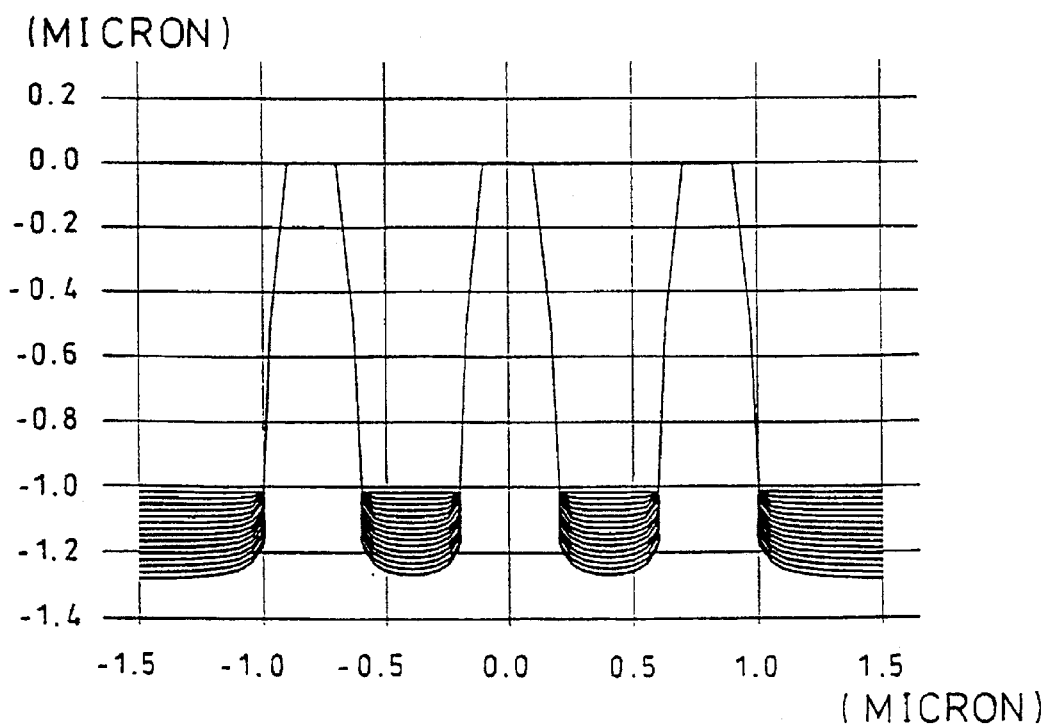

FIG. 28 (a) illustrates the results of etching conducted under conditions of 40 sccm of $Cl_2$ introduced into a low gas pressure of 4 Pa with the exhaust amount set to 1000 l/second. As shown in FIG. 28 (a), an isolated line pattern profile is more inversely tapered and smaller in size than an inner line pattern. FIG. 28 (b) illustrates the results of etching conducted by reducing the exhaust amount to 500 l/second with the gas pressure maintained at 4 Pa. That is, the rate of the lateral wall protecting radicals in the chamber is increased to increase a lateral wall protecting layer deposit amount on the polycrystalline silicon, and there is relatively decreased the effect of etching lateral wall protecting layers by oblique incident ions. Thus, as shown in FIG. 28 (b), the amount of increase in size is greater in an isolated line pattern than in an inner line pattern, the profiles of the isolated line pattern and the inner line pattern become more vertical and the difference in size between the isolated line pattern and the inner line pattern is reduced.

Figure 29:
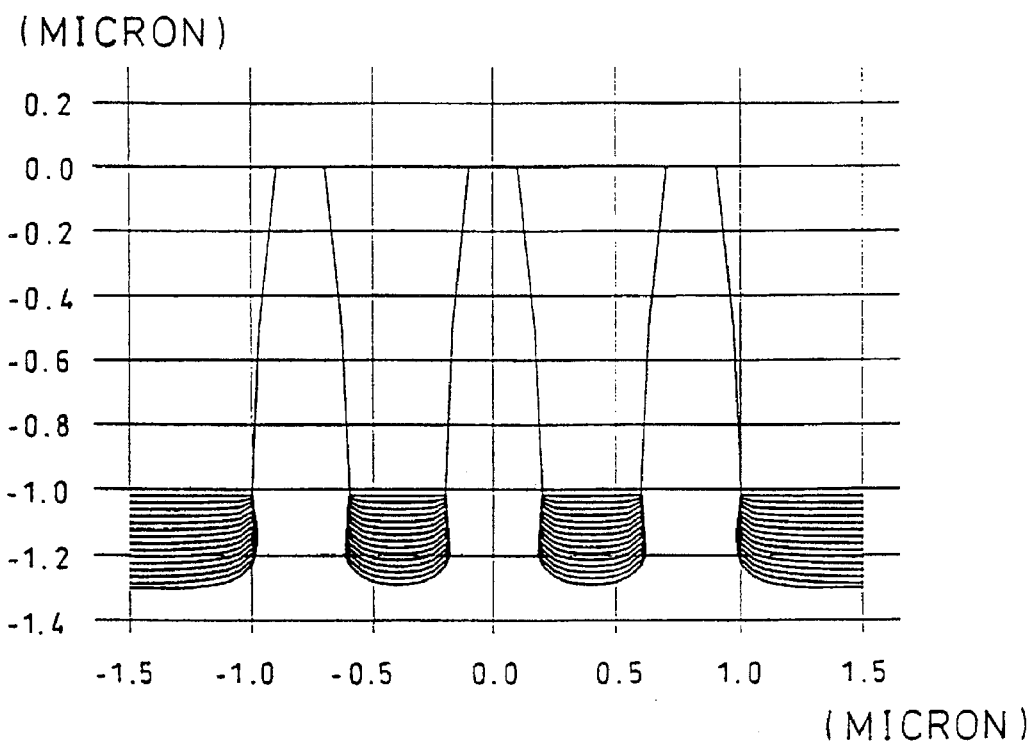
FIG. 29 (a) illustrates pattern profiles formed in a sample after etched under conditions of 40 sccm of $Cl_2$ and 15 sccm of $SiCl_4$, low gas pressure of 4 Pa and the exhaust amount set to 1000 l/second, each pattern profile being made in an inversely tapering form and having a width narrower than that of the photoresist pattern.
Figure 29:
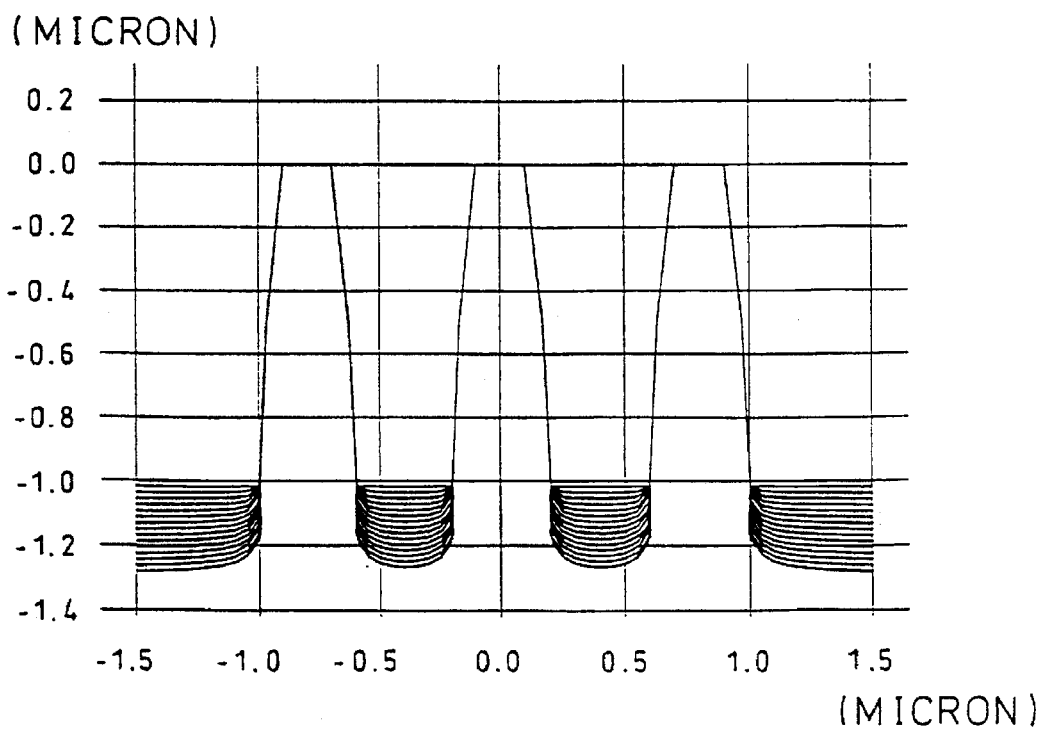

FIG. 29 (a) illustrates the results of etching conducted under conditions of 40 sccm of $Cl_2$ and 15 sccm of $SiCl_4$ introduced into a low gas pressure of 4 Pa with the exhaust amount set to 1000 l/second. As shown in FIG. 29 (a), an isolated line pattern profile is more inversely tapered and smaller in size than an inner line pattern. FIG. 29 (b) illustrates the results of etching conducted by increasing the amount of $SiCl_4$ to 25 sccm with the gas pressure and the exhaust amount maintained at 4 Pa and 1000 l/second, respectively. That is, the rate of the lateral wall protecting radicals in the chamber is increased to increase a lateral wall protecting layer deposit amount on the polycrystalline silicon, and there is relatively decreased the effect of etching lateral wall protecting layers by oblique incident ions. Thus, as shown in FIG. 29 (b), the amount of increase in size is greater in an isolated line pattern than in an inner line pattern, the profiles of the isolated line pattern and the inner line pattern become more vertical and the difference in size between the isolated line pattern and the inner line pattern is reduced.

Figure 30:
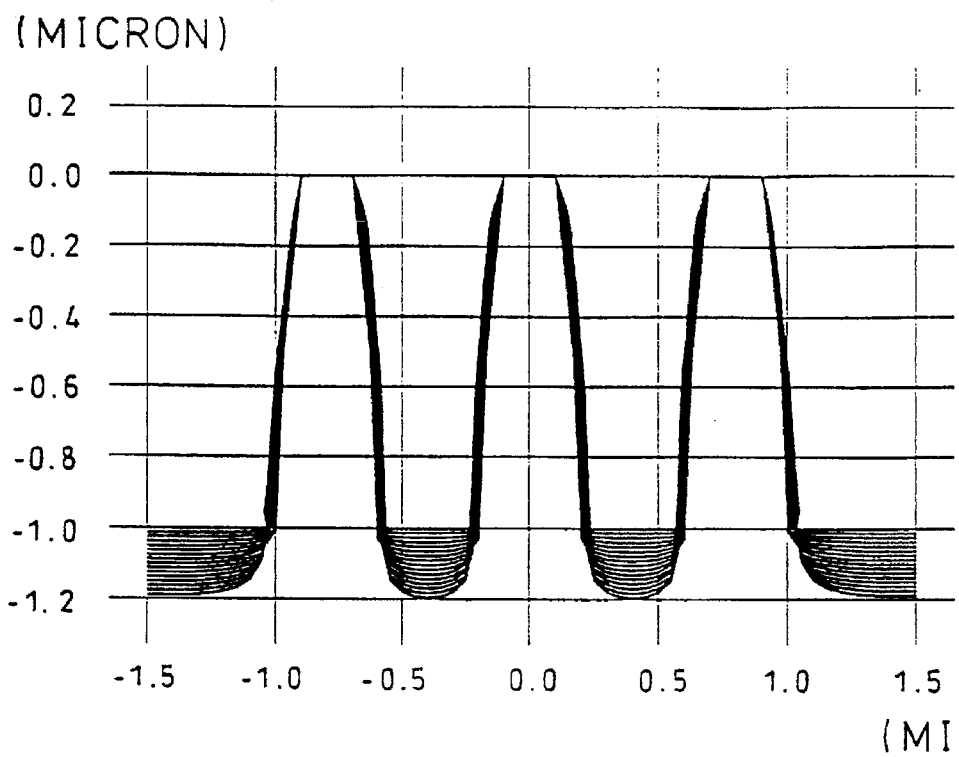
FIG. 30 (a) illustrates pattern profiles formed in a sample after etched under conditions of 40 sccm of $Cl_2$, an intermediate gas pressure of 10 Pa and the exhaust amount and the bias power set to 1000 l/second and 300 watts, respectively, each pattern profile being made in a tapering form and having a width wider than that of the photoresist pattern.
Figure 30:
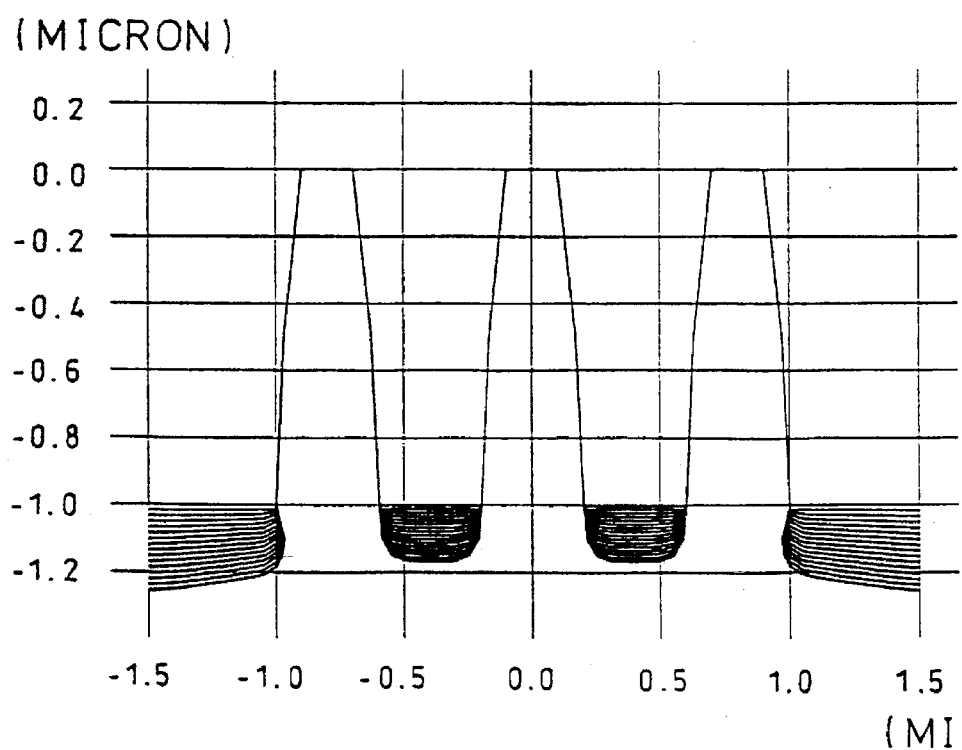

FIG. 30 (a) illustrates the results of etching conducted under conditions of 40 sccm of $Cl_2$ introduced into an intermediate gas pressure of 10 Pa with the exhaust amount and the bias power set to 1000 l/second and 300 watts, respectively. As shown in FIG. 30 (a), the lateral wall protecting layer deposit amount on the polycrystalline silicon is greater in an isolated line pattern than in an inner line pattern such that the isolated line pattern profile is more tapered and greater in size than the inner line pattern profile. FIG. 30 (b) illustrates the results of etching conducted by increasing the gas pressure and the bias power to 15 Pa and 400 watts, respectively, with the exhaust amount maintained at 1000 l/second. That is, the spread of the ion angular distribution becomes great, a reduction in ion energy with an increase in gas pressure is compensated by an increase in bias power, and there is relatively increased the effect of etching lateral wall protecting layers by oblique incident ions. Thus, as shown in FIG. 30 (b), the amount of reduction in size is greater in an isolated line pattern than in an inner line pattern, the profiles of the isolated line pattern and the inner line pattern become more vertical and the difference in size between the isolated line pattern and the inner line pattern is reduced.

Figure 31:
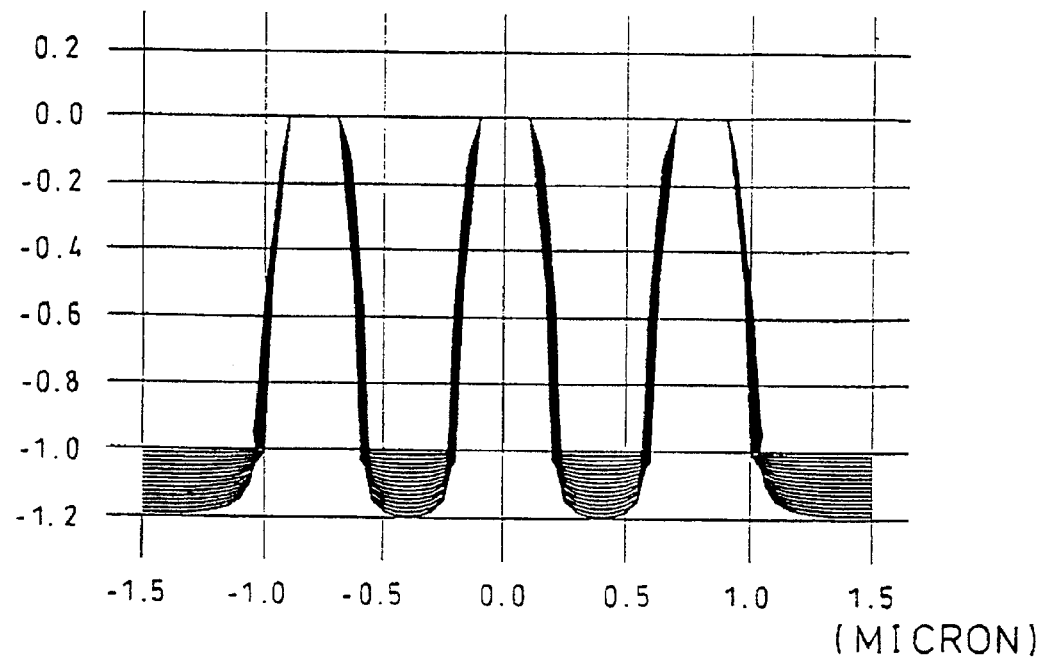
FIG. 31 (a) illustrates pattern profiles formed in a sample after etched under conditions of 40 sccm of $Cl_2$, an intermediate gas pressure of 10 Pa and the exhaust amount and the bias power set to 1000 l/second and 300 watts, respectively, each pattern profile being made in a tapering form and having a width wider than that of the photoresist pattern.
Figure 31:
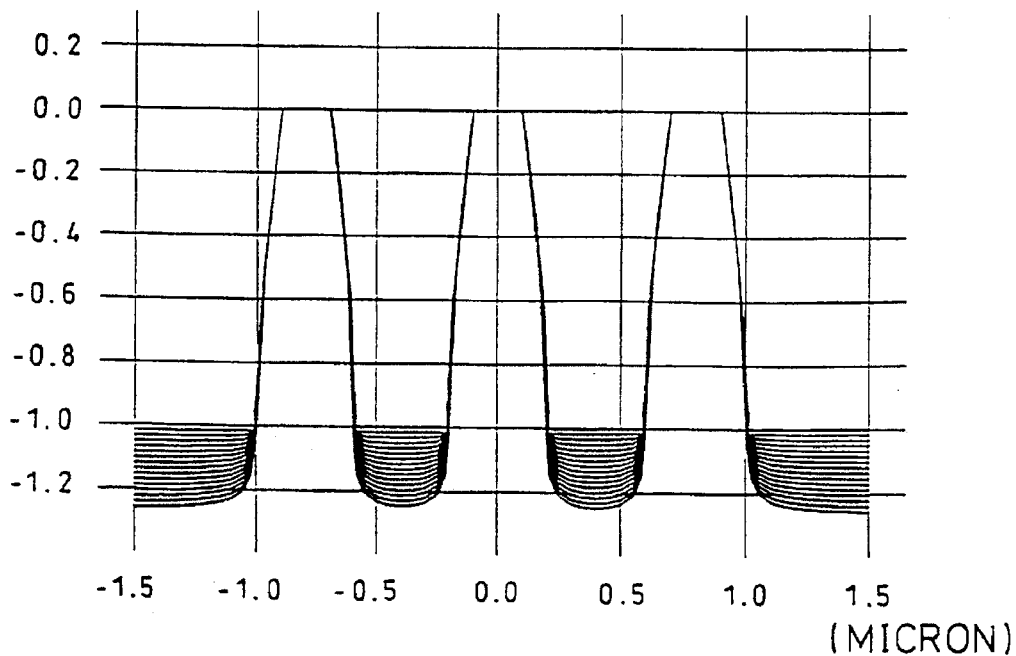

FIG. 31 (a) illustrates the results of etching conducted under conditions of 40 sccm of $Cl_2$ introduced into an intermediate gas pressure of 10 Pa with the exhaust amount and the bias power set to 1000 l/second and 300 watts, respectively. As shown in FIG. 31 (a), the lateral wall protecting layer deposit amount on the polycrystalline silicon is greater in an isolated line pattern than in an inner line pattern such that the isolated line pattern profile is more tapered and greater in size than the inner line pattern profile. FIG. 31 (b) illustrates the results of etching conducted by increasing the gas pressure and the exhaust amount to 15 Pa and 2000 l/second, respectively, with the bias power maintained at 300 watts. That is, the spread of the ion angular distribution becomes great, the lateral wall protecting layer deposit amount on the polycrystalline silicon is reduced and there is relatively increased the effect of etching lateral wall protecting layers by oblique incident ions. Thus, as shown in FIG. 31 (b), the amount of reduction in size is greater in an isolated line pattern than in an inner line pattern, the profiles of the isolated line pattern and the inner line pattern become more vertical and the difference in size between the isolated line pattern and the inner line pattern is reduced.

Figure 32:
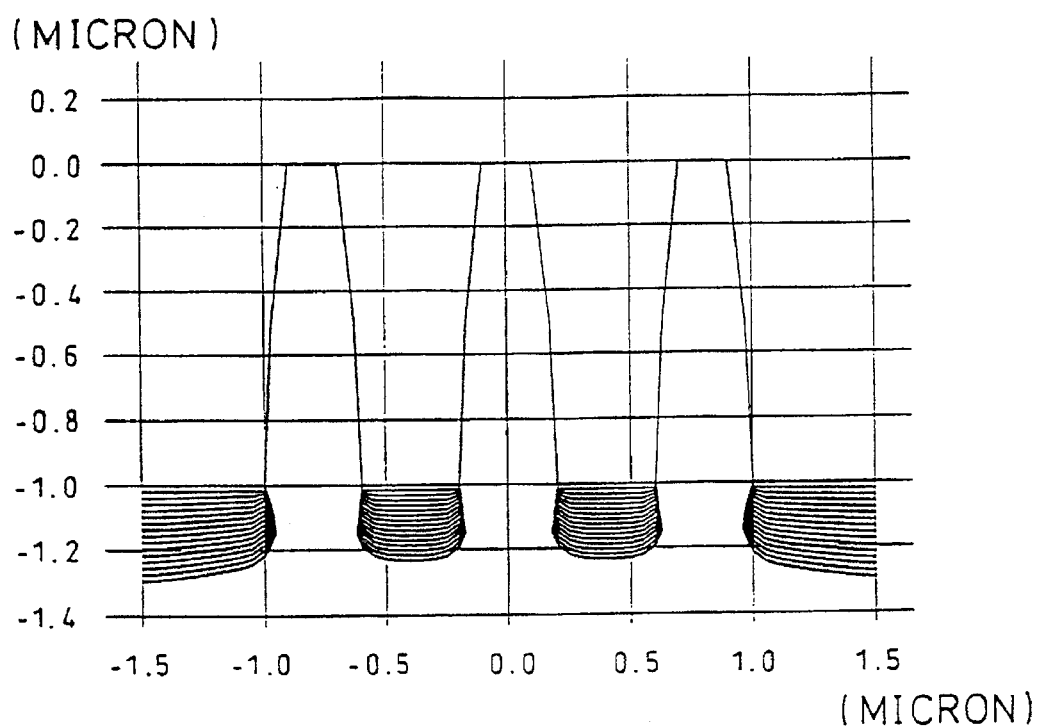
FIG. 32 (a) illustrates pattern profiles formed in a sample after etched under conditions of 40 sccm of $Cl_2$, low gas pressure of 4 Pa and the exhaust amount and the frequency of a high-frequency electric power set to 1000 l/second and 13.56 MHz, respectively, each pattern profile being made in an inversely tapering form and having a width narrower than that of the photoresist pattern.
Figure 32:
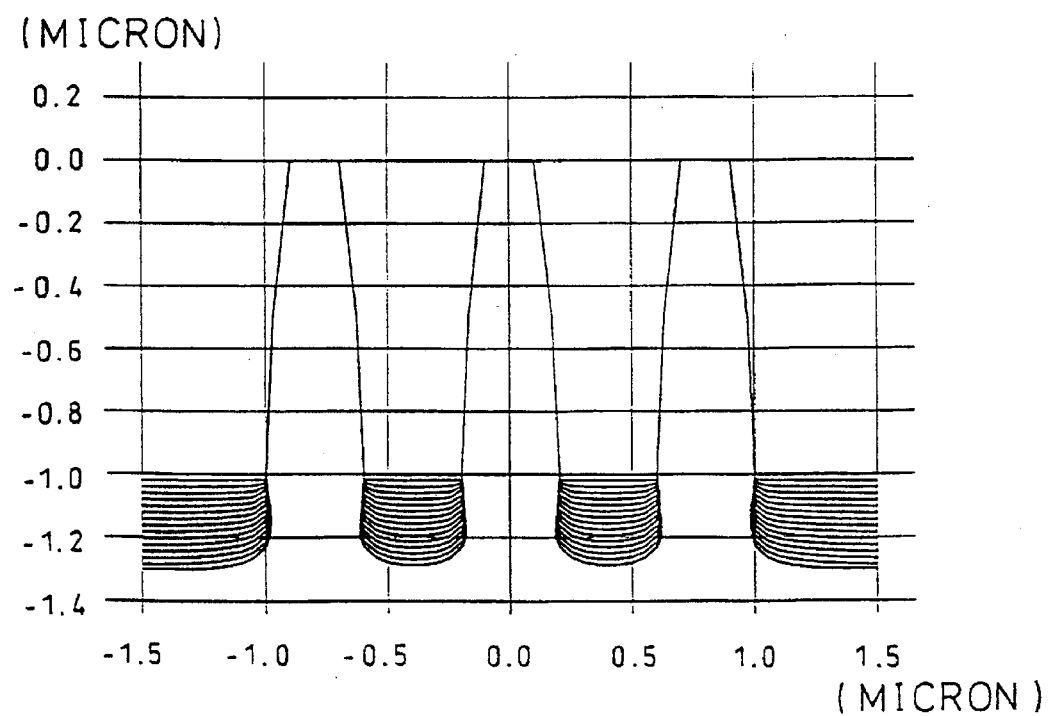

FIG. 32 (a) illustrates the results of etching conducted under conditions of 40 sccm of $Cl_2$ introduced into a low gas pressure of 4 Pa with the exhaust amount and the frequency of a high-frequency electric power set to 1000 l/second and 13.56 MHz, respectively. As shown in FIG. 32 (a), an isolated line pattern profile is more inversely tapered and smaller in size than an inner line pattern. FIG. 32 (b) illustrates the results of etching conducted by increasing the high frequency to 50 MHz with the gas pressure and the exhaust amount maintained at 4 P and 1000 l/second, respectively. That is, the sheath width is reduced and the rate of the oblique incident ions is reduced, thereby to reduce the protecting layer etching amount particularly in an isolated line pattern. As a result, as shown in FIG. 32 (b), the amount of increase in size is greater in an isolated line pattern than in an inner line pattern, the profiles of the isolated line pattern and the inner line pattern become more vertical and the difference in size between the isolated line pattern and the inner line pattern is reduced.

Figure 33:
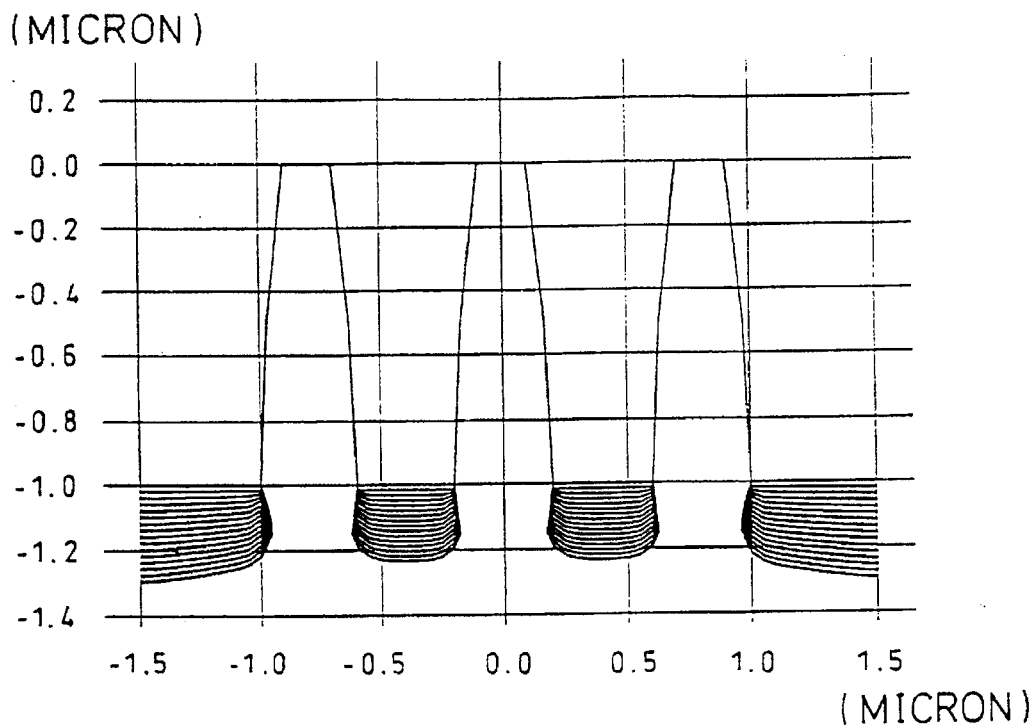
FIG. 33 (a) illustrates pattern profiles formed in a sample after etched under conditions of 40 sccm of $Cl_2$, low gas pressure of 4 Pa and the exhaust amount and the frequency of a high-frequency electric power set to 800 l/second and 50 MHz, respectively, each pattern profile being made in an inversely tapering form and having a width narrower than that of the photoresist pattern.
Figure 33:
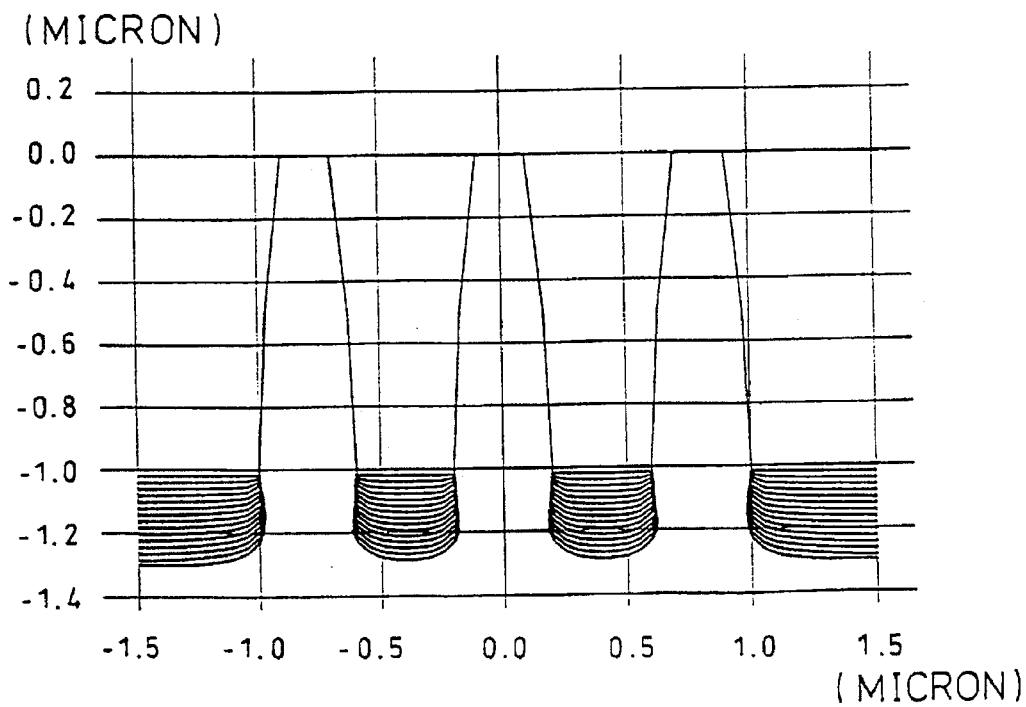

FIG. 33 (a) illustrates the results of etching conducted under conditions of 40 sccm of $Cl_2$ introduced into a low gas pressure of 4 Pa with the exhaust amount and the frequency of a high-frequency electric power set to 800 l/second and 50 MHz, respectively. As shown in FIG. 33 (a), an isolated line pattern profile is more inversely tapered smaller in size than an inner line pattern. FIG. 33 (b) illustrates the results of etching conducted by increasing the high frequency to 100 MHz and decreasing the gas pressure to 0.5 Pa with the exhaust amount maintained and 800 l/second, respectively. That is, the gas pressure for stably generating plasma can be lowered to 0.5 Pa to reduce the rate of the oblique incident ions. This particularly reduces the amount in which an isolated line pattern lateral wall protecting layer is etched. Thus, as shown in FIG. 33 (b), the amount of increase in size is greater in an isolated line pattern than in an inner line pattern, the profiles of the isolated line pattern and the inner line pattern become more vertical and the difference in size between the isolated line pattern and the inner line pattern is reduced. Further, a sufficient effect was obtained even though the gas pressure was reduced to 2 Pa with the frequency maintained at 50 MHz.

Figure 34:
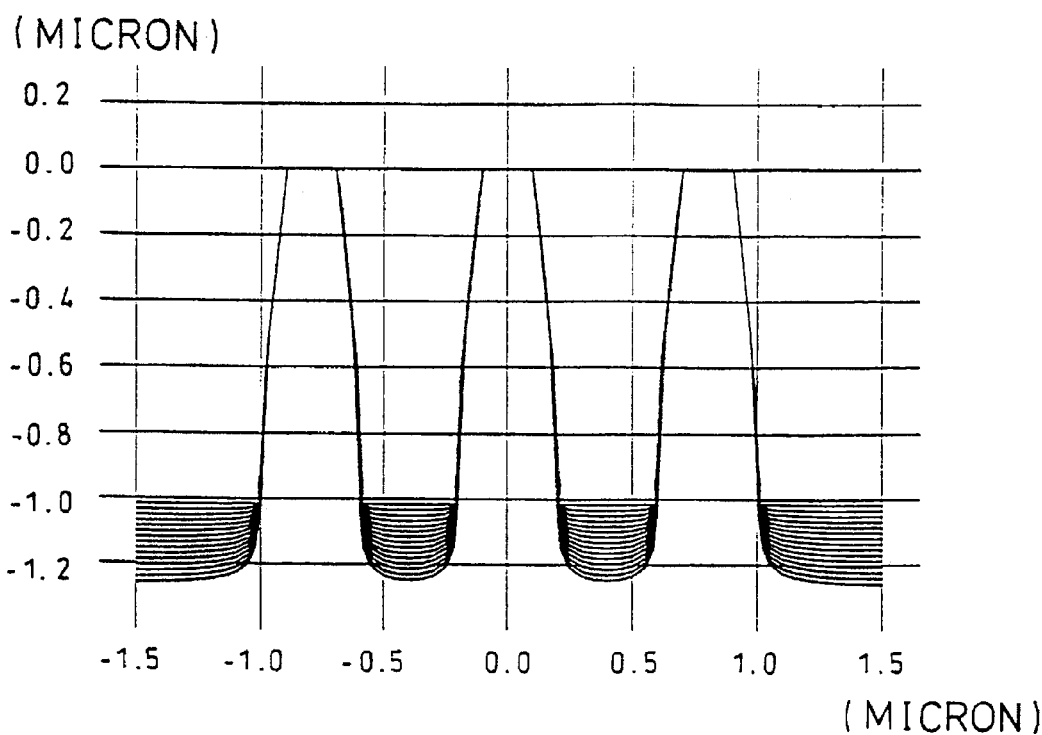
FIG. 34 (a) illustrates pattern profiles formed in a sample after etched under conditions of 40 sccm of $Cl_2$, low gas pressure of 4 Pa and the exhaust amount and the temperature of the sample stand set to 1000 l/second and 30° C., respectively, each pattern profile being made in a tapering form and having a width wider than that of the photoresist pattern.
Figure 34:
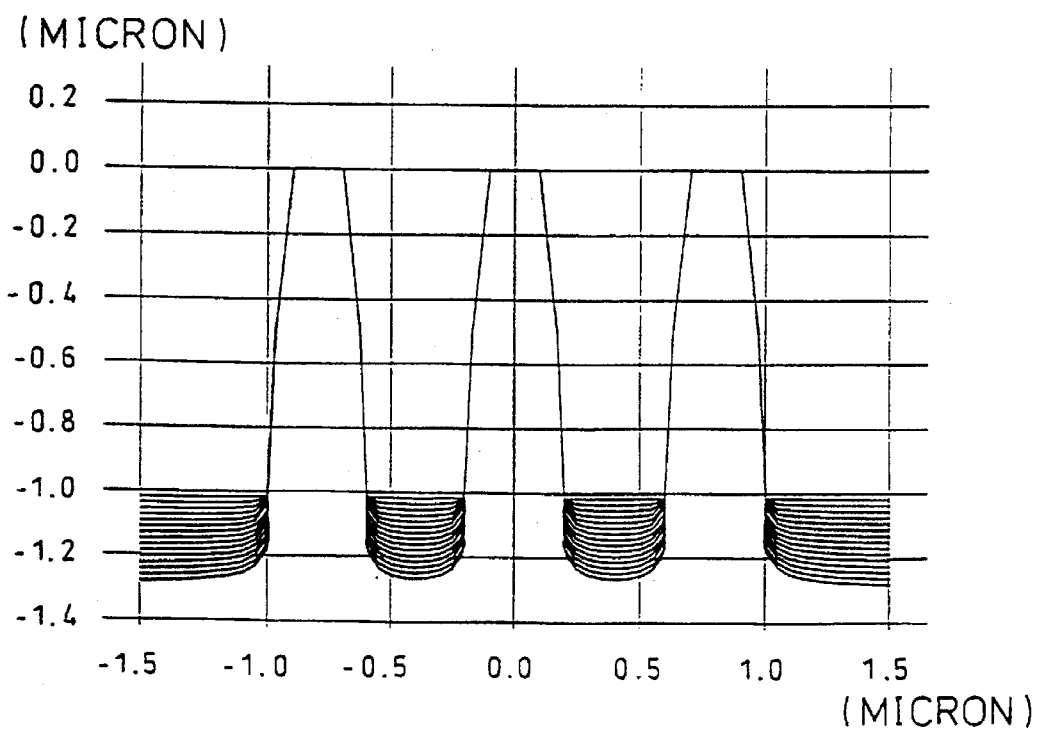

FIG. 34 (a) illustrates the results of etching conducted under conditions of 40 sccm of $Cl_2$ introduced into a low gas pressure of 4 Pa with the exhaust amount and the temperature of the sample stand set to 1000 l/second and 30° C., respectively. As shown in FIG. 34 (a), the lateral wall protecting layer deposit amount on the polycrystalline silicon is greater in an isolated line pattern than in an inner line pattern such that the isolated line pattern profile is more tapered and greater in size than the inner line pattern profile. FIG. 34 (b) illustrates the results of etching conducted by raising the sample stand temperature to 80° C. with the gas pressure and the exhaust amount maintained at 4 P and 1000 l/second, respectively. That is, there is decreased the rate of the lateral wall protecting radicals deposited on isolated line pattern lateral walls of the polycrystalline silicon, there is decreased the lateral wall protecting layer deposit amount, and there is relatively increased the effect of etching lateral wall protecting layers by oblique incident ions. Thus, as shown in FIG. 34 (b), the amount of decrease in size is greater in an isolated line pattern than in an inner line pattern, the profiles of the isolated line pattern and the inner line pattern become more vertical and the difference in size between the isolated line pattern and the inner line pattern is reduced.

Figure 35:
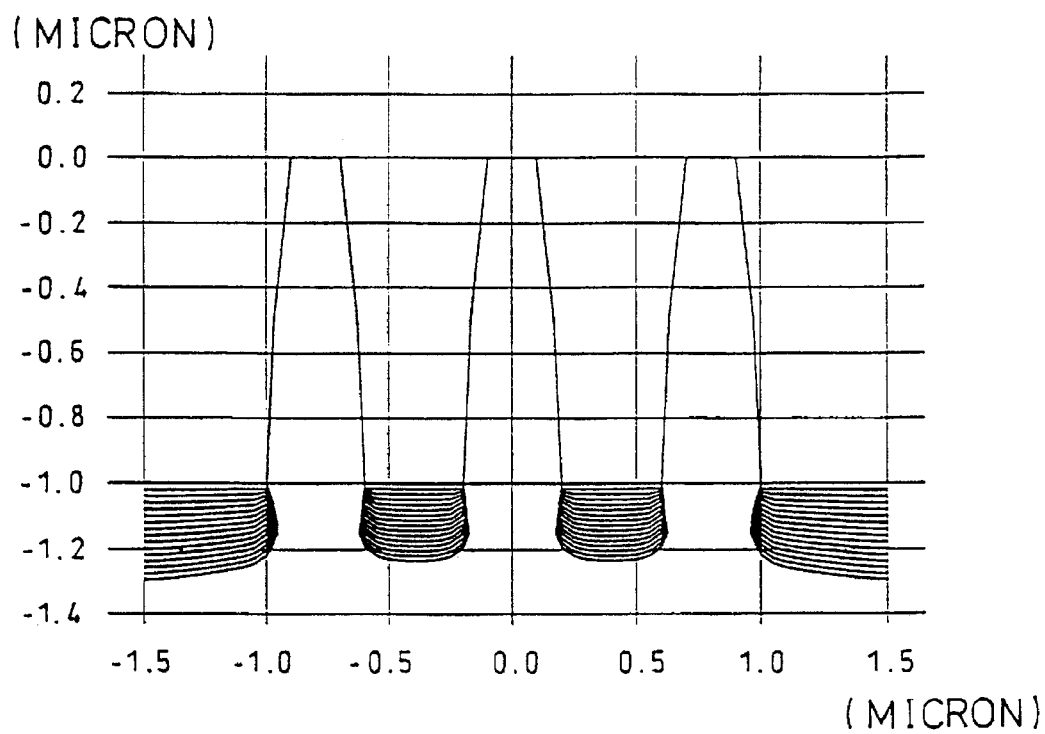
FIG. 35 (a) illustrates pattern profiles formed in a sample after etched under conditions of 40 sccm of $Cl_2$, an intermediate gas pressure of 10 Pa and the exhaust amount and the temperature of the sample stand set to 1000 l/second and 30° C., respectively, each pattern profile being made in an inversely tapering form and having a width narrower than that of the photoresist pattern.
Figure 35:
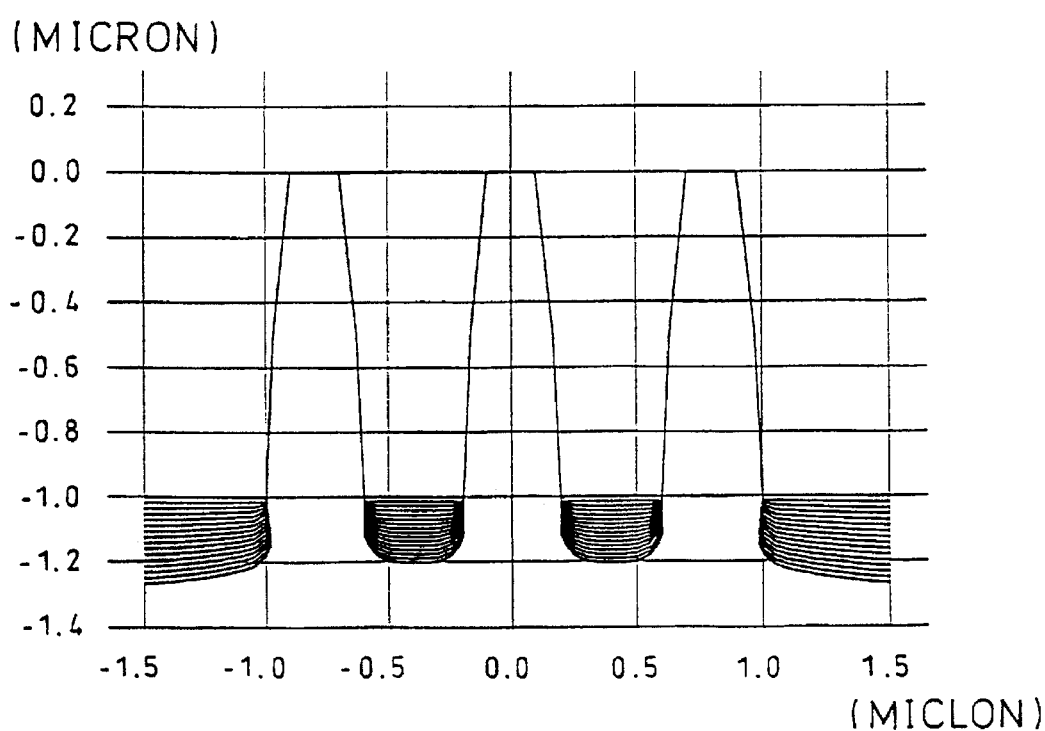

FIG. 35 (a) illustrates the results of etching conducted under conditions of 40 sccm of $Cl_2$ introduced into an intermediate gas pressure of 10 Pa with the exhaust amount and the temperature of the sample stand set to 1000 l/second and 30° C., respectively. As shown in FIG. 35 (a), the lateral wall protecting layer deposit amount on the polycrystalline silicon is smaller in an isolated line pattern than in an inner line pattern such that the isolated line pattern profile is more inversely tapered and smaller in size than the inner line pattern profile. FIG. 35 (b) illustrates the results of etching conducted by lowering the sample stand temperature to 0° C. with the gas pressure and the exhaust amount maintained at 10 Pa and 1000 l/second, respectively. That is, there is increased the rate of the lateral wall protecting radicals deposited on isolated line pattern lateral walls of the polycrystalline silicon, there is increased the lateral wall protecting layer deposit amount and there is relatively decreased the effect of etching lateral wall protecting layers by oblique incident ions. Thus, as shown in FIG. 35 (b), the amount of increase in size is greater in an isolated line pattern than in an inner line pattern, the profiles of the isolated line pattern and the inner line pattern become more vertical and the difference in size between the isolated line pattern and the inner line pattern is reduced.

As another example, etching was conducted under conditions of 40 sccm of $Cl_2$ introduced into an intermediate gas pressure of 10 Pa with the exhaust amount and the temperature of the sample stand set to 2000 l/second and 0° C., respectively. In this example, the lateral wall protecting layer deposit amount on the polycrystalline silicon is smaller in an isolated line pattern than in an inner line pattern such that the isolated line pattern profile is more inversely tapered and smaller in size than the inner line pattern profile. However, when the gas pressure was lowered to 3 Pa, the rate of the oblique incident ions was reduced. Accordingly, the profiles of the isolated line pattern and the inner line pattern become more vertical and the difference in size between the isolated line pattern and the inner line pattern was reduced.

In each of the examples in FIGS. 22 to 35, there were taken the measures to improve process conditions in order to overcome the problems encountered in such process conditions. During the etching process, however, the internal plasma state is not always constant but undergoes a certain change with the passage of time. Accordingly, the density of the ion flux in the vicinity of the sample stand, the ion energy, the ion incident angular distribution and the lateral wall protecting radical flux also undergo a certain change with the passage of time. In order to compensate such changes with the passage of time, external parameters may be changed by an external parameter control device. By so doing, the profiles of the isolated line pattern and the inner line pattern were made more vertical and the difference in size between the isolated line patterns and the inner line patterns could be reduced.

In each of the examples shown in FIGS. 22 to 35, etching was conducted in the main etching operational mode. In an overetching operational mode in which the underlaying oxide layer starts appearing, the rate of the reaction product is reduced such that the rate of the lateral wall protecting radicals is also reduced.

Figure 36:
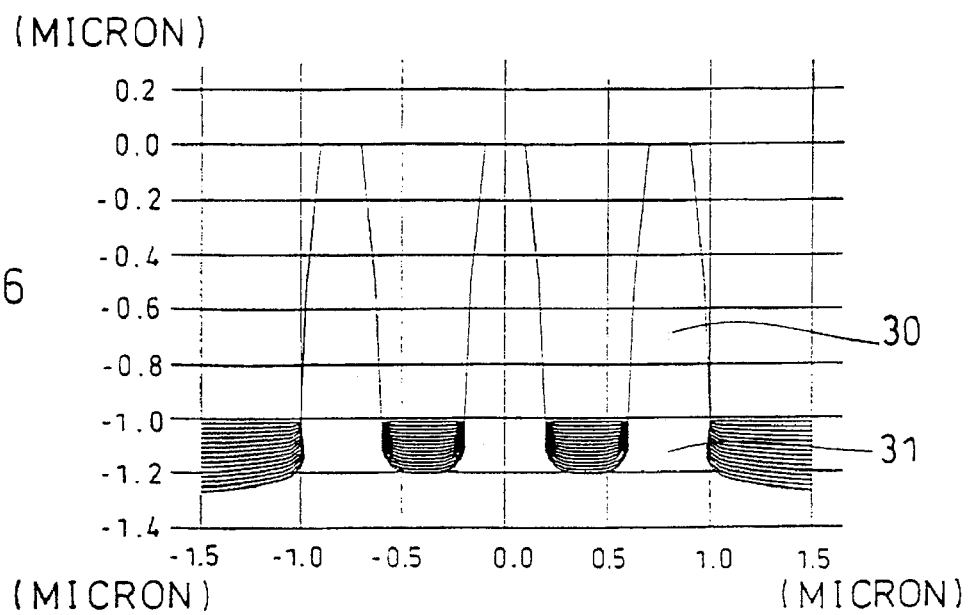
FIGS. 36 (a) to (c) illustrate the states of etching conducted, with the use of a reactive ion dry etching apparatus of the parallel plate type, for forming a gate in polycrystalline silicon doped with phosphor with the operational mode switched from a main etching operational mode to an overetching operational mode.
Figure 36:
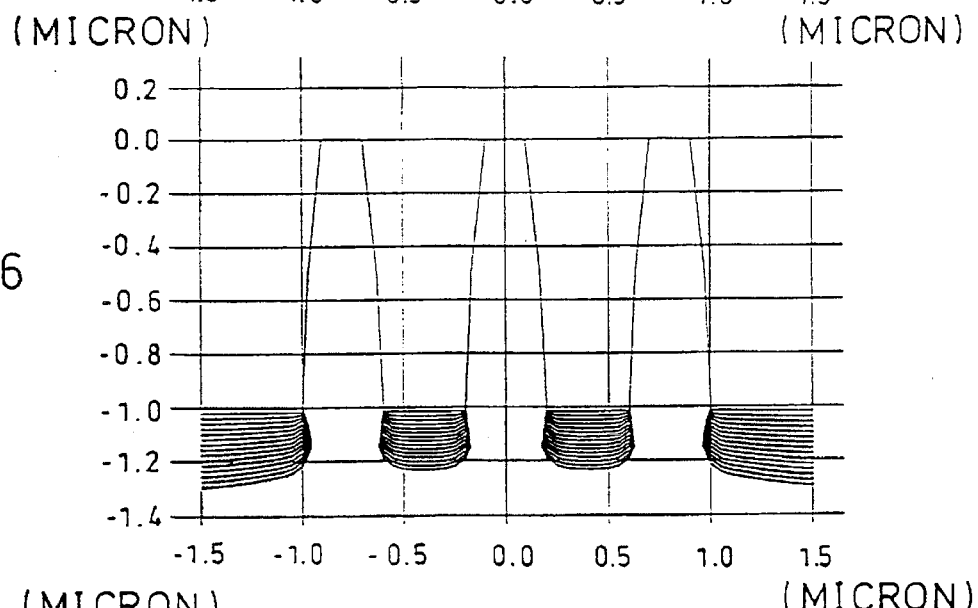
Figure 36:
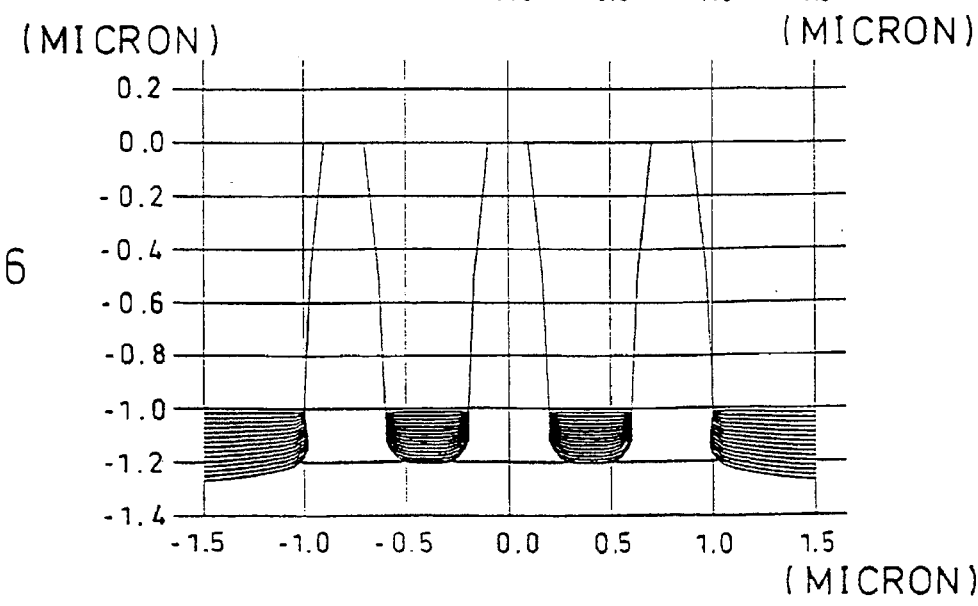

FIG. 36 illustrates how etching was conducted for forming, with the use of a reactive ion dry etching apparatus of the parallel plate type, a gate in polycrystalline silicon doped with phosphor with the operational mode switched from a main etching operational mode to an overetching operational mode.

FIG. 36 (a) shows the results of etching conducted in a main etching operational mode under conditions of 40 sccm of $Cl_2$ introduced into a low gas pressure of 4 Pa with the exhaust amount and the frequency of the high-frequency electric power set to 1000 l/second and 13.56 MHz, respectively. As shown in FIG. 36 (a), the profiles of each isolated line pattern and each inner line pattern were made substantially vertical and the difference in size between each isolated line pattern and each inner line pattern was reduced. FIG. 36 (b) shows the results of overetching conducted under the conditions above-mentioned. As shown in FIG. 36 (b), the isolated line pattern profile is more inversely tapered and smaller in size than the inner line pattern profile. FIG. 36 (c) shows the results of etching conducted, in order to improve the state shown in FIG. 36 (b), by increasing the frequency of the high-frequency electric power to 50 MHz with the gas pressure and the exhaust amount maintained at 4 Pa and 1000 l/second, respectively. That is, the sheath width is reduced and the rate of the oblique incident ions is reduced. Thus, as shown in FIG. 36 (c), there is reduced the amount in which an isolated line pattern protecting layer is etched, the profiles of the isolated line pattern and the inner line pattern become more vertical, and the difference in size between the isolated line pattern and the inner line pattern is reduced. In this example, to increase the etching selectivity with respect to the silicon oxide layer, the high-frequency electric power was lowered to 200 W to reduce the sheath voltage, thereby to lower the ion energy.

In the etching process, the changeover of operational mode as above-mentioned is conducted as follows. That is, there is used a signal from an etching end detector 20 which is disposed at the chamber 11 for generating plasma, or a signal from a control device in which a changeover of operational mode according to the passage of time can previously be programmed. Thus, provision is made such that, with the use of the signal from the detector or the control device, the completion of the main etching operation is judged and that etching is conducted under the main etching conditions above-mentioned until the main etching is completed and then, etching is conducted under the overetching conditions above-mentioned.

In each of the examples above-mentioned, etching was conducted on a polycrystalline silicon layer. However, the present invention may also be effectively applied for etching a silicon oxide, a Si compound or aluminium, or a resist in a multi-layer resist, or the like. When the present invention is applied for etching aluminium, it is preferable to use gas in which chlorine is used as the base, such as $BCl_3+Cl_2$ or $SiCl_4+Cl_2+CHCl_3$, and to set the gas pressure to 0.1 Pa to 20 Pa. According to the tests, the etching rate in such a case was in the range of 400~900 nm/min.

In each of the examples above-mentioned, the reactive ion etching apparatus of the parallel plate type was used as a plasma generating apparatus. However, satisfactory effects may also be produced with the use of a plasma generating apparatus capable of independently controlling the plasma generating power and the bias power, such as an electron cyclotron plasma generating apparatus, an electromagnetic induction-type plasma generating apparatus or the like.

Figure 37:
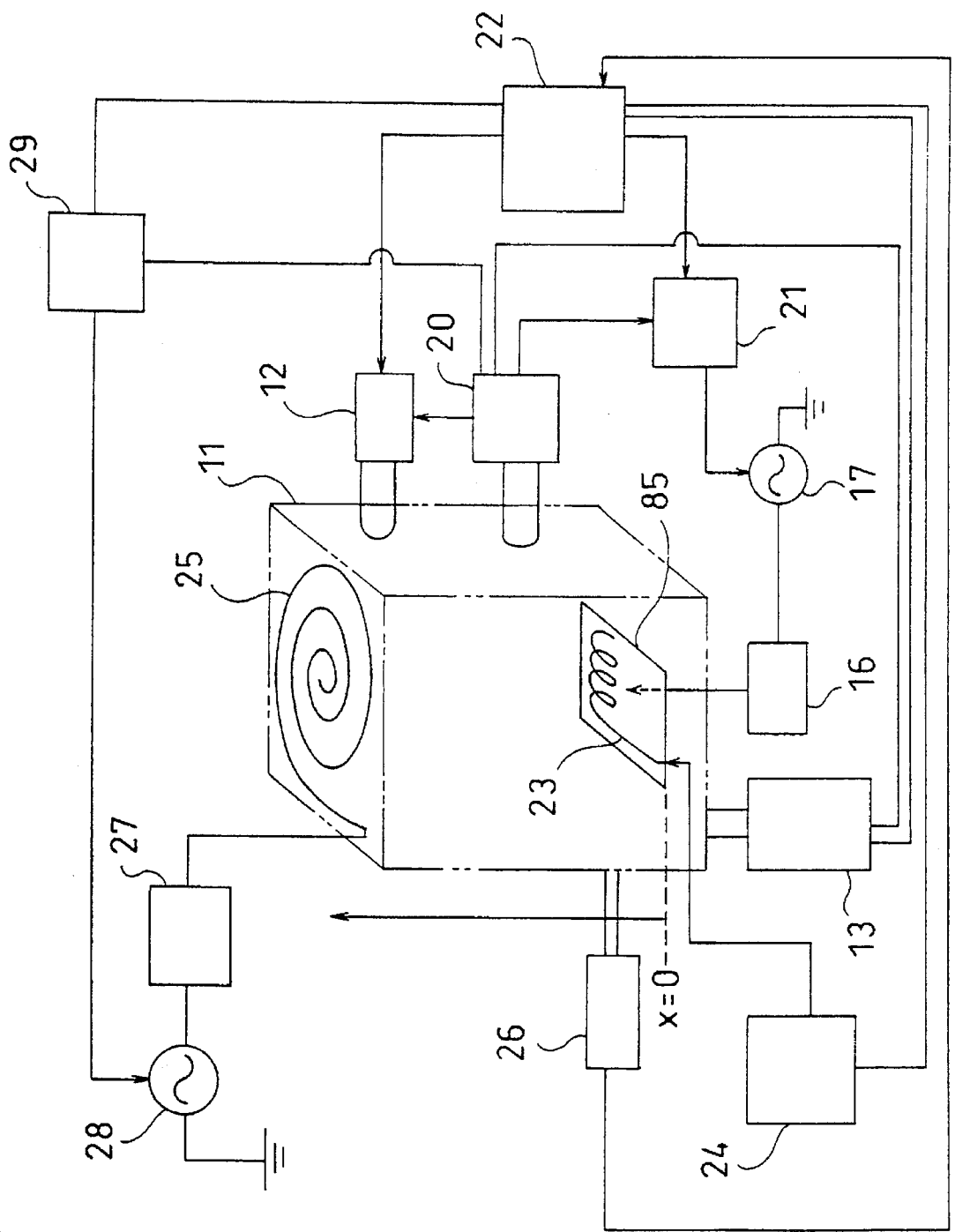
FIG. 37 is a schematic view of another dry etching apparatus to be used in a dry etching method according to the present invention.
Figure 38:
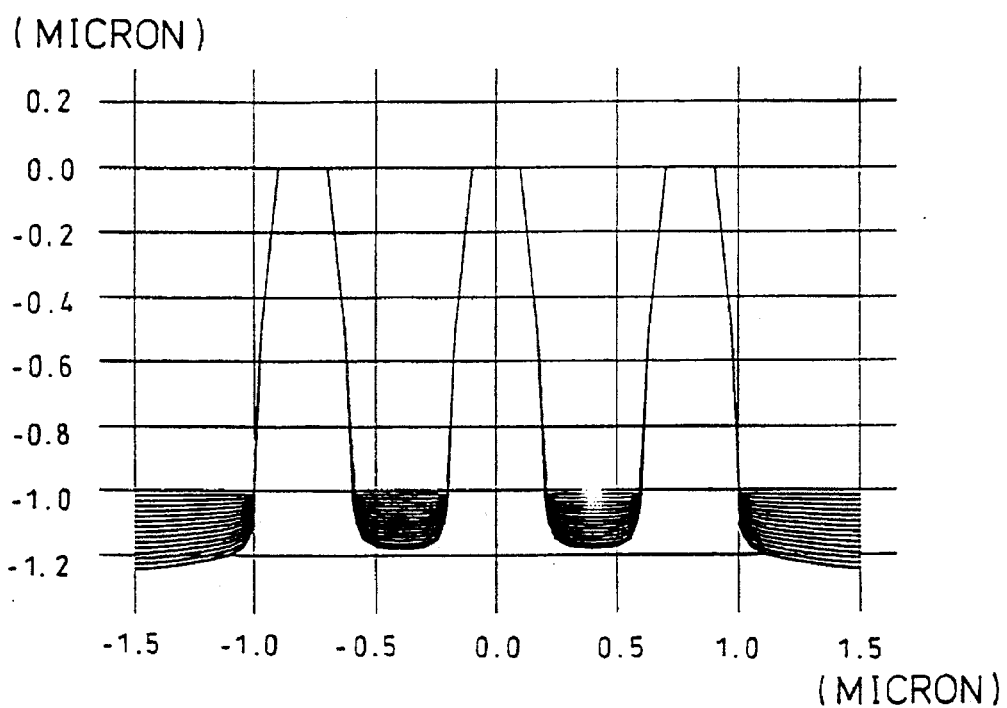
FIGS. 38 (a) and (b) show how gates were formed in polycrystalline silicon doped with phosphor with the use of the dry etching apparatus in FIG. 37; in which FIG. 38 (a) illustrates pattern profiles formed in the silicon after etched under conditions of 40 sccm of $Cl_2$, low gas pressure of 3 Pa and 300 watts applied to a plasma generating spiral coil and with the bias power and the exhaust amount set to 1000 watts and 1000 l/second, respectively, each pattern profile being made in a tapering form and having a width wider than that of the photoresist pattern.
Figure 38:
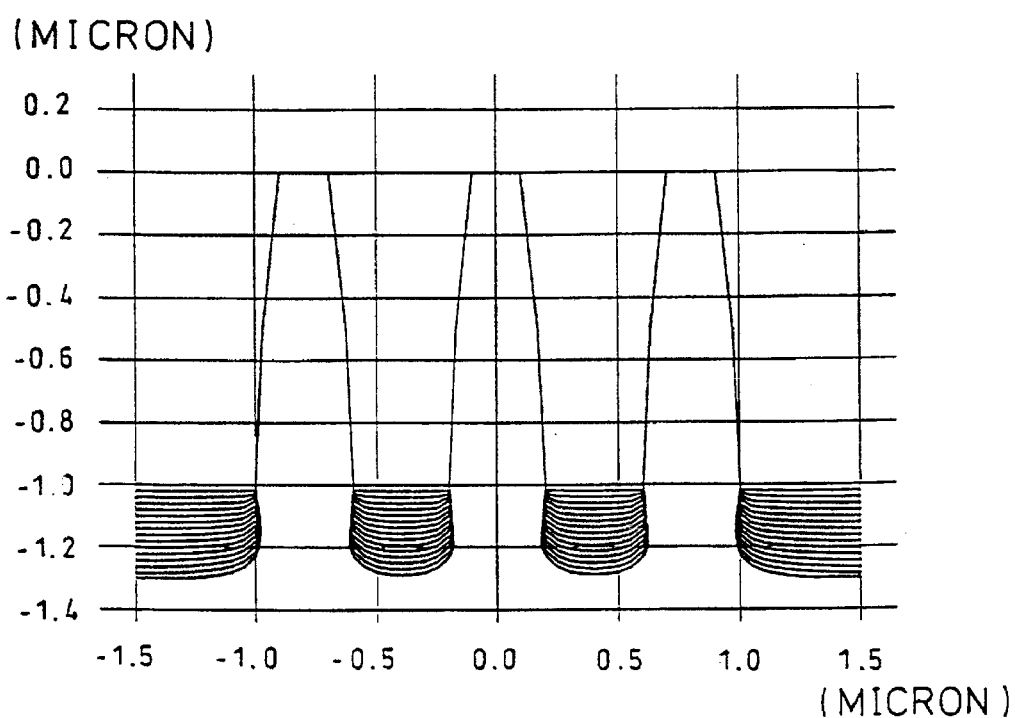

With reference to FIGS. 37 and 38, the following description will discuss a plasma etching apparatus of the electromagnetic induction type and a dry etching method using this apparatus according to another embodiment of the present invention.

FIG. 37 schematically shows an electromagnetic induction-type plasma etching apparatus to be used for a plasma generating method according to the present invention. As shown in FIG. 37, a reactive gas is introduced into a metallic chamber 11 through a gas controller 12, and the inside pressure of the chamber 11 is suitably controlled by an exhaust system 13.

The chamber 11 is provided at an upper portion thereof with a spiral coil 25 and at a lower portion with a sample stand 15 serving as a cathode. To form a self DC bias, the sample stand 15 is connected to a first high-frequency electric power source 17 through an impedance matching circuit 16. To generate plasma, the spiral coil 25 is connected to a second high-frequency electric power source 28 through an impedance matching circuit 27. The frequency of the first high-frequency electric power source 17 can be changed by a frequency control circuit 21, and the frequency of the second high-frequency electric power source 28 can be changed by a frequency control circuit 29.

The ion energy distribution and the width of the sheath region in the vicinity of the sample stand 15 can be judged by a plasma parameter detector 26, and the etching completion can be judged by an etching end detector 20 in which a spectral method is used. Based on the signal from the etching end detector 20, the gas controller 12 and the exhaust system 13 are controlled such that the gas pressure and exhaust amount in the chamber 11 can suitably be controlled. Further, based on the signal from the etching end detector 20, the frequency of the first high-frequency electric power source 17 is controlled through the frequency control circuit 21.

By controlling a heater 23 through a temperature control circuit 24, the temperature of the sample stand 15 can be adjusted. An external parameter control device 22 is arranged to control the gas controller 12, the exhaust system 13, the frequency control circuit 21 and the temperature control circuit 24, based on (i) the signal from the plasma parameter detector 26 and the signal from the etching end detector 20, (ii) the combination of these signals with the values of external parameters such as frequency, gas pressure, high-frequency electric power, sample stand temperature and the like, or (iii) the combination of these signals with a previously programmed processing flow.

With reference to FIG. 38, the following description will discuss a specific example of a dry etching method using the plasma etching apparatus of the electromagnetic induction type. FIG. 38 (a) shows the results of etching conducted under conditions of 40 sccm of $Cl_2$ introduced into a low gas pressure of 3 Pa with 300 watts applied to the plasma generating spiral coil 26 and with the bias power and the exhaust amount set to 100 watts and 1000 l/second, respectively. As shown in FIG. 38 (a), the lateral wall protecting layer deposit amount on the polycrystalline silicon is greater in an inner line pattern than in an isolated line pattern, such that the inner line pattern profile is more tapered and greater in size than the isolated line pattern profile. FIG. 38 (b) shows the result of etching conducted by increasing the bias power and the exhaust amount to 150 watts and 2000 l/second, respectively, with the gas pressure maintained at 3 Pa. That is, the ion incident angles become more vertical to reduce the number of lateral wall protecting radicals which reach pattern lateral walls. As shown in FIG. 38 (b), the lateral wall protecting layer deposit amount is reduced, the amount of reduction in size is greater in an inner line pattern than in an isolated line pattern, the profiles of isolated line pattern and the inner line pattern become more vertical and the difference in size between the isolated line pattern and the inner line pattern is reduced.

Further, similar effects were produced by lowering the gas pressure to 0.5 Pa, by increasing the high-frequency bias power from 13.56 MHz to 50 MHz, or by increasing the exhaust amount to 2000 l/second while lowering the gas pressure from 3 Pa to 1 Pa.

What is claimed is:

1. In a dry etching method including the steps of:

introducing, into a vacuum chamber provided at a lower portion thereof with a sample stand, a raw-material gas mixture containing (i) an etching gas for etching a sample to be etched which is placed on said sample stand and in the surface of which a resist pattern is formed, and (ii) a lateral wall protecting gas for generating lateral wall protecting radicals for protecting the lateral walls of line patterns formed when said sample is etched, whereby ions composed of said gas mixture are generated; and applying a high-frequency electric power to said sample stand to form a self DC bias, thereby to induce said ions to said sample stand, whereby said sample is etched:

said dry etching method comprising a parameter control step arranged such that, when the line width of a first line pattern, which is one of line patterns located at the inner side of a line pattern group comprising a plurality of line patterns adjacent to one another formed in a sample, is smaller than the line width of a second line pattern, which is one of outer line patterns located at the outermost side of said line pattern group or one of second line patterns located as isolated from said line pattern group, and when the line width of each of said first and second line patterns is greater than the line width of said resist pattern, at least one parameter selected from the parameter group consisting of the pressure of said raw-material gas mixture introduced into said vacuum chamber, the exhaust amount of gas discharged from said vacuum chamber, said high-frequency electric power, the frequency of said high-frequency electric power, the rate of said lateral wall protecting gas in said raw-material gas mixture and the temperature of said sample stand, is changed such that the amounts in which the lateral walls of said first and second line patterns are etched, are increased and that the amount in which the lateral walls of said first line patterns are etched, is smaller than the amount in which the lateral walls of said second line patterns are etched.

2. A dry etching method according to claim 1, wherein said parameter control step includes the step of increasing the exhaust amount of gas discharged from said vacuum chamber.

3. A dry etching method according to claim 1, wherein said parameter control step includes the step of reducing the rate of said lateral wall protecting gas in said raw-material gas mixture.

4. A dry etching method according to claim 1, wherein said parameter control step includes the step of increasing the pressure of said raw-material gas mixture introduced into said vacuum chamber and the step of increasing the high-frequency electric power.

5. A dry etching method according to claim 1, wherein said parameter control step includes the step of increasing the pressure of said raw-material gas mixture introduced into said vacuum chamber and the step of increasing the exhaust amount of gas discharged from said vacuum chamber.

6. A dry etching method according to claim 1, wherein said parameter control step includes the step of raising the temperature of said sample stand.

7. In a dry etching method comprising the steps of:

introducing, into a vacuum chamber provided at a lower portion thereof with a sample stand, a raw-material gas mixture containing (i) an etching gas for etching a sample to be etched which is placed on said sample stand and in the surface of which a resist pattern is formed, and (ii) a lateral wall protecting gas for generating lateral wall protecting radicals for protecting the lateral walls of line patterns formed when said sample is etched, whereby ions composed of said gas mixture are generated; and applying a high-frequency electric power to said sample stand to form a self DC bias, thereby to induce said ions to said sample stand, whereby said sample is etched:

said dry etching method comprising a parameter control step arranged such that, when the line width of a first line pattern, which is one of line patterns located at the inner side of a line pattern group comprising a plurality of line patterns adjacent to one another formed in a sample, is smaller than the line width of a second line pattern, which is one of outer line patterns located at the outermost side of said line pattern group or one of line patterns located as isolated from said line pattern group, and when the line width of each of said first and second line patterns is smaller than the line width of said resist pattern, at least one parameter selected from the parameter group consisting of the pressure of said raw-material gas mixture introduced into said vacuum chamber, the exhaust amount of gas discharged from said vacuum chamber, said high-frequency electric power, the frequency of said high-frequency electric power, the rate of said lateral wall protecting gas in said raw-material gas mixture and the temperature of said sample stand, is changed such that the amounts in which the lateral walls of said first and second line patterns are etched, are decreased and that the amount in which the lateral walls of said first line patterns are etched, is smaller than the amount in which the lateral walls of said second line patterns are etched.

8. A dry etching method according to claim 7, wherein said parameter control step includes the step of reducing the pressure of said raw-material gas mixture introduced into said vacuum chamber.

9. A dry etching method according to claim 7, wherein said parameter control step includes the step of reducing the exhaust amount of gas discharged from said vacuum chamber.

10. A dry etching method according to claim 7, wherein said parameter control step includes the step of raising the temperature of said sample stand.

11. In a dry etching method comprising the steps of:

introducing, into a vacuum chamber provided at a lower portion thereof with a sample stand, a raw-material gas mixture containing (i) an etching gas for etching a sample to be etched which is placed on said sample stand and in the surface of which a resist pattern is formed, and (ii) a lateral wall protecting gas for generating lateral wall protecting radicals for protecting the lateral walls of line patterns formed when said sample is etched, whereby ions composed of said gas mixture are generated; and applying a high-frequency electric power to said sample stand to form a self DC bias, thereby to induce said ions to said sample stand, whereby said sample is etched:

said dry etching method comprising a parameter control step arranged such that, when the line width of a first line pattern, which is one of line patterns located at the inner side of a line pattern group comprising a plurality of line patterns adjacent to one another formed in a sample, is greater than the line width of a second line pattern, which is one of outer line patterns located at the outermost side of said line pattern group or one of line patterns located as isolated from said line pattern group, and when the line width of each of said first and second line patterns is greater than the line width of said resist pattern, at least one parameter selected from the parameter group consisting of the pressure of said raw-material gas mixture introduced into said vacuum chamber, the exhaust amount of gas discharged from said vacuum chamber, said high-frequency electric power, the frequency of said high-frequency electric power, the rate of said lateral wall protecting gas in said raw-material gas mixture and the temperature of said sample stand, is changed such that the amounts in which the lateral walls of said first and second line patterns are etched, are increased and that the amount in which the lateral walls of said first line patterns are etched, is greater than the amount in which the lateral walls of said second line patterns are etched.

12. A dry etching method according to claim 11, wherein said parameter control step includes the step of increasing the high-frequency electric power and the step of increasing the exhaust amount of gas discharged from said vacuum chamber.

13. A dry etching method according to claim 11, wherein said parameter control step includes the step of reducing the pressure of said raw-material gas mixture introduced into said vacuum chamber.

14. A dry etching method according to claim 13, wherein said parameter control step further includes the step of increasing the exhaust amount of gas discharged from said vacuum chamber.

15. A dry etching method according to claim 11, wherein said parameter control step includes the step of increasing the frequency of said high-frequency electric power.

16. A dry etching method according to claim 11, wherein said parameter control step includes the step of raising the temperature of said sample stand.

17. In a dry etching method comprising the steps of:

introducing, into a vacuum chamber provided at a lower portion thereof with a sample stand, a raw-material gas mixture containing (i) an etching gas for etching a sample to be etched which is placed on said sample stand and in the surface of which a resist pattern is formed, and (ii) a lateral wall protecting gas for generating lateral wall protecting radicals for protecting the lateral walls of line patterns formed when said sample is etched, whereby ions composed of said gas mixture are generated; and applying a high-frequency electric power to said sample stand to form a self DC bias, thereby to induce said ions to said sample stand, whereby said sample is etched:

said dry etching method comprising a parameter control step arranged such that, when the line width of a first line pattern, which is one of line patterns located at the inner side of a line pattern group comprising a plurality of line patterns adjacent to one another formed in a sample, is greater than the line width of a second line pattern, which is one of outer line patterns located at the outermost side of said line pattern group or one of line patterns located as isolated from said line pattern group, and when the line width of each of said first and second line patterns is smaller than the line width of said resist pattern, at least one parameter selected from the parameter group consisting of the pressure of said raw-material gas mixture introduced into said vacuum chamber, the exhaust amount of gas discharged from said vacuum chamber, said high-frequency electric power, the frequency of said high-frequency electric power, the rate of said lateral wall protecting gas in said raw-material gas mixture and the temperature of said sample stand, is changed such that the amounts in which the lateral walls of said first and second line patterns are etched, are decreased and that the amount in which the lateral walls of said first line patterns are etched, is greater than the amount in which the lateral walls of said second line patterns are etched.

18. A dry etching method according to claim 17, wherein said parameter control step includes the step of decreasing the exhaust amount of gas discharged from said vacuum chamber.

19. A dry etching method according to claim 17, wherein said parameter control step includes the step of increasing the rate of said lateral wall protecting gas in said raw-material gas mixture.

20. A dry etching method according to claim 17, wherein said parameter control step includes the step of increasing the frequency of said high-frequency electric power.

21. A dry etching method according to claim 20, wherein said parameter control step further includes the step of reducing the pressure of said raw-material gas mixture introduced into said vacuum chamber.

22. A dry etching method according to claim 17, wherein said parameter control step includes the step of lowering the temperature of said sample stand.

23. A dry etching method according to claim 17, wherein said parameter control step includes the step of reducing the pressure of said raw-material gas mixture introduced into said vacuum chamber.

* * * * *